United States Patent
Gutierrez et al.

(10) Patent No.: US 12,106,026 B2
(45) Date of Patent: Oct. 1, 2024

(54) EXTENSIBLE AGENTS IN AGENT-BASED GENERATIVE MODELS

(71) Applicant: Capital One Services, LLC, McLean, VA (US)

(72) Inventors: Francisco Gutierrez, San Francisco, CA (US); Matthew Tomaszewicz, San Francisco, CA (US); Sandeep Narayanaswami, San Francisco, CA (US); Eiran Shalev, Daly City, CA (US)

(73) Assignee: Capital One Services, LLC, McLean, VA (US)

( * ) Notice: Subject to any disclaimer, the term of this patent is extended or adjusted under 35 U.S.C. 154(b) by 648 days.

(21) Appl. No.: 17/240,133

(22) Filed: Apr. 26, 2021

(65) Prior Publication Data

US 2022/0215142 A1   Jul. 7, 2022

Related U.S. Application Data

(63) Continuation-in-part of application No. 17/142,097, filed on Jan. 5, 2021, now Pat. No. 11,847,390.

(51) Int. Cl.
  *G06F 30/27*   (2020.01)
  *G06F 7/58*   (2006.01)
  *G06F 17/18*   (2006.01)

(52) U.S. Cl.
  CPC ............... *G06F 30/27* (2020.01); *G06F 7/58* (2013.01); *G06F 17/18* (2013.01)

(58) Field of Classification Search
  CPC ............ G06F 30/27; G06F 7/58; G06F 17/18; G06N 3/047; G06N 5/043; G06N 7/01; G06N 20/00; G06N 3/006
  See application file for complete search history.

(56) References Cited

U.S. PATENT DOCUMENTS

| | | |
|---|---|---|
| 7,181,438 B1 | 2/2007 | Szabo |
| 7,720,779 B1 | 5/2010 | Perry et al. |
| 7,809,660 B2 | 10/2010 | Friedlander et al. |
| 8,055,603 B2 | 11/2011 | Angell et al. |
| 8,423,494 B2 | 4/2013 | Barrett et al. |

(Continued)

FOREIGN PATENT DOCUMENTS

| | | |
|---|---|---|
| CN | 101888318 A | 11/2010 |
| CN | 101964019 A | 2/2011 |

(Continued)

OTHER PUBLICATIONS

Jun. 6, 2022—(WO) International Search Report and Written Opinion—App No. PCT/US22/11253.

(Continued)

*Primary Examiner* — Kandasamy Thangavelu
(74) *Attorney, Agent, or Firm* — Banner & Witcoff, Ltd.

(57) ABSTRACT

A system, method, and computer-readable medium for generating factual and/or counterfactual data are described. This may have the effect of improving the complexity of data available for training machine learning models. The models may include agent-based models (ABMs) in which the agent definitions are decoupled from the simulation. In one or more aspects, some agents may have attributes and associated behaviors that permit them to be reused in different ABMs to simulate different systems.

20 Claims, 29 Drawing Sheets

(56) References Cited

U.S. PATENT DOCUMENTS

| | | | |
|---|---|---|---|
| 8,533,182 | B1 | 9/2013 | Charboneau |
| 8,606,608 | B2 | 12/2013 | Bottou et al. |
| 8,739,137 | B2 | 5/2014 | Siskind et al. |
| 8,838,511 | B2 | 9/2014 | Kristal et al. |
| 9,098,805 | B2 | 8/2015 | Ellis et al. |
| 9,256,700 | B1 | 2/2016 | Kozlovsky et al. |
| 10,043,035 | B2 | 8/2018 | LaFever et al. |
| 10,460,235 | B1 | 10/2019 | Truong et al. |
| 11,888,679 | B2 | 1/2024 | Grammel et al. |
| 2012/0004893 | A1 | 1/2012 | Vaidyanathan et al. |
| 2013/0246336 | A1 | 9/2013 | Ahuja et al. |
| 2014/0244418 | A1 | 8/2014 | Ausubel et al. |
| 2015/0235143 | A1 | 8/2015 | Eder |
| 2015/0278157 | A1 | 10/2015 | Srivastava |
| 2016/0239532 | A1 | 8/2016 | Gould et al. |
| 2017/0323329 | A1 | 11/2017 | Katariya et al. |
| 2018/0153495 | A1 | 6/2018 | Itu et al. |
| 2018/0181541 | A1 | 6/2018 | Yao |
| 2018/0275303 | A1* | 9/2018 | Zhan ............... G01V 1/303 |
| 2019/0041202 | A1 | 2/2019 | Saraswatula et al. |
| 2019/0180841 | A1 | 6/2019 | Douglas et al. |
| 2019/0188243 | A1 | 6/2019 | Sun et al. |
| 2019/0220733 | A1 | 7/2019 | Fisher et al. |
| 2019/0236189 | A1 | 8/2019 | Jindal et al. |
| 2019/0287680 | A1 | 9/2019 | O'Connor et al. |
| 2019/0327501 | A1 | 10/2019 | Walters et al. |
| 2019/0354643 | A1* | 11/2019 | Shum ............... G06F 30/20 |
| 2020/0012933 | A1 | 1/2020 | Truong et al. |
| 2020/0050893 | A1 | 2/2020 | Suresh et al. |
| 2020/0167214 | A1 | 5/2020 | Shah et al. |
| 2020/0193230 | A1 | 6/2020 | Greven et al. |
| 2021/0370972 | A1 | 12/2021 | Bagschik et al. |
| 2022/0035965 | A1* | 2/2022 | Liebman ............... G06F 18/214 |
| 2022/0083855 | A1 | 3/2022 | Choi et al. |
| 2022/0188692 | A1 | 6/2022 | Chakraborty et al. |
| 2022/0207536 | A1 | 6/2022 | Tian et al. |

FOREIGN PATENT DOCUMENTS

| | | | | |
|---|---|---|---|---|
| CN | 109716346 | A | 5/2019 | |
| EP | 3413092 | A1 * | 12/2018 | ......... G06Q 10/0633 |
| JP | WO2009096519 | A1 * | 5/2011 | ............ H04L 41/147 |
| KR | 20200063960 | A | 6/2020 | |
| WO | 2013067437 | A1 | 5/2013 | |
| WO | 2020033967 | A1 | 2/2020 | |

OTHER PUBLICATIONS

Mannino et al. "Is this real? generating synthetic data that looks real", In Proceedings of the 32nd Annual ACM Symposium on User Interface Software and Technology, 2019, pp. 549-561 [online], [retrieved on May 4, 2022]. Retrieved from the Internet <URL:http:azza. azurewebsites.net/files/Synner-UIST2019.pdf>, entire document, especially see Figure 1, Figure 5, Table 1, p. 1 Abstract, p. 2-7, p. 12.

Patki, et al., "The Synethetic Data Vault," 2016 IEEE International Conference on Data Science and Advanced Analytics (DSAA), Montreal, QC, Canada, 2016, pp. 399-410, doi: 10.1109/DSAA. 2016.49. (Year: 2016), 12 pages.

Sargent, "Verification and validation of simulation models," Proceedings of the 2010 Winter Simulation Conference, Baltimore, MD, USA, 2010, pp. 166-183, doi: 10.1109/WSC.2010.5679166. (Year: 2016), 18 pages.

Bellot, et al., "Conditional Independence Testing using Generative Adversarial Networks," arXiv preprint arXiv: 1907.04068 (2019). (Year: 2019), 10 pages.

IEEE Dictionary at p. 428 (2000) (definition of "field") (Year:2000).

Branislav Hollander, "Introduction to Probabilistic Graphical Models," Towards Data Science (Feb. 23, 2020) (Year: 2020).

Generative model Wikipedia, https://en.wikipedia.org/wiki/Generative_model, printed Jan. 5, 2021, pp. 1-5.

Goodfellow et al. "Generative Adversarial Nets". 2014. pp. 1-9.

"Microsoft/AirSim: Open source simulator for autonomous vehicles built on Unreal Engine / Unity, from Microsoft AI & Research", https://github.com/microsoft/AirSim, printed Jan. 5, 2021, pp. 1-6.

"Mostly AI—The world's Synthetic Data Platform", https://mostly.ai, printed Jan. 5, 2021, pp. 1-7.

"How Statice works—Statice understands your data and generates synthetic data which behaves like real data", https://www.statice.ai/how-statice-works, printed Jan. 5, 2021, pp. 1-4.

"Netlogo—The NetLogo 6.1.1 User Manual". Sep. 2019. pp. 1-449.

Murphy "An introduction to graphical models", May 10, 2011, pp. 1-19.

Samanidou et al., "Agent-based models of financial markets" Reports on Progress in Physics, Rep. Prog. Phys. 70 (2007) pp. 409-450.

Sargent "Verification and Validation of Simulation Models", Syracuse University, Department of Electrical Engineering and Computer Science, Proceedings of the 2011 Winter Simulation Conference, pp. 183-198.

Scibior et al. "Practical Probabilistic Programming with Monads" Haskell'15, Sep. 3-4, 2015, Vancouver, BC, Canada, pp. 165-176.

"Simydyne Agent Simulation" https://demo.simudyne.com/#Credit-Card-Model. Retrieved Jan. 5, 2021.

Chawla et al. "SMOTE: Synthetic Minority Over-sampling Technique", Journal of Artificial Intelligence Research 16 (2002) pp. 321-357.

Walonoski et al. "Synthea: An approach, method, and software mechanism for generating synthetic patients and the synthetic electronic health care record", Journal of the American Medical Informatics Association, 25(3), 2018, pp. 230-238.

Chen et al. "The validity of synthetic clinical data: a validation study of a leading synthetic data generator (Synthea) using clinical quality measures" BMC Medical Informatics and Decision Making. pp. 1-9, 2019.

Fritz et al. "Verification And Validation Of Simulation Models" (1995). Electrical Engineering and Computer Science. 113, https://surface.syr.edu/eecs/113. pp. 1-8, 1995.

Andreea Sistrunk et al. "On synthetic data generation for anomaly detection in complex social networks" arxiv.org Cornell University Library, 201 Olin Library Cornell University, Ithaca, NY 14853, Oct. 25, 2020, XP081799556.

Dongjun Kim et al. "Automatic Calibration of Dynamic and Heterogeneous Parameters in Agent-based Model" arxiv.org Cornell University Library, 201 Olin Library Cornell University Ithaca, NY 14853, Aug. 9, 2019, XP081458802.

Jun. 11, 2024—(EP) Extended European Search Report—App No. 22737018.6.

Daniel Nemirovsky et al., "Countergan: Generating Realistic Counterfactuals with Residual Generative Adversarial Nets" arXiv, Sep. 11, 2020, pp. 1-12.

* cited by examiner

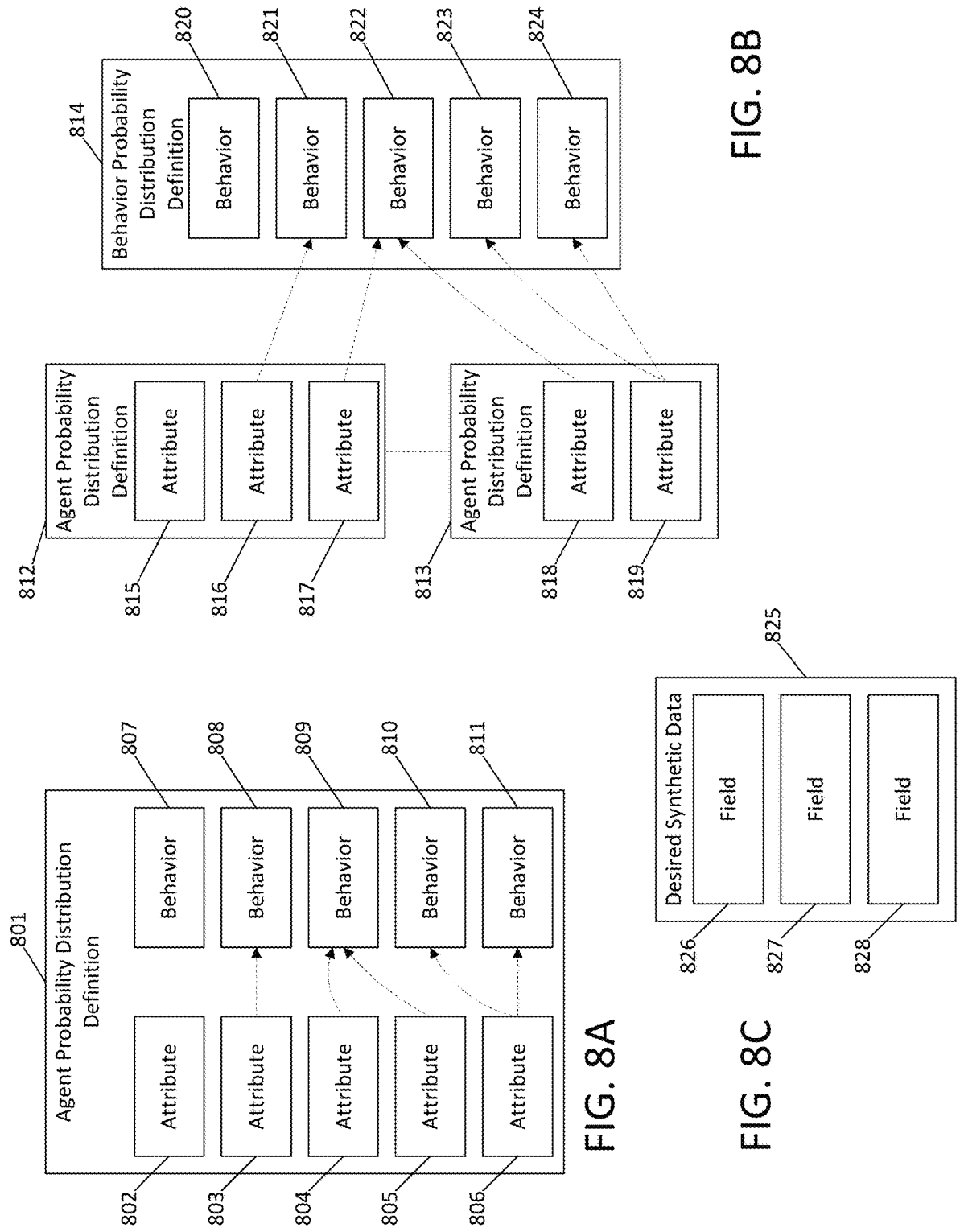

```
module Examples.Sprinkler where
import Sim.Contra

-- PART 1: Definition of Probabilistic Model

-- | Bayes probability monad
type Bayes = Prob IO

-- | declare types for each of the nodes in network
type Rain = Bool
type Sprinkler = Bool
type WetGrass = Bool -- | and type for the joint distribution
data Joint = Joint
  { rain :: Rain
  , sprinkler :: Sprinkler
  , wetGrass :: WetGrass
  } deriving (Show)

-- | Distribution monad for whether it's raining
raining :: Bayes Rain
raining = p 0.2

-- | Conditional distribution monad for whether the sprinkler is on
-- given we know whether it's raining or not
sprinklerOn :: Rain -> Bayes Sprinkler
sprinklerOn True  = p 0.4
sprinklerOn False = p 0.01

-- | Conditional distribution monad for whether the grass is wet
-- given we know the state of the sprinkler and the rain
grassWet :: Sprinkler -> Rain -> Bayes WetGrass
grassWet False False = p 0.0
grassWet False True  = p 0.8
grassWet True  False = p 0.9
grassWet True  True  = p 0.99

-- | Joint distribution monad, composed from other distribution monads
-- at this point it's all still a distribution monad, no sampling
-- has taken place
joint :: Bayes Joint
joint = do
    r <- raining
    s <- sprinklerOn r
    g <- grassWet r s
    return Joint { rain = r, sprinkler = s, wetGrass = g}
```

FIG. 21

```
-- PART 2: Defining How To Sample From Probabilistic Model

-- | Function to sample n times from any Bayes monad. Output is no longer a
-- Bayes monad, but a list of items sampled from it.
sampleBayes :: Int -> Bayes a -> IO [a]
sampleBayes nTimes bayesMonad = do
    rng <- createSystemRandom
    samples nTimes bayesMonad rng -- PART 3: Using it to generate sample data -- Sample a list of Rain items
sampleRaining :: IO [Rain]
sampleRaining = sampleBayes 10 raining
-- output:
-- λ> sampleRaining
-- [False,True,False,False,False,False,False,True,False,False]

-- Sample a list of Joint items
sampleJoint :: IO [Joint]
sampleJoint = sampleBayes 10 joint
-- output:
-- λ> sampleJoint
-- [ Joint {rain = True, sprinkler = False, wetGrass = True}
-- , Joint {rain = True, sprinkler = True, wetGrass = True}
-- , Joint {rain = False, sprinkler = False, wetGrass = False}
-- , Joint {rain = False, sprinkler = False, wetGrass = False}
-- , Joint {rain = False, sprinkler = False, wetGrass = False}
-- , Joint {rain = False, sprinkler = False, wetGrass = False}
-- , Joint {rain = True, sprinkler = False, wetGrass = True}
-- , Joint {rain = True, sprinkler = True, wetGrass = True}
-- , Joint {rain = True, sprinkler = False, wetGrass = True}
-- , Joint {rain = True, sprinkler = True, wetGrass = True}]
```

FIG. 22

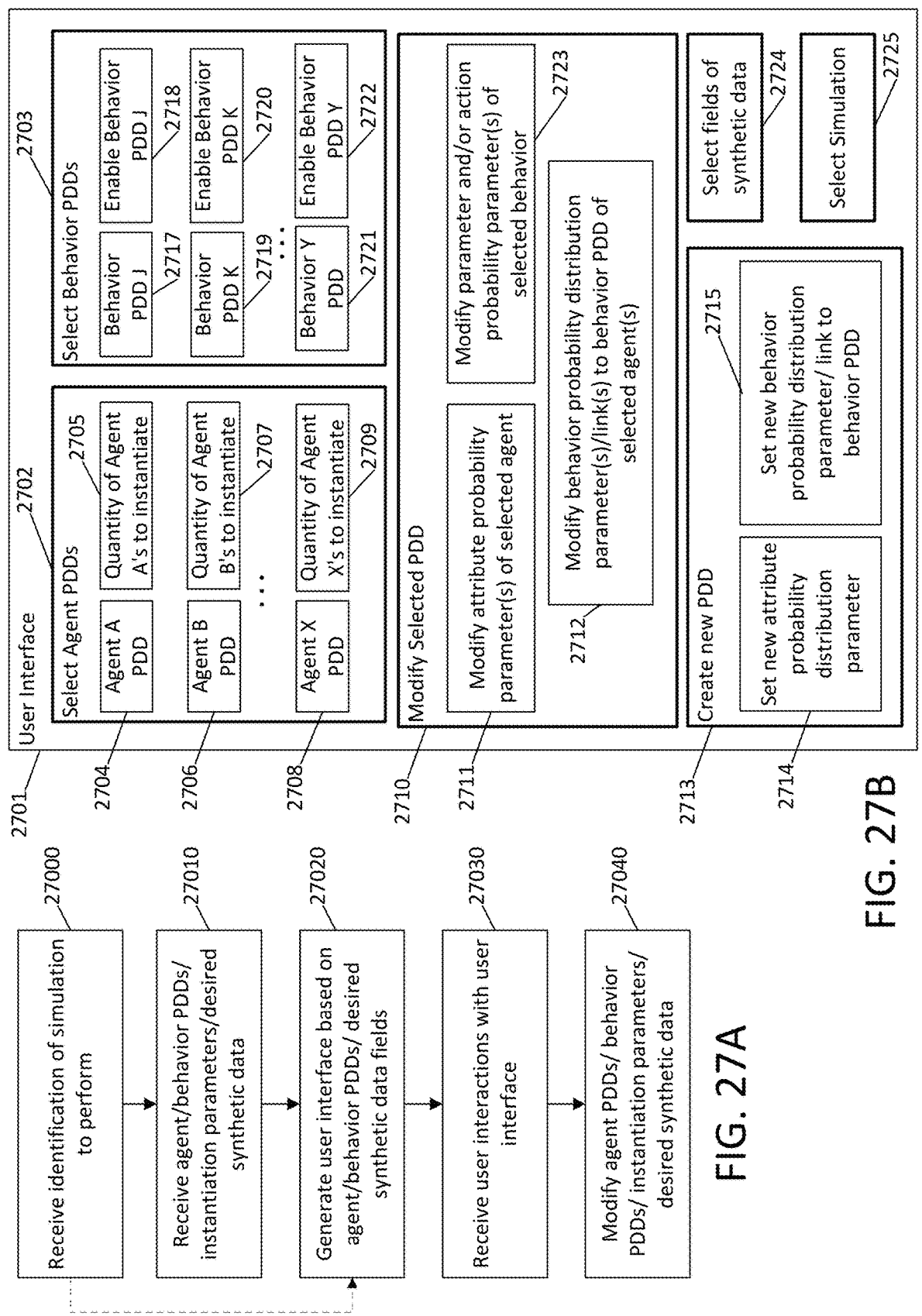

EXTENSIBLE AGENTS IN AGENT-BASED GENERATIVE MODELS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

RELATED APPLICATIONS

This application is a Continuation-in-Part of U.S. application Ser. No. 17/142,097, filed Jan. 5, 2021, entitled "Generation of Synthetic Data using Agent-Based Simulations", whose contents are expressly incorporated herein by reference for all purposes.

Each of the following applications is expressly incorporated herein by reference for all purposes:
1. U.S. patent application Ser. No. 17/142,024, entitled "Augmenting Datasets with Synthetic Data", filed Jan. 5, 2021;
2. U.S. patent application Ser. No. 17/142,097, entitled "Generation of Synthetic Data using Agent-Based Simulations", filed Jan. 5, 2021;
3. U.S. patent application Ser. No. 17/142,117, entitled "Generation of Secure Synthetic Data Based on True-Source Datasets", filed Jan. 5, 2021; and
4. U.S. patent application Ser. No. 17/142,137, entitled "Risk-Reliability Framework for Scoring Synthetic Data Models", filed Jan. 5, 2021.

FIELD OF USE

Aspects of the disclosure relate generally to databases. More specifically, aspects of the disclosure may provide for enhanced creation and maintenance of one or more data models and their related datasets.

BACKGROUND

The training of deep learning neural networks, a type of machine learning models, requires large volumes of data. Sometimes, the volume of data does not exist to properly train neural networks to cover various scenarios or variations in data. Other times, the volume of data exists but is protected from access by governmental privacy regulations (e.g., financial and/or medical) or corporate policies. The effect is that developers seeking to develop machine learning models that require large volumes of training data from actual data cannot access the volume of data needed to adequately train the machine learning models.

In other situations, training machine learning models based on solely factual data limits the models to only environments that have actually existed. Developers seeking to train machine learning models based on environments that are rare or have not existed is difficult, if not impossible, as training data does not exist.

In yet further situations, developers may need data for testing applications and/or providing training data for the training of personnel to handle various scenarios with real or realistic data across various domains including, for instance, data science, recruiting, personnel training, and other domains. In some domains, real data may be available but may require a lengthy security verification process before the real data is released to the developers. Where realistic data (syntactically similar to real data but with reduced privacy and/or security concerns) is sought, the scrubbing process for converting real data into anonymized data may be time consuming to ensure no real data is inadvertently released.

Generative models have been used to generate realistic synthetic data (i.e., data that is not acquired as a result of direct observation but is otherwise indistinguishable from observed behavior, either by statistical testing or human review). However, conventional generative models are difficult to use as well as difficult and time-consuming for average developers to modify to create the desired realistic synthetic data.

SUMMARY

Aspects described herein may address these and other problems, and generally improve the quality and quantity of data available for improving the modeling of systems, training machine learning models, and/or other purposes by offering improved generation of synthetic data and/or validation of the models generating the synthetic data. The following presents a simplified summary of various aspects described herein. This summary is not an extensive overview, and is not intended to identify key or critical elements or to delineate the scope of the claims. The following summary merely presents some concepts in a simplified form as an introductory prelude to the more detailed description provided below.

Aspects described herein may allow for generation of synthetic datasets comprising factual synthetic data and/or counterfactual synthetic data. This may have the effect of improving the complexity of data available for training machine learning models. According to some aspects, these and other benefits may be achieved by using models to generate the synthetic data. In implementation, the ability to generate a greater variety of data may be effected by using one or more models to describe data, generate synthetic datasets based on those models, and selectively configure the models to improve the modeling of the data and/or generate additional datasets varying from the original dataset. The additional datasets may include data (referred to herein as "factual synthetic data") closely matching a limited amount of actual data available based on a known environment or data (referred to herein as "counterfactual synthetic data") representing data from a created environment (e.g., an environment that has not occurred). The models may include, but not limited to, a probabilistic graphical model (PGM) and/or an agent-based model (ABM). Further aspects described herein may provide for scrubbing actual data to create a generative model that does not reveal the content of the underlying true-source data and may provide for validating a generative model.

According to some aspects, these and other benefits may be achieved by using a computer-implemented method that may comprise receiving a source dataset, wherein the source dataset may comprise a plurality of records, wherein each record contains data arranged in a plurality of fields; determining one or more parameters for the plurality of fields based on the data of the records in the plurality of fields, wherein the parameters comprise one or more of statistical parameters or correlation parameters; storing the one or more parameters; generating a generative model of the source dataset, wherein the generative model may be configured to generate one or more generated datasets having the one or more parameters; generating, based on the generative model, a generated dataset comprising data arranged in the plurality of fields, wherein the generated dataset may be a synthetic dataset; and outputting the generated dataset.

According to some aspects, benefits may be achieved by using a computer-implemented method that may receive a simulation specification comprising an agent having a probability distribution definition, the agent probability distribution definition comprising attribute probability distribution definitions and identifying one or more behaviors to be simulated; receive one or more instantiation parameters; generate, using the simulation specification, a simulation state of an agent-based model, the generate comprising instantiating, via sampling using a random number generator to sample probability distribution definitions of attributes of the agent probability distribution definition, an agent instance comprising first attributes; store the simulation state; simulate, based on the simulation state and the simulation specification, a simulation step comprising performing, via sampling using the random number generator to sample a probability distribution definition of the one or more behaviors associated with the agent instance, an action for the agent instance; store the simulation step; generate, based on the stored simulation step, a synthetic dataset; and output the synthetic dataset.

According to some aspects, benefits may be achieved by a computer-implemented method that may comprise receiving a true-source dataset comprising a source plurality of records, wherein the source plurality of records may be arranged according to a plurality of fields and each record of the source plurality of records may comprise true-source data for at least one field; categorizing, using a previously-trained model, one or more fields of the plurality of fields; determining, based on the categorizing of the one or more fields of the plurality of fields, a method of scrubbing the source plurality of records; generating, based on the determined method for scrubbing the one or more fields of the plurality of fields of the source plurality of records of the true-source dataset, a scrubbed dataset comprising a scrubbed plurality of records; determining, based on the data of the scrubbed plurality of records of the scrubbed dataset, one or more parameters for the plurality of fields of the scrubbed dataset, wherein the parameters comprise one or more of statistical parameters or correlation parameters; storing the one or more parameters; generating a generative model of the scrubbed dataset, wherein the generative model describes the scrubbed dataset using parameters; generating, based on the generative model, a generated dataset comprising a generated plurality of records; and outputting the generated dataset.

According to some aspects, benefits may be achieved by a computer-implemented method may comprise receiving a generative model, wherein the generative model may be configured to generate one or more generated datasets having records arranged in one or more fields; generating, based on the generative model, a generated test dataset; receiving one or more input parameters associated with the one or more fields; determining, based on the one or more input parameters, a hypothesis test for the one or more fields; determining, based on data in the one or more fields of the generated test dataset, a parameter, wherein the parameter may be one or more of a statistical parameter or a correlation parameter; determining, based on the parameter, whether the generated test dataset passed the hypothesis test; and outputting the determination whether the generated test dataset passed the hypothesis test.

According to some aspects, a framework for agent-based modeling (ABM) simulations may include separating definitions of agents from simulation specifications. This separation permits greater control of each of the agents and the simulations using the agents. The framework with the separate agent definitions permits agents to be extensible across different simulations that otherwise would not be based on common agents. In short, separating agent definitions from simulation specifications permit the creation of extensible, complex agents that include attributes and/or behaviors that may not be used for any given simulation. By permitting agents to grow in complexity independent of any given simulation, agents become more comprehensive in their attributes and behaviors. The complex agents may then streamline the creation of complex simulations by allowing simulations to reuse complex agents rather than requiring agents to be newly defined for each simulation. In addition, instead of representing environmental factors as part of the simulation variables, at least some environmental factors may be represented as agents.

Thus, a computer-implemented method may comprise storing, in a storage, one or more agent type definitions, wherein each agent type definition may comprise a plurality of attribute probability distribution definitions, receiving, for a first simulation, a first simulation specification, wherein the first simulation specification may comprise a first list of agent type definitions, attribute probability distributions associated with the first list of agent type definitions, and behavior probability distributions associated with the first list of agent type definitions; generating the first simulation via sampling, using a random number generator, the first simulation specification's probability distributions of the first list of agent type definitions; executing steps of the first simulation via sampling, using the random number generator, the first simulation specification's probability distributions of the first list of agent type definitions and the behavior probability distributions associated with the first list of agent type definitions; outputting, based on the first simulation, a first synthetic dataset; receiving, for a second simulation, a second simulation specification, wherein the second simulation specification may comprise a second list of agent type definitions, attribute probability distributions associated with the second list of agent type definitions, and behavior probability distributions associated with the second list of agent type definitions; generating the second simulation via sampling, using the random number generator, the second simulation specification's probability distributions of the second list of agent type definitions; executing steps of the second simulation via sampling, using the random number generator, the second simulation specification's probability distributions of the second list of agent type definitions and the behavior probability distributions associated with the second list of agent type definitions; and outputting, based on the second simulation, a second synthetic dataset. The first list of agent type definitions and the second list of agent type definitions may include at least one common agent type definition.

Corresponding apparatus, systems, and computer-readable media are also within the scope of the disclosure.

These features, along with many others, are discussed in greater detail below.

BRIEF DESCRIPTION OF THE DRAWINGS

The present disclosure is illustrated by way of example and not limited in the accompanying figures in which like reference numerals indicate similar elements and in which:

FIGS. 8A, 8B, and 8C depict examples of probability distribution definitions and various simulation parameters. FIG. 8A depicts an example of an agent probability distribution definition that includes both attributes and behaviors. FIG. 8B depicts an example of an agent probability distribution definition and a separate behavior probability distribution definition. FIG. 8C depicts an example of desired synthetic data to be produced by the agent-based model;

FIGS. 21-22 depict sample code for defining an agent-based model using a functional programming language;

FIG. 27A depicts a flowchart of a process of modifying an agent-based model. FIG. 27B depicts a user interface for modifying an agent-based model.

DETAILED DESCRIPTION

Figure 1:
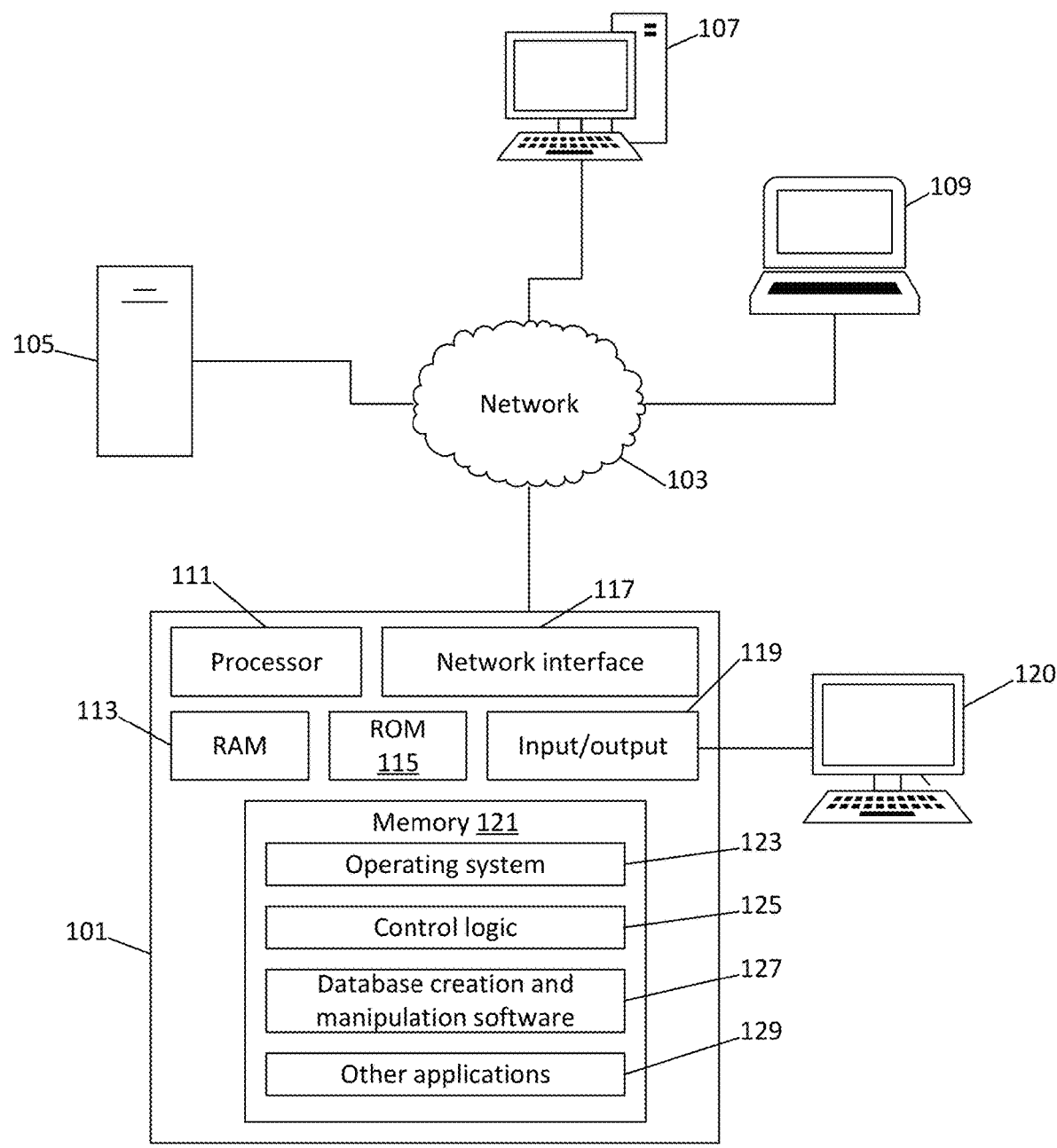
FIG. 1 depicts an example of a computing device and system architecture that may be used in implementing one or more aspects of the disclosure in accordance with one or more illustrative aspects discussed herein.

In the following description of the various embodiments, reference is made to the accompanying drawings, which form a part hereof, and in which is shown by way of illustration various embodiments in which aspects of the disclosure may be practiced. It is to be understood that other embodiments may be utilized and structural and functional modifications may be made without departing from the scope of the present disclosure. Aspects of the disclosure are capable of other embodiments and of being practiced or being carried out in various ways. Also, it is to be understood that the phraseology and terminology used herein are for the purpose of description and should not be regarded as limiting. Rather, the phrases and terms used herein are to be given their broadest interpretation and meaning. The use of "including" and "comprising" and variations thereof is meant to encompass the items listed thereafter and equivalents thereof as well as additional items and equivalents thereof.

By way of introduction, aspects discussed herein may relate to methods and techniques for improving creation and/or modification of a database based on synthetic data with relevant distributions. As discussed further herein, this combination of features may allow for improved modeling of a database by basing fields and data structures on source data having relevant distributions pertinent to the modeled fields. General concepts used herein may be described as follows, with other aspects being described below: "synthetic data" may refer to any data that is not acquired as a result of direct observation but is otherwise indistinguishable from observed behavior, either by statistical testing or human review; an "agent" may refer to a software process behaving like something that may or may not exist in the real world to be represented in a simulation (e.g., the agent having attributes and able to execute one or more behaviors. For example, a credit card user may be modeled as a set of attributes including credit score, checking account, credit limit and credit account, and a set of behaviors including pay credit card, spend money, etc.); an "agent-based model" may refer to a model of something in the real world, for example an economy, implemented as multiple software agents interacting with each other; a "behavior" may refer to something a software agent is allowed to do in the context of an agent-based model (e.g., an agent model of a credit card user may have a first behavior to pay a balance on a credit card, and a second behavior to purchase goods or services using the credit card); a "simulation" may refer to a series of steps in an agent-based model where agents interact with each other and execute behaviors to generate synthetic data; and a "probability distribution" may refer to a mathematical function defining the probabilities of possible values for sampled data points, agents, or behaviors. Before discussing these concepts in greater detail, however, several examples of a computing device that may be used in implementing and/or otherwise providing various aspects of the disclosure will first be discussed with respect to FIG. 1.

FIG. 1 illustrates one example of a computing device 101 that may be used to implement one or more illustrative aspects discussed herein. For example, the computing device 101 may, in some embodiments, implement one or more aspects of the disclosure by reading and/or executing instructions and performing one or more actions based on the instructions. In some embodiments, the computing device 101 may represent, be incorporated in, and/or include various devices such as a desktop computer, a computer server, a mobile device (e.g., a laptop computer, a tablet computer, a smart phone, any other types of mobile computing devices, and the like), and/or any other type of data processing device.

The computing device 101 may, in some embodiments, operate in a standalone environment. In others, the computing device 101 may operate in a networked environment. As shown in FIG. 1, various network nodes 101, 105, 107, and 109 may be interconnected via a network 103, such as the Internet. Other networks may also or alternatively be used, including private intranets, corporate networks, LANs, wireless networks, personal networks (PAN), and the like. Network 103 is for illustration purposes and may be replaced with fewer or additional computer networks. A local area network (LAN) may have one or more of any known LAN topologies and may use one or more of a variety of different protocols, such as Ethernet. Devices 101, 105, 107, 109, and other devices (not shown) may be connected to one or more of the networks via twisted pair wires, coaxial cable, fiber optics, radio waves, or other communication media. Additionally or alternatively, the computing device 101 and/or the network nodes 105, 107, and 109 may be a server hosting one or more databases.

As seen in FIG. 1, the computing device 101 may include a processor 111, RAM 113, ROM 115, network interface 117, input/output interfaces 119 (e.g., keyboard, mouse, display, printer, etc.), and memory 121. Processor 111 may include one or more computer processing units (CPUs), graphical processing units (GPUs), and/or other processing units such as a processor adapted to perform computations associated with database operations. I/O 119 may include a variety of interface units and drives for reading, writing, displaying, and/or printing data or files. I/O 119 may be coupled with a display such as display 120. Memory 121 may store software for configuring computing device 101 into a special purpose computing device in order to perform one or more of the various functions discussed herein. Memory 121 may store operating system software 123 for controlling overall operation of the computing device 101, control logic 125 for instructing the computing device 101 to perform aspects discussed herein, database creation and manipulation software 127 and other applications 129. Control logic 125 may be incorporated in and may be a part of database creation and manipulation software 127. In other embodiments, the computing device 101 may include two or more of any and/or all of these components (e.g., two or more processors, two or more memories, etc.) and/or other components and/or subsystems not illustrated here.

Devices 105, 107, 109 may have similar or different architecture as described with respect to the computing device 101. Those of skill in the art will appreciate that the functionality of the computing device 101 (or device 105, 107, 109) as described herein may be spread across multiple data processing devices, for example, to distribute processing load across multiple computers, to segregate transactions based on geographic location, user access level, quality of service (QoS), etc. For example, devices 101, 105, 107, 109, and others may operate in concert to provide parallel computing features in support of the operation of control logic 125 and/or software 127.

One or more aspects discussed herein may be embodied in computer-usable or readable data and/or computer-executable instructions, such as in one or more program modules, executed by one or more computers or other devices as described herein. Generally, program modules include routines, programs, objects, components, data structures, etc. that perform particular tasks or implement particular abstract data types when executed by a processor in a computer or other device. The modules may be written in a source code programming language that is subsequently compiled for execution, or may be written in a scripting language such as (but not limited to) Python or JavaScript. The computer executable instructions may be stored on a computer readable medium such as a hard disk, optical disk, removable storage media, solid-state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects discussed herein, and such data structures are contemplated within the scope of computer executable instructions and computer-usable data described herein. Various aspects discussed herein may be embodied as a method, a computing device, a data processing system, or a computer program product.

Having discussed several examples of computing devices which may be used to implement some aspects as discussed further below, discussion will now turn to a method for modeling a database using synthetic data having a distribution relevant to fields of the database.

Figure 2:
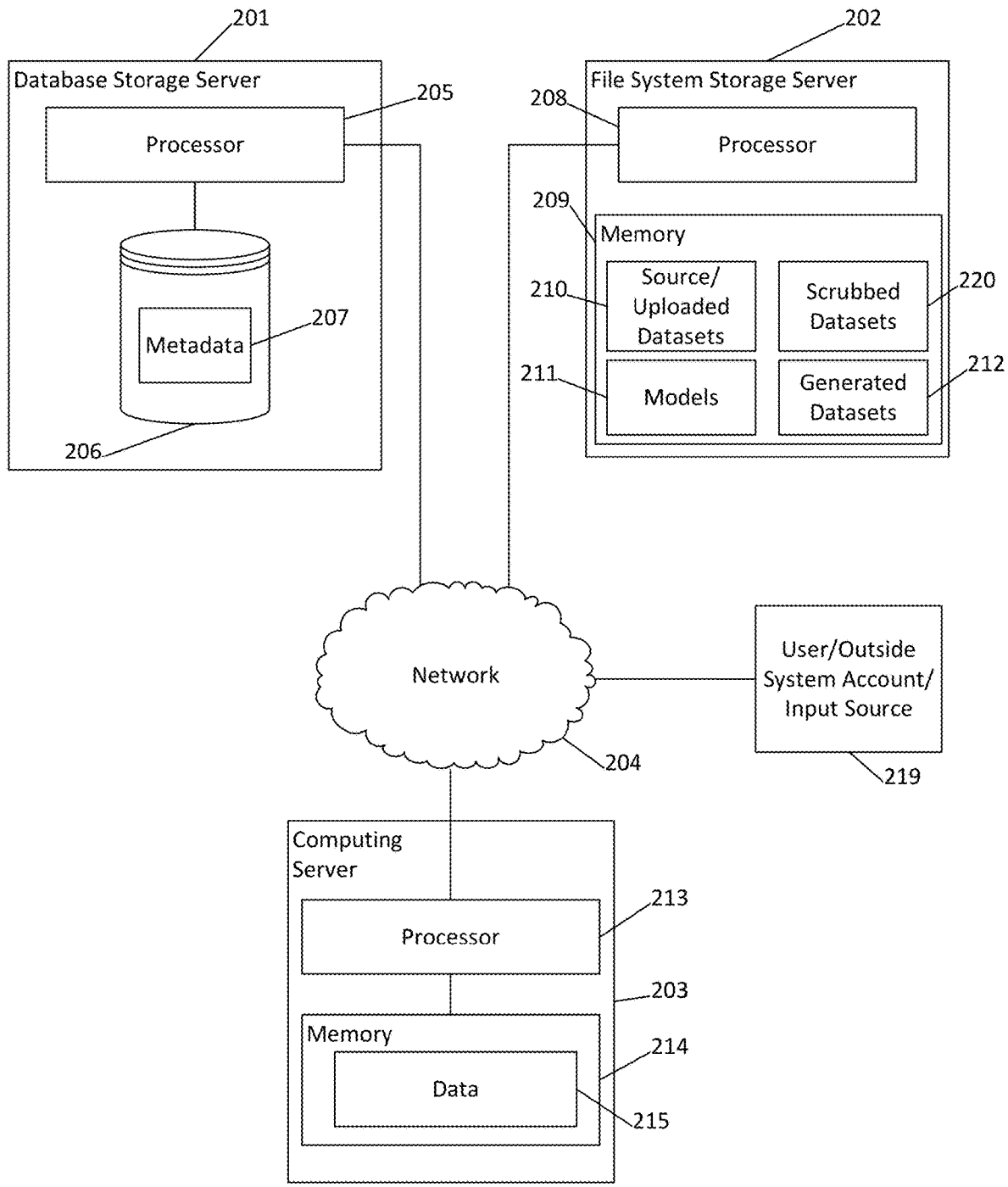
FIG. 2 depicts an example of a network comprising servers and databases.

FIG. 2 depicts an example of a network of two or more servers each supporting one or more databases having datasets. A database storage server 201, a file system server 202, and a computing server 203 may be connected to each other via network 204. Network 204 may be represented as a single network but may comprise combinations of other networks or subnetworks.

The database storage server 201 may include one or more processors 205, a database 206 comprising metadata 207 for one or more datasets. The file system server 202 may include one or more processors 208, a memory 209 comprising one or more source/uploaded datasets 210, one or more data models 211 (also referred to as "data model objects"), one or more scrubbed datasets 220, and one or more generated datasets 212. The metadata for the source datasets 210 and the synthetic datasets may be stored as metadata 207 in the database storage server 201. The computing server 203 may include one or more processors 213 and a storage 214 comprising data 215. Database storage server 201, file system server 202, and/or computing server 203 may offer services for computing data ingestion, generating a data model object, and generating synthetic data. Those services may include communicating with the other servers as needed to obtain or provide the source datasets, the data model objects, and/or the generated synthetic data as needed. An input data source 219 may make requests of the database storage server 201, the file system server 202, and/or the computing server 203 to obtain generated data. The input data source 219 may be a user and/or outside system account.

Additionally, as some datasets may be partitioned in time, geographical region, and other criteria, the new dataset may be created from a first set of rows from a first table and a second set of rows from a second table. Further, the new dataset may obtain content from other new datasets.

When designing a new data model object, software engineers consider a number of factors that help them plan how that new model should be configured. During the designing process, a software engineer attempts to create an abstract model that organizes elements of data to be stored in a file system and standardizes how those data elements relate to each other and to the properties of entities. For example, for a data model object relating to credit card account data, the data model object may include a first data element representing an account holder and a second data element representing the billing address for that credit card account.

The term "data model object" is generally used in two separate senses. In a first sense, the term refers to an abstract formulation of the objects and relationships found in a particular domain. In a second sense, the term refers to a set of concepts used to define formalizations in that particular domain. As described herein, the term "data model object" may be used in both senses, as relevant to the description in context. As a variety of performance factors are tied to the data model object (including but not limited to speeds of searches, adding new data, reindexing the database, and the like), correctly modeling data often means repeatedly revising a given model prior to deployment.

To minimize inconsistencies between small, sampled source datasets and minimize inappropriate skewing a data model object based on those inconsistencies, a software engineer may use synthetic data in datasets to replace the small, sampled source datasets where the synthetic data is expected to be close to ideal for a given numerical field. An issue with the use of synthetic data is the lack of reusability of any generated synthetic data or even the process to generate the synthetic data. In other words, when a software engineer develops a process for generating synthetic data for modeling data, that process is highly associated with that data. When turning attention to the next data to be modeled, the process for generating additional synthetic data has to be re-created for that new data model object.

Also, small, sampled source datasets may be used in machine learning models to train the models to act in a desired way and/or produce predictions based on input data.

Machine Learning Generative Models

Machine learning is a process by which computer algorithms improve through experience. Machine learning algorithms build a mathematical model based on sample data, known as "training data", in order to make predictions or decisions without being explicitly programmed to do so. Machine learning algorithms are used in a wide variety of applications, such as email filtering and computer vision, where it is difficult or infeasible to develop conventional algorithms to perform the needed tasks.

One input to these machine learning models may include historical datasets that capture aspects of the operations of the business. For example, high-value business decisions may be automated with machine learning models. A risk in deploying machine learning models into production may include that future events do not necessarily resemble past events. As such, a machine learning model trained only on historical events may make suboptimal decisions on live events. This downside may become significant in the financial industry because of the risk involved in making decisions based on incomplete or unrepresentative data. Machine learning models may benefit from additional data where the data encompasses.

A generative model, as used herein, is used to describe models that generate instances of output variables that may be used for machine learning. A generative model may generate synthetic data that may be input into various machine learning models. A generative model may be referred to as a representation of a data distribution that may be used to generate data points. In some situations, a good generative model may be treated as a source of synthetic data—e.g., data that is realistic but not actual, real-world data. Multiple approaches exist for generating synthetic data including, but not limited to, generative adversarial networks, variational auto encoders, probabilistic graphical models, and agent-based models. A generative adversarial network (GAN) is generally referred to as a machine learning framework in which two neural networks compete against each other (e.g., based on game theory). Based on a training set, the GAN attempts to generate new data with the same statistics as the training set. A variational auto encoder (VAE) attempts to learn an encoding for a set of data by training the network to ignore irrelevant information, thus creating a reduced encoding of an original dataset. The auto encoder attempts to generate, from the reduced encoding, a representation as close as possible to its original dataset. A probabilistic graphical model (PGM) is a statistical model that represents variables and their associated probabilities as nodes and the relationships (e.g., dependencies and/or correlation) as edges. An agent-based model (ABM) is a statistical model that represents individual agents and their behaviors with the probability of the behaviors occurring over time. Recurrent neural networks (RNNs) are artificial neural networks connections between nodes form a directed graph along a temporal sequence. This allows RNNs to exhibit temporal dynamic behavior. Derived from feedforward neural networks, RNNs can use their internal state (memory) to process variable length sequences of inputs. This makes them applicable to tasks such as unsegmented, connected handwriting recognition or speech recognition. Various aspects of these models are described in this section and throughout the disclosure.

In general, GANs tend to be used in modeling where more source data is present, users are experienced in artificial intelligence processes, a goal is to accurately generate target data matching source data, and a detailed explanation or specific control of how data is generated is not required. On the other end of the spectrum, ABMs tend to be used in modeling where there is less source data, developers are experienced in a given domain of data, a goal is to simulate rare events or previously unexperienced events, and a detailed explanation or specific control of how data is generated may be needed VAEs and PGMs are generally represented on the spectrum of requirements/goals between GANs and ABMs with VAEs closer to GANs and PGMs closer to ABMs.

Various approaches to generating synthetic data are described herein. The source data may have various parameters (e.g., distribution, mean, mode, median, minimum, maximum, standard deviation, symmetry, skewness, kurtosis, correlation, or other parameters), with those parameters possibly being specified and/or determined. Similarly, the synthetic data may also have parameters, possibly being specified and/or determined. Similarly, correlations between fields may exist including, but not limited to, covariance, interclass correlation, intraclass correlation, or rank. Independence (e.g., determined, for instance, from a chi-squared test) may also be used to describe relationships between fields of data.

Where the parameters of the synthetic data closely match the parameters of the source data, the synthetic data may be referred to as "factual synthetic data" or grouped as "factual synthetic datasets". Where the parameters of the synthetic data are intentionally different than those of the source data, the synthetic data may be referred to as "counterfactual synthetic data" or grouped as "counterfactual synthetic datasets".

Various approaches are described herein that permit the generation of synthetic data (e.g., as synthetic datasets) in the range spanning factual synthetic data and counterfactual synthetic data. Further the generation of the synthetic datasets may be repeatedly tuned to customize the synthetic datasets to be statistically closer to or statistically farther from actual data. For reference herein, actual, real-world data may be referred to as "true-source data" or grouped as "true-source datasets".

Historical datasets are by nature incomplete, in the sense that they do not capture behaviors corresponding to every possible real-world scenario. As described herein, to accommodate different scenarios, a training dataset may be augmented with the counterfactual data (e.g., corresponding to ahistorical but realistic scenarios). For example, one or more of the factual datasets or counterfactual datasets may be used to augment existing historical datasets for the training of machine learning models. A machine learning model trained on counterfactual datasets may be more robust to changes in the distribution of actual and real-time data, and may be expected to do a better job in a wider set of scenarios. Alternatively or additionally, counterfactual datasets may be used to train employees in responding to various business scenarios.

Augmenting Datasets with Synthetic Data

Various generative models may be used to generate synthetic data. FIGS. 3-7 describe how to use a generative model to generate synthetic data. The generated data may be factual synthetic data and/or counterfactual synthetic data based on the desired type of synthetic data.

Figure 3:
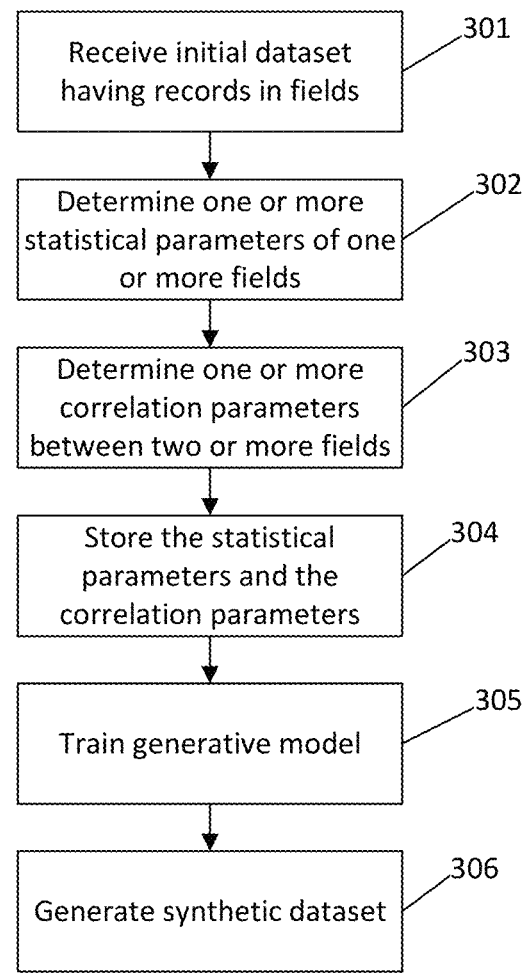
FIG. 3 depicts a flow chart for a method of generating a dataset.

FIG. 3 is an example of a flow chart describing a process for creating synthetic data from true-source data. The synthetic dataset may be used to train a machine learning model or may be used to augment existing data and the combination used to train the machine learning model. The method of FIG. 3 may be implemented by a suitable computing system, for instance, as described above with respect to FIGS. 1 and/or 2. For example, the method of FIG. 3 may be implemented by any suitable computing environment by a computing device and/or combination of computing devices, such as computing devices 101, 105, 107, and 109 of FIG. 1. The method of FIG. 3 may be implemented in suitable program instructions, such as in database creation and manipulation software 127, and may operate on a suitable data such as data from database storage server 201 or data from file system server 202 or data from computing server 203.

Various generative models may encode the distribution of a dataset by capturing both the individual variations of a variable in the dataset as well as the covariances of pairs of variables. Probabilistic graphical models may be a useful choice among models because of their sparseness and interpretability, thus permitting modification of the PGMs to represent parameters not found in existing datasets, thus permitting adjustments to comport with a desired counterfactual scenario. Based on their graphical nature, users are able to modify specific nodes to adjust parameters of variables (e.g., parameters describing the content of individual cells in fields of a database) and to modify specific edges to adjust correlations between the variables (e.g., correlations describing relationships between fields of the database). FIG. 3 describes an approach to creating synthetic datasets based on true-source datasets by the PGMs containing the probability distributions of the true-source datasets. It is appreciated that other generative models may be used to generate factual and counterfactual datasets and are encompassed in the following description.

With respect to FIG. 3, in step 301, an initial dataset is received, in which the dataset has records in fields. In step 302, a processor determines one or more statistical parameters of the one or more fields. In step 303, the processor determines one or more correlation parameters between two or more of the fields. In step 304, the statistical parameters and correlation parameters are stored (for instance, in one of the memories or databases of FIGS. 1 and/or 2). In step 305, a generative model (e.g., a probabilistic graphical model) is trained. Using the generative model, a dataset is generated in step 306.

Figure 4:
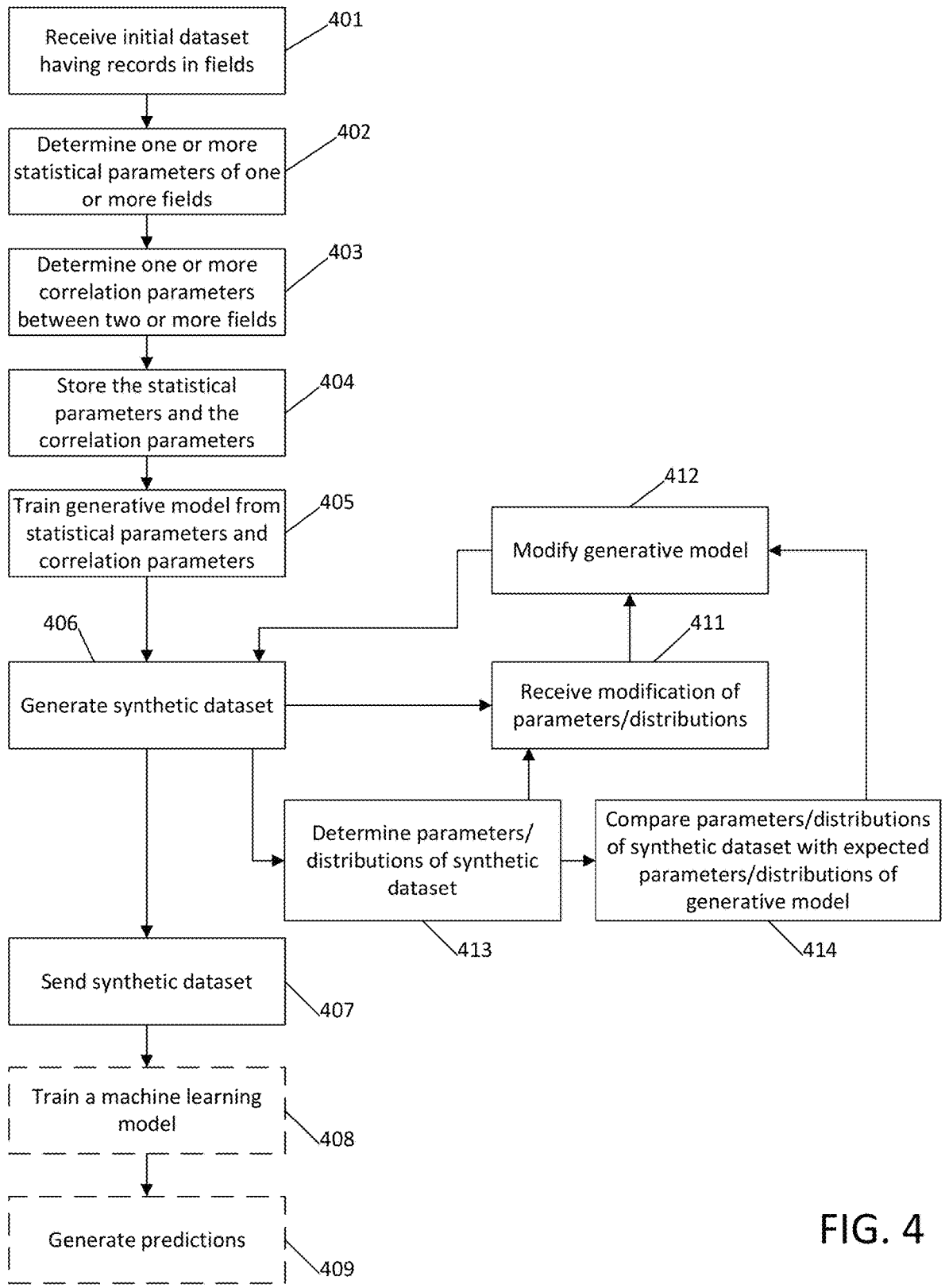
FIG. 4 depicts a flow chart for a method of generating a dataset of FIG. 3 with additional steps.

FIG. 4 describes a process similar to that of FIG. 3 and includes additional outcomes. In step 401, an initial dataset is received, in which the dataset has records arranged in fields. In step 402, a processor determines one or more statistical parameters of the one or more fields. In step 403, the processor determines one or more correlation parameters between two or more of the fields. In step 404, the statistical parameters and correlation parameters are stored, e.g., as metadata 207 in database storage server 201). In step 405, a generative model (a PGM) is trained on the metadata 207. Based on the generative model, a synthetic dataset (e.g., a probable graphical model dataset) is generated in step 406. In step 407, the generated synthetic dataset may be sent to a user who may have originally requested the generation of the synthetic dataset. Optionally, shown by dashed lines, a machine learning model may be trained in step 408 on the synthetic dataset generated in step 406 and, in step 409, the machine learning model of step 408 may be used to generate predictions based on, for example, another true-source dataset. By permitting a user to tune distributions associated with relevant variables in the generative model, the user is able to modify the underlying distribution of a generated synthetic dataset. Further, by repeatedly varying distributions with one or more variables, either starting from the initial true-source dataset or from a previously generated, synthetic dataset, a range of synthetic datasets, from factual synthetic datasets to counterfactual synthetic datasets, may be generated. The synthetic datasets may vary from each other based on different statistical properties of one variable or based on different statistical properties of multiple variables. To improve the training of a model and/or generate richer datasets for analysis, the user may combine the synthetic datasets with each other and/or with existing true-source datasets.

Alternatively or additionally, the system may receive modification of parameters and/or distributions, e.g., from a user, in step 411. Based on those modifications received in step 411, the generative model may be modified in step 412 and a synthetic dataset generated, in step 406, based on the modified generative model.

Alternatively or additionally, in step 413, statistical parameters and/or correlation parameters may be determined from the synthetic dataset as generated in step 406 (and possibly sent to the user). Based on the determination of the parameters in step 413, the system may receive modifications of one or more parameters/distributions in step 411 and, in step 412, modify the generative model, and generate a revised synthetic dataset in step 406.

Alternatively or additionally, from step 413, the parameters/distributions of the synthetic dataset may be compared, in step 414, with expected parameters/distributions of the generative model of step 405. Based on the comparison of step 414, the generative model may be modified in step 412 and a revised synthetic dataset generated in step 406.

Figure 5:
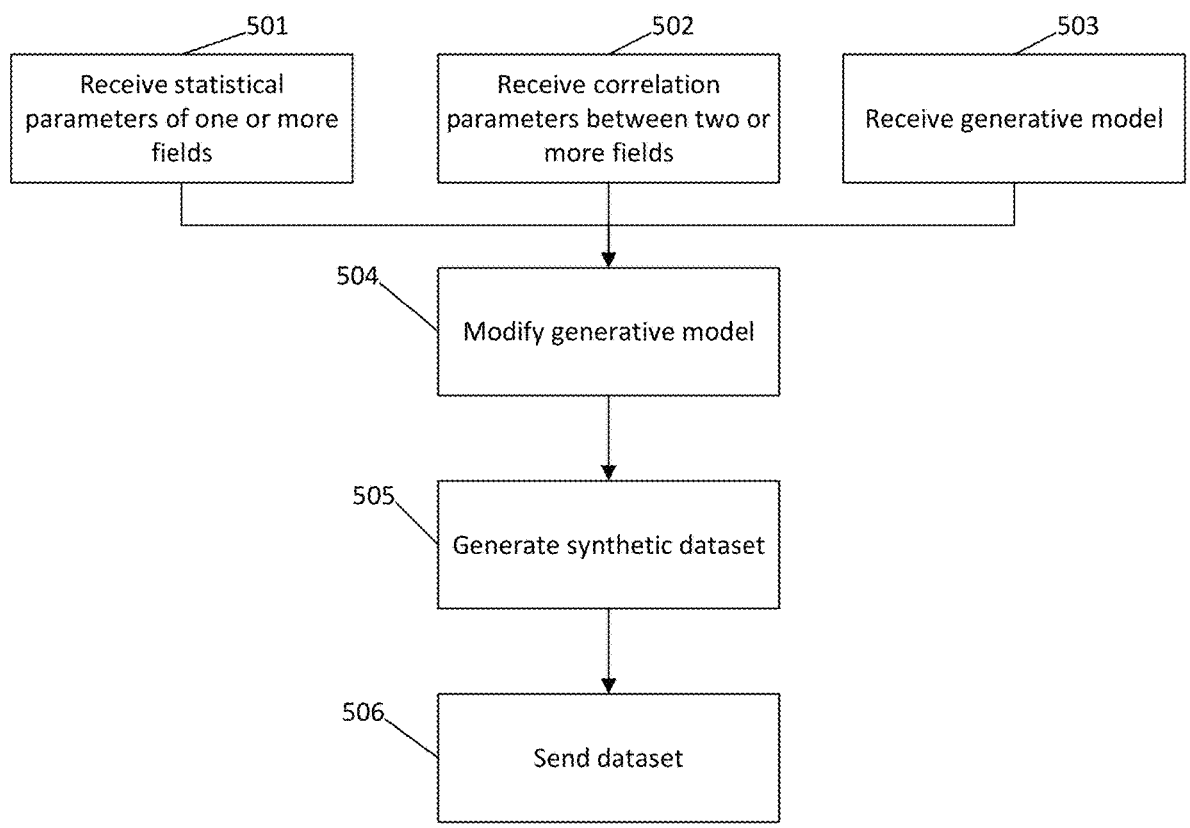
FIG. 5 depicts a flow chart for a method of generating synthetic data based on parameters and a probabilistic graphical model.

FIG. 5 describes an approach to creating synthetic datasets by capturing the knowledge of a subject matter expert, i.e., permitting the subject matter expert to control the creation of the generative model using supplied parameters. FIG. 5 depicts a flow chart of a process in which statistical parameters and/or correlation parameters are received and used to modify a generative model that then is used to generate a dataset. In step 501, statistical parameters of one or more fields of a dataset are received. In step 502, correlation parameters between two or more fields of the dataset are received. In step 503, a generative model (e.g., a probabilistic graphical model) is received, where the generative model includes various fields. Based on one or more of the statistical parameters from step 501 or the received correlation parameters from step 502, the generative model is modified in step 504. Based on the modified generative model, a modified synthetic dataset is generated in step 505. In step 506, the generated synthetic dataset may be sent to a user.

Figure 6:
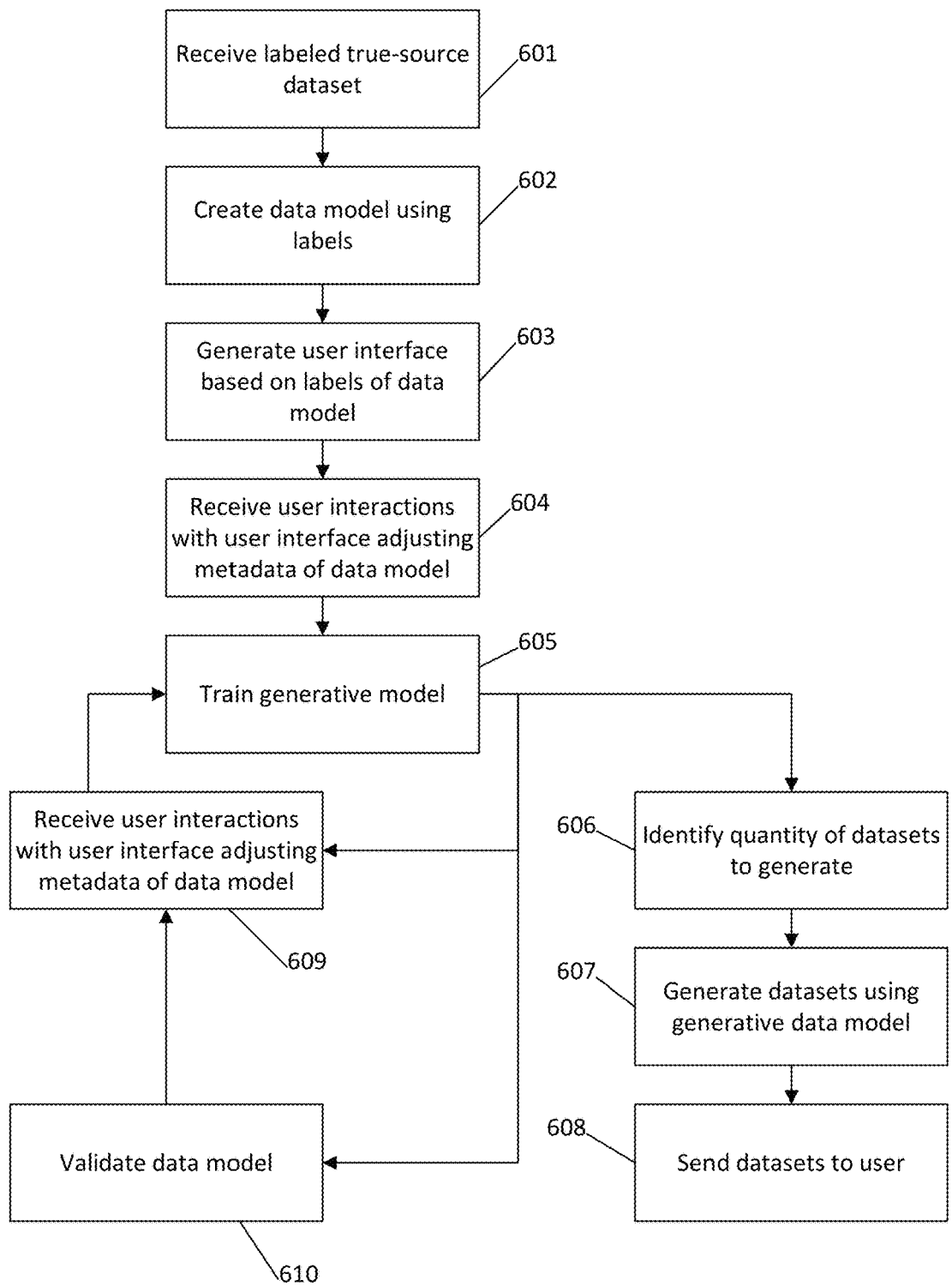
FIG. 6 depicts a flow chart for a method of generating a user interface for modification of parameters of a probabilistic graphical model.

FIG. 6 depicts a process of generating a user interface and modifying a generative model (e.g., a probabilistic graphical model) based on a user's interaction with the user interface. In step 601, a system receives a labeled true-source dataset. In step 602, the system (e.g., processor 213 or other processors) creates a data model object of the dataset using the labels of the true-source dataset. The data model object may be stored as metadata 207. In step 603, the system generates a user interface based on the metadata of step 602. In step 604, the system receives a user's interactions with the user interface modifying the metadata of the data model object and adjusts the metadata in response. In step 605, a generative model is trained based on the metadata adjusted (also referred to as "tuned") by the user. In step 606, the system may receive a user's designation of a quantity of generated datasets to be generated (e.g., through further interactions with a user interface). In step 607, the system generates the quantity of generated datasets requested by the user in step 606 and sends, in step 608, the datasets to the user. In step 609, the system may receive further user interactions with a user interface and, in response, modify the metadata of the data model object and then, based on the modified metadata, train another generative model in step 605 based on the modified metadata of the data model object. Additionally or alternatively, in step 610, the user may validate the generative model (as described herein, for example) and, based on the results of that validation step 610, further modify the metadata in step 609 for training of another generative model (or retraining based on the metadata if replacing the existing generative model). The tuning of a data model object may benefit a user by allowing the user to customize generated datasets that are then generated from a generative model trained on the tuned data model object. The modified generative model from step 609 may be subsequently used as described in FIGS. 4 and/or 5.

Figure 7:
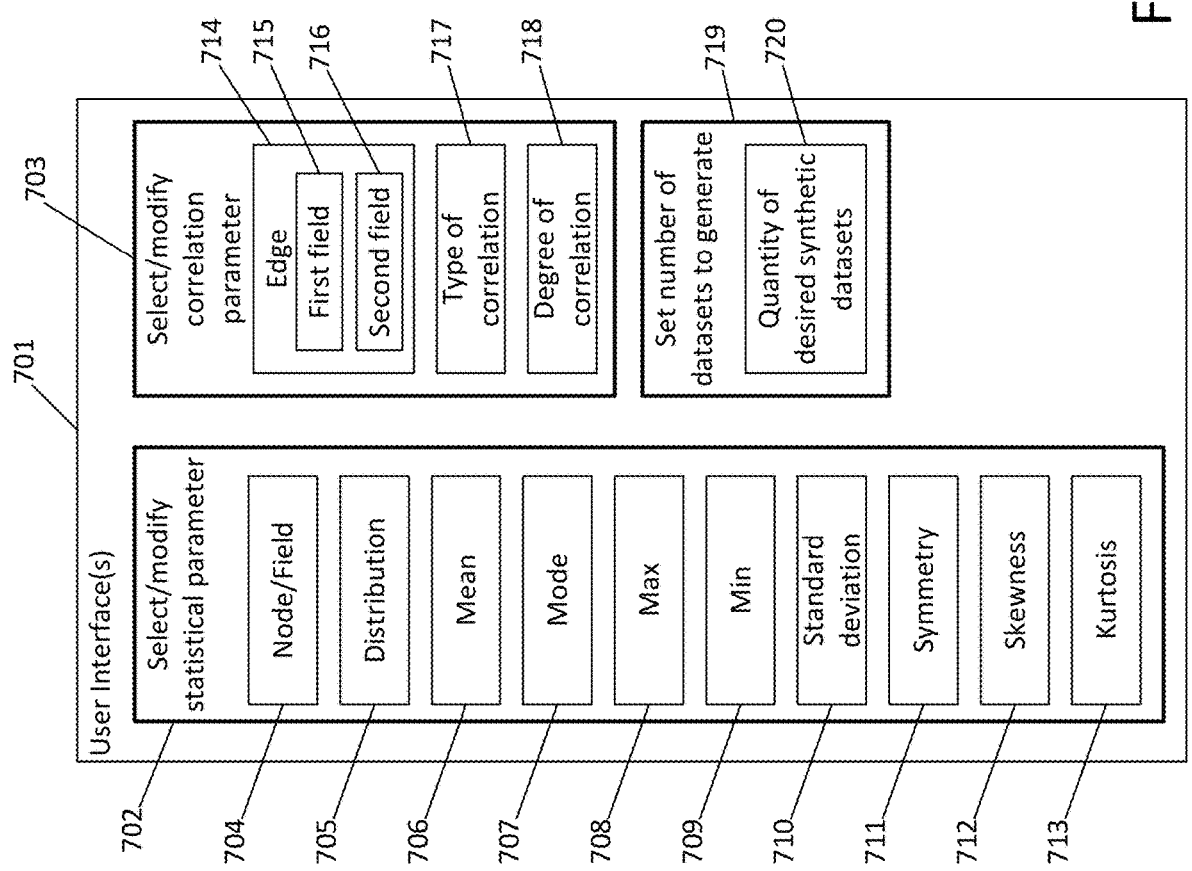
FIG. 7 depicts a user interface for selecting and/or modifying parameters of a probabilistic graphical model.

FIG. 7 depicts a possible representation of a user interface, permitting modification of a generative model. The user interface 701 may comprise one or more regions 702 permitting a user to select and/or modify statistical parameters of the generative model and one or more regions 703 permitting a user to select and/or modify correlation parameters of the generative model. The one or more regions 702 permitting selection/modification of statistical parameters may comprise one or more of a node (in the case of a PGM)/field selection/deselection (represented by region 704), a distribution modification option (represented by region 705), a mean modification option (represented by region 706), a mode modification option (represented by region 707), a maximum modification option (represented by region 708), a minimum modification option (represented by region 709), a standard deviation modification option (represented by region 710), a symmetry modification option (represented by region 711), a skewness modification option (represented by region 712), and/or a kurtosis modification option (represented by region 713). Other regions may be added as desired to permit modification of other statistical parameters. The one or more regions 703 permitting selection/modification of correlation parameters may comprise one or more of edge selection (in the case of a PGM) (represented by region 714) and/or the ability to select fields directly, e.g., first field 715 and second field 716, a type of correlation option (represented by region 717), a degree of correlation option (represented by region 718). Another region 719 may allow a user to identify how many generated datasets are to be generated and sent to the user. For instance, the quantity of desired synthetic datasets may be specified in region 720.

Using generative models as described herein, machine learning models trained on data from those generative models may be improved. For example, machine learning models in financial or cybersecurity applications may be particularly vulnerable to changing data distributions. In a bank example, a bank's credit risk model may have been trained on historical data, but the historical data may not capture long-term macroeconomic variations. Such a model may result in incorrect lending decisions when a new macroeconomic event (e.g., an election of a political party with little track record of decisions, a global pandemic, civil unrest in various jurisdictions, and the like). In a cybersecurity example, a cybersecurity threat detection model may be used to highlight suspicious behavior. However, as attack vectors are constantly evolving, a current method for detecting an attack vector may not have been represented in the cybersecurity threat detection model's training dataset, possibly resulting in false negatives and/or breaches of a secure environment. As described herein, by augmenting training datasets (true-source or synthetic) with factual synthetic and/or counterfactual synthetic datasets, machine learning models may benefit from varying the content of training datasets by reducing the overemphasis of a specific dataset while permitting a greater variety of scenarios to be encompassed within the training datasets.

Counterfactual datasets may also be used for testing use cases. In addition to being able to create machine learning models, the counterfactual datasets may be valuable for testing the performance of existing models against data that those models would not normally encounter in production. During the development of large-scale data processing systems (like databases or stream engines), these datasets may be used to simulate anticipated load patterns.

There exist various techniques to enhance a machine learning training dataset in some way. But these techniques focus on enlarging the existing dataset compared to, as described herein, augmenting the dataset with differently-distributed data. Further, other techniques of generating synthetic data, e.g., with Generative Adversarial Networks, are not tunable and interpretable enough for wide-scale use. Sparse models, like PGMs, may be easier and more tractable to understand and manipulate, thus being more suited for the generation of counterfactual data than more complex deep-learning approaches. In other words, the complexity of GANs may prevent some users from being able to determine how to modify variables much less which specific variables to modify. A system based on PGMs may be more user-friendly in terms of its input data requirements. As an initial PGM model may be learned from very little data, or be encoded by hand with the help of a subject matter expert in the relevant domain (e.g., a financial services domain or a cyber-security services domain). An issue with merely enlarging an existing dataset for machine learning is that the distributions do not change. Enlarging a dataset replicates the same biases in the existing dataset and does not enhance the learning of the machine learning model but only reinforces the existing biases. With respect to the use of GANs to generate synthetic data, GANs are not tunable and are not able to be interpreted to determine what should be modified. Sparse models, like PGMs and ABMs, are easier and more tractable to understand and manipulate, thus being more suited for generating synthetic datasets ranging from factual to counterfactual.

Thus, according to some embodiments a computer-implemented method may comprise receiving a source dataset, wherein the source dataset may comprise a plurality of records, wherein each record contains data arranged in a plurality of fields; determining one or more parameters for the plurality of fields based on the data of the records in the plurality of fields, wherein the parameters comprise one or more of statistical parameters or correlation parameters; storing the one or more parameters; generating a generative model of the source dataset, wherein the generative model may be configured to generate one or more generated datasets having the one or more parameters; generating, based on the generative model, a generated dataset comprising data arranged in the plurality of fields, wherein the generated dataset may be a synthetic dataset; and outputting the generated dataset.

The generated dataset may further comprise data resulting from tuning of the generative model to have a determined variation from one or more of the parameters. The method may further comprise receiving a request for generating a generated dataset; receiving a desired parameter; modifying, based on the desired parameter, the generative model; and generating, based on the modified generative model, a second generated dataset, wherein the second generated dataset may be a synthetic dataset. The method may further comprise receiving, from a user's computing device, a selection of the source dataset, wherein the outputting may comprise sending the generated dataset to the user's computing device. The outputting may further comprise training, based on the generated dataset, a predictive model; and generating one or more predictions based on a second source dataset using the trained predictive model. The method may further comprise receiving user input modifying one or more of the statistical parameters; modifying, based on the modified one or more statistical parameters, the generative model; generating, based on the modified generative model, a second generated dataset; and outputting the second generated dataset. The method may further comprise receiving user input modifying one or more correlation parameters; modifying, based on the modified one or more correlation parameters, the generative model; generating, based on the modified generative model, a second generated dataset; and outputting the second generated dataset. The statistical parameters may be a distribution parameter of one of the plurality of fields of the true-source dataset and comprise one of a normal distribution, uniform distribution, lognormal distribution, Poisson distribution, exponential distribution, beta distribution, gamma distribution, binomial distribution, multinomial, Dirichlet distribution, Bernoulli distribution, chi-squared distribution, Student's t distribution, F distribution, Benford distribution, power distribution, or triangular distribution. The statistical parameters may comprise a minimum, maximum, mean, mode, standard deviation, symmetry, skewness, or kurtosis. The correlation parameters may comprise a degree of correlation between two or more fields of the source dataset. The generative model may comprise a probabilistic graphical model having two or more nodes and one or more edges, wherein at least one of the two or more nodes may be based on the one or more statistical parameters, wherein the one or more edges may be based on the one or more correlation parameters, wherein one of the one or more of the statistical parameters may be a first distribution parameter of one of the plurality of fields of the source dataset. The method may further comprise receiving, from a user's computing device, a second distribution parameter; modifying, based on the receiving, a node of the generative model corresponding to the first distribution parameter to include the second distribution parameter; generating, based on the modified generative model, a second generated dataset; and sending the second generated dataset to the user's computing device.

The generative model may comprise a probabilistic graphical model having two or more nodes and one or more edges, at least one of the two or more nodes may be based on the one or more statistical parameters, wherein the one or more edges may be based on the one or more correlation parameters, and wherein one of the one or more of the statistical parameters may be a distribution parameter of one of the plurality of fields of the source dataset. The method may further comprise determining, based on one of the second plurality of fields of the generated dataset, a second distribution parameter; comparing the second distribution parameter with the distribution parameter; modifying, based on the comparing, a node of the generative model, corresponding to the first distribution parameter, to include the modified distribution parameter; and generating, based on the modified generative model, a second generated dataset.

The generative model may comprise a probabilistic graphical model having two or more nodes and one or more edges, at least one of the two or more nodes may be based on the one or more statistical parameters, the one or more edges may be based on the one or more correlation parameters, and wherein one of the one or more of the statistical parameters may be a first statistical parameter of one of the plurality of fields of the source dataset. The method may further comprise receiving, from a user's computing device, a second statistical parameter; modifying, based on the receiving, a node of the generative model, corresponding to the first statistical parameter, to include the second statistical parameter; generating, based on the modified generative model, a second generated dataset; and sending the second generated dataset to the user's computing device. The generative model may comprise a probabilistic graphical model having two or more nodes and one or more edges, wherein at least one of the two or more nodes may be based on the one or more statistical parameters, and wherein the one or more edges may be based on the one or more correlation parameters. The method may further comprise determining, based on one of the second plurality of fields of the generated dataset, a second statistical parameter; comparing the second statistical parameter with one of the one or more statistical parameters; modifying, based on comparing the second statistical parameter with the statistical parameter, a node of the generative model corresponding to the first statistical parameter, to include a modified statistical parameter; and generating, based on the modified generative model, a second generated dataset. The method may further comprise receiving, from a user's computing device, a second correlation parameter; modifying, based on the receiving, an edge of the generative model, corresponding to the one or more correlation parameters, to include the second correlation parameter; generating, based on the modified generative model, a second generated dataset; and sending the second generated dataset to the user's computing device.

According to other embodiments, an apparatus may comprise one or more processors; and memory storing instructions that, when executed by the one or more processors, cause the apparatus to receive a source dataset, wherein the source dataset may comprise a plurality of records, wherein each record contains data arranged in a plurality of fields; determine one or more statistical parameters for the plurality of fields based on the data of the records in the plurality of fields; determine one or more correlation parameters based on a correlation between data in the plurality of records in two or more fields of the plurality of fields of the source dataset; store the one or more statistical parameters and the one or more correlation parameters; generate a generative model of the source dataset, wherein the generative model may be configured to generate one or more generated datasets having the one or more statistical parameters and the one or more correlation parameters; cause display of a graphical interface of the generative model, wherein the graphical interface may be configured to display the one or more statistical parameters and the one or more correlation parameters; receive user interactions with graphical interface, wherein the user interactions may be to modify a specific statistical parameter or a specific correlation parameter; modify, of the generative model, the specific statistical parameter or the specific correlation parameter; generate, based on the modified generative model, a generated dataset comprising a second plurality of fields; and output the generated dataset.

Further, the generative model may comprise a probabilistic graphical model having two or more nodes and one or more edges. At least one of the two or more nodes may be based on the one or more statistical parameters. One or more edges may be based on the one or more correlation parameters. The instructions may further cause the receiving of user interactions to receive modifications of a statistical parameter node of the generative model, cause the modification of the statistical parameter node of the two or more nodes of the generative model, and cause the generation of, based on the modified statistical parameter node of the two or more nodes of the generative model, a second generated dataset.

According to further embodiments, one or more non-transitory media storing instructions that, when executed by one or more processors, cause the one or more processors to perform steps comprising receiving a source dataset, wherein the source dataset may comprise a plurality of records, wherein each record contains data arranged in a plurality fields; determining one or more statistical parameters for the plurality of fields based on the data of the records in the plurality of fields; determining one or more correlation parameters based on a correlation between data in the plurality of records in two or more fields of the plurality of fields of the source dataset; storing the one or more statistical parameters and the one or more correlation parameters; generating a generative model of the source dataset, wherein the generative model may be configured to generate one or more generated datasets having the one or more statistical parameters and the one or more correlation parameters; modifying, based on received inputs adjusting one or more of the statistical parameters or the correlation parameters, the generative model to include one or more of a modified statistical parameter or a modified correlation parameter; generating, based on the modified generative model, a generated dataset comprising data arranged in the plurality of fields; and outputting the generated dataset.

Generation of Synthetic Data Using Agent-Based Simulations

In addition to probabilistic graphical models, synthetic data, ranging from factual data to counterfactual data, may be generated through agent-based models (ABMs). Conventional agent-based models define parameters of the agents and actions performed by the agents in the definition of each agent. As described herein, agents and behaviors are composed of probability distribution definitions and together are used form a simulation specification. The definitions of the agents and behaviors is separate from the simulation of the agents and behaviors. By splitting, improved modeling of possible events (e.g., economic events and the like) may be achieved. As described herein, a set of behaviors may be modified to account for possible economic events before adding in existing agents. Examples of attributes for a first agent definition may include both attributes that, when sampled, generate a specific value (e.g., a specific credit limit for a first instance of the first agent definition) and/or may generate a distribution to be sampled during each step of a simulation (e.g., a propensity to pay a credit card balance (partial or full) and when (soon after receiving statement to at or after the due date) and how often (making two or more payments per month)). The specific value is, unless modified during an action, generally regarded as fixed for that first instance of the first agent and the distribution is generally regarded as varying per simulation step following the distribution pattern identified for that first instance's attribute. The agent probability definitions may be robustly defined independent of an intended simulation, thus making the agent probability definitions extensible beyond the originally intended simulation.

An agent probability definition may, for some attributes or behaviors, may define an agent independent of other agents. Other attributes or behaviors may be tied with the actions of other agents or behaviors. For example, an agent probability definition for a home buyer may be linked to an agent probability definition for a home seller, and/or to an agent probability definition for a loan agent/bank.

In addition, an economy may be represented as an agent probability definition and other agent probability definitions associated with it. This permits the other agent probability definitions to tie to a common economic state and generated synthetic datasets representing that common economic state. Further, fields of desired synthetic data may be specified as an input to a simulation component. Based on the desired fields, the synthetic data may be generated for those fields. The generated synthetic data may comprise some or all of the state information generated during each step of the simulation. By permitting the identification of desired fields of synthetic data, the system permits a greater degree of flexibility compared to systems that have unalterable identifications of the fields of the data to be generated.

Agent-based models may be useful for users who, while having a level of knowledge in a domain and seeking to use real data (true-source data), may not have access to enough real data or any at all. An agent-based model may address this lack of data by capitalizing on the users' knowledge of the domain to tune the agents and behaviors to generate the desired synthetic data. Further, an agent-based model may be helpful where existing available data does not cover all scenarios in which the users are interested. An agent-based model may address this lack of scenario-specific data by capitalizing on the users' knowledge of the domain to tune the agents and behaviors to generate the scenario-specific synthetic data. Further, as the probability distribution definitions of the agents and behaviors are distinct from the simulation, users create agents and behaviors that are extensible beyond a given simulation of a domain.

During instantiation, the ABM samples the simulation specification to generate instances of agents performing actions. The simulation specification may be run as one or more simulation steps to simulate actions taken by the instances of the agents over time. The time may cover a given period (e.g., less than a year, 10 years, 50+ years) or until a goal is achieved (e.g., 30% home ownership for a given age group), or any interval as desired. The users may model a domain of interest as a set of agents and execute a simulation of a process of interest in order to generate synthetic data similar to what would likely have been observed if the real process had occurred. An example of such a use case may include the simulation of credit card payments under different economic conditions, including hypothetical recessions never experienced before.

Agents may be referred to as having "composable" probability distributions, with their attributes composed as functions of simpler distributions. As used herein, "composable" refers to a type of object or process that may be combined with other objects or processes to make complex instances of the objects or processes. For example, a function may be composed of other functions. As used herein, a "composable probability distribution" may be a probability distribution that may be combined with other probability distributions to create a more complex probability distribution. Simulations may also be referred to as a complex probability distribution composed of the simpler probability distributions of simulated behaviors.

In some examples, agents and behaviors may be specified precisely as probability distributions without having to sample any data or run the simulation. Once the simulation specification is complete, a simulation state of the simulation may be executed by sampling, with a random number generator, the agent probability distribution definitions and their related behavior probability distribution definitions. The definition of the probability distribution definitions and the execution of the simulation (e.g., the sampling operation) may be decoupled through use of a functional language, to define and execute the simulation (for example, a functional language such as Haskell). For reference, "functional programming" may be described as a programming paradigm where programs are constructed by applying and composing functions. It is a declarative programming paradigm in which function definitions are trees of expressions that each return a value, rather than a sequence of imperative statements which change the state of the program or world. Haskell, as an example of a functional programming language, may be used to define and to execute the simulation. Haskell is described as a polymorphically statically typed, lazy, purely functional language. It is appreciated that other functional programming languages may be used in place of or in addition to Haskell. The functional language may use one or more monads. For reference, a "monad" may be considered a design pattern that allows structuring programs generically while automating away boilerplate code needed by the program logic. Monads may achieve this goal by providing their own data type (a particular type for each type of monad), which represents a specific form of computation, along with one procedure to wrap values of any basic type within the monad (yielding a monadic value) and another to compose functions that output monadic values (called monadic functions). For example, each agent may be represented by a probability monad where the agent's probability monad is composed of individual attribute probability monads that describe the probability distribution definition for each attribute. Also, the behaviors of the instances of the agents may also be represented by monads, where each behavior monad is composed of monads representing the behaviors of each instance. Further, the set of all distributions may also be a monad, the subset of probability distributions comprising the behaviors of the agent may also be monads, and the elementary probability distributions used to define the behaviors may also be monads. Using monads, complex monads may be composed from simpler monads, thus allowing complex distributions to be composed of less complex distributions.

For example, FIGS. 21 and 22 show an example of an agent-based model defined using Haskell to define a Bayesian network as a composition of probability distributions. In the model of FIGS. 21 and 22, an example is provided relating to a probability of grass being wet based on the following statement "grass may be wet because it is raining outside or because sprinklers are on." The probability that it is raining is independent but the probability that the sprinklers are on depends on whether it is raining. The probability that the grass is wet depends on both whether it is raining and whether the sprinklers are on. Here, the model is defined as a composition of probability distributions. That definition may be sampled independently of the definition. In FIG. 21, the probability model is defined using a Bayesian probability monad, the types of each of the nodes in the network are declared, and the type for the joint distribution is declared. Next, a distribution monad for whether it is raining is included—given that one knows whether or not it is raining. A conditional distribution monad for whether the sprinkler is on is included. A conditional distribution monad for whether the grass is wet—given that one knows the state of the sprinkler and the rain. A joint distribution monad, composed from other distribution monads, is included. At this point, the joint distribution monad is a distribution monad as no sampling has occurred.

In FIG. 22, the function to sample n times from any Bayesian monad is set. The output is no longer Bayesian monad but a list of items sampled from the Bayesian monad using, for instance, a random number generator. Next, the sampling is used to generate sample data. For instance, the list of Rain items may be sampled multiple times. Next, the list of Joint items may be sampled multiple times. The resulting distribution may be found from combining the results from the samplings.

To execute an instance of the simulation, agent probability distribution definitions may be sampled to generate agent instances during an initialization phase (the simulation state), and simulation step distributions may be sampled during simulation steps. During each step, synthetic data may be generated. This data may be stored for future download or streamed in real-time, depending on user needs. The code to define the simulation may be an interpreted subset of the programming language or may be a simplified domain-specific language to encode the simulation specification. The definitions of the agents and definitions of the behaviors may be stored in the same or different codebases.

An agent-based model may be deployed locally and/or across a network (e.g., in the cloud). In an example use case, the agent-based model may simulate what would happen to credit card defaults when the economy is in recession. The user may be an economist attempting to train machine learning models to predict credit card defaults but lacking enough recession data to train the models. For example, while significant data may exist for credit card defaults occurring during strong economies, there may be a lack of data for credit card defaults during economic recessions. As recessions may occur due to various factors, a robust machine learning model may benefit from being trained with data from multiple recessions including data from recessions that have, in fact, occurred (e.g., actual (true-source) data or factual synthetic data) and data from recessions that have not occurred (e.g., counterfactual synthetic data). The economist, in this example, may know how to define various types of recessions that have not yet occurred. Using the ABM, the economist may build a micro-level model to generate macro-level aggregate data (factual synthetic data) that matches existing historical data, adjusting the agents and/or behaviors as desired. Next, based on further modifications of the agents and/or behaviors, the economist may adjust the ABM to emulate other types of recessions that have not, in fact, occurred. Based on those modifications, the economist may generate counterfactual datasets corresponding to those other recessions. Those counterfactual datasets may be combined with one or more of the actual data or the factual synthetic data. The economist may then use the combined data to train and evaluate the predictive machine learning model. The trained machine learning model may then be deployed to make predictions based on new data.

FIGS. 8A, 8B, and 8C depict examples of probability distribution definitions and various simulation parameters. FIG. 8A depicts an example of an agent probability distribution definition 801 that includes both attributes 802, 803, 804, 805, and 806 and behaviors 807, 808, 809, 810, and 811. FIG. 8A includes definitions of the attributes and the behaviors in the agent probability distribution definition 801. Each attribute may be associated with no behaviors or one or more behaviors. Attribute 802 is not associated with any behavior. Similarly, behavior 807 is not associated with any attribute. Attribute 803 is associated with behavior 808. Behavior 809 is associated with attributes 804 and 805. Attribute 806 is associated with behaviors 810 and 811.

FIG. 8B depicts an example of a first agent probability distribution definition 812, a second agent probability distribution definition 813, and a separate behavior probability distribution definition 814. The first agent probability distribution definition 812 comprises attributes 815, 816, and 817 and the second agent probability distribution definition 813 comprises attributes 818 and 819. The behavior probability distribution definition 814 comprises behaviors 820, 821, 822, 823, and 824. Each attribute may be associated with no behaviors or one or more behaviors. Attribute 815 is not associated with any behavior. Similarly, behavior 820 is not associated with any attribute. Attribute 816 is associated with behavior 821. Behavior 822 is associated with attributes 817 of the first agent probability distribution definition 812 and with attribute 818 of the second agent probability distribution definition 813. Attribute 819 of the second agent probability distribution definition 813 is associated with behaviors 823 and 824. Further, the first and second agent probability distribution definition 812 and 813 may be associated with each other (e.g., one using state information from the other to perform an action associated with a behavior) as shown by the dashed line connecting the agent probability distribution definitions 812 and 813.

FIG. 8C depicts an example of desired synthetic data to be produced by the agent-based model. The desired synthetic data 825 comprises one or more fields (represented in FIG. 8C as fields 826, 827, and 828) for which a synthetic dataset is requested to be generated by the simulation of first agent probability distribution definitions and behavior probability distribution definitions. The request may be sent by a user of a cloud-based service to the system generating the synthetic datasets.

FIGS. 9A, 9B, 9C, and 9D depict state diagrams for conducting agent-based model simulations. In general, the probability distribution definitions of FIGS. 8A-8C may be combined together to form a simulation specification. The simulation specification may be used, with instantiation data, to instantiate instances of agents who are defined in the simulation specification by sampling the simulation specification with a random number generator, resulting in a simulation state. That simulation state may be iteratively sampled, using the random number generator, to perform actions defined in behaviors associated with the instantiated agents. Each sampling of the simulation state may a simulation step.

Figure 9A:
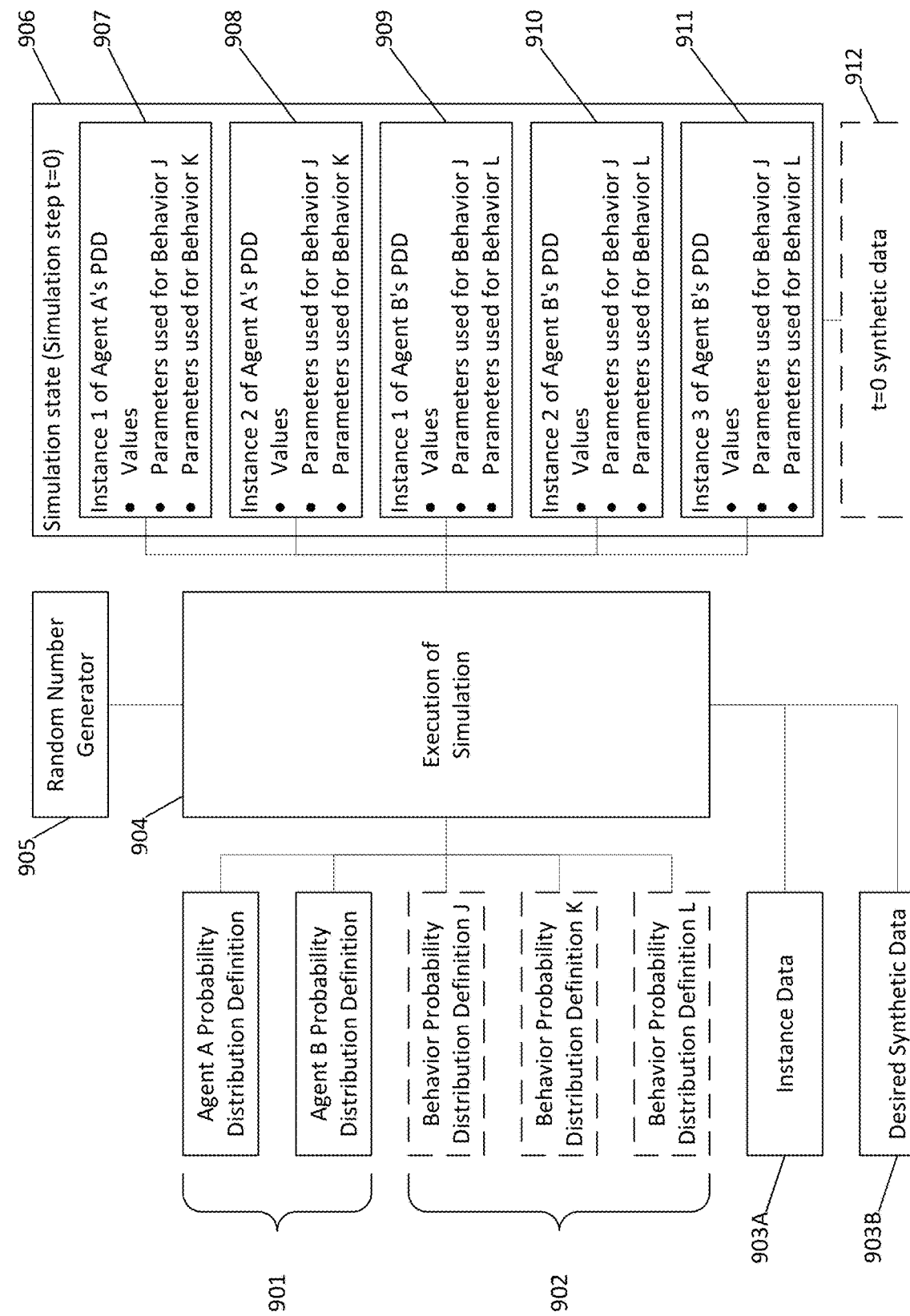
FIGS. 9A, 9B, 9C, and 9D depict state diagrams for conducting agent-based model simulations.

FIG. 9A includes agent probability distribution definitions 901 (for example, agent probability distribution definition A and agent probability distribution definition B) and behavior probability distribution definitions 902 (for example, behavior probability distribution definition J, behavior probability distribution definition K, and behavior probability distribution definition L). Data 903A relating to the quantity of instances per agent probability distribution definition and desired synthetic data 903 may also be available. The combination of agent probability distribution definitions 901, behavior probability distribution definitions 902 (if separate from 901), instance data 903A, and desired synthetic data 903B may collectively be the simulation specification. To create a simulation state to be used in the execution 904 of the simulation, the attributes of the agent probability distribution definitions 901 are sampled using a random number generator 905 for the quantity of instances identified in instance data 903A (e.g., two instances of agent probability distribution definition A and three instances of agent probability distribution definition B). The desired synthetic data 903B may also be used to create the simulation state. The output 906 of the simulation 904 is a collection of states of all instantiated agents (e.g., 5 instantiated agents) at an initial state. In the example of FIG. 9A, there was no previous running of the agent-based model and the time is represented as simulation step t=0.

The simulation state (simulation step t=0) 906 includes agent A1 907 representing a first instantiation of agent probability distribution definition A and containing values and parameters (e.g., parameters used for behavior J and parameters used for behavior K), agent A2 908 representing a second instantiation of agent probability distribution definition A and containing values and parameters (e.g., parameters used for behavior J and parameters used for behavior K), agent B1 909 representing a first instantiation of agent probability distribution definition B and containing values and parameters (e.g., parameters used for behavior J and parameters used for behavior L), agent B2 910 representing a second instantiation of agent probability distribution definition B and containing values and parameters (e.g., parameters used for behavior J and parameters used for behavior L), and agent B3 911 representing a third instantiation of agent probability distribution definition B and containing values and parameters (e.g., parameters used for behavior J and parameters used for behavior L). Synthetic data 912 may or may not be generated based on the simulated state (simulation step t=0). For example, because simulation state 906 is the first simulation step and may not always have sampled behaviors. Also, any synthetic data may be of little value and not saved and/or streamed to the user requesting the synthetic data. Alternatively, the synthetic data 912 may be provided as an initial generated dataset as desired.

Figure 9B:
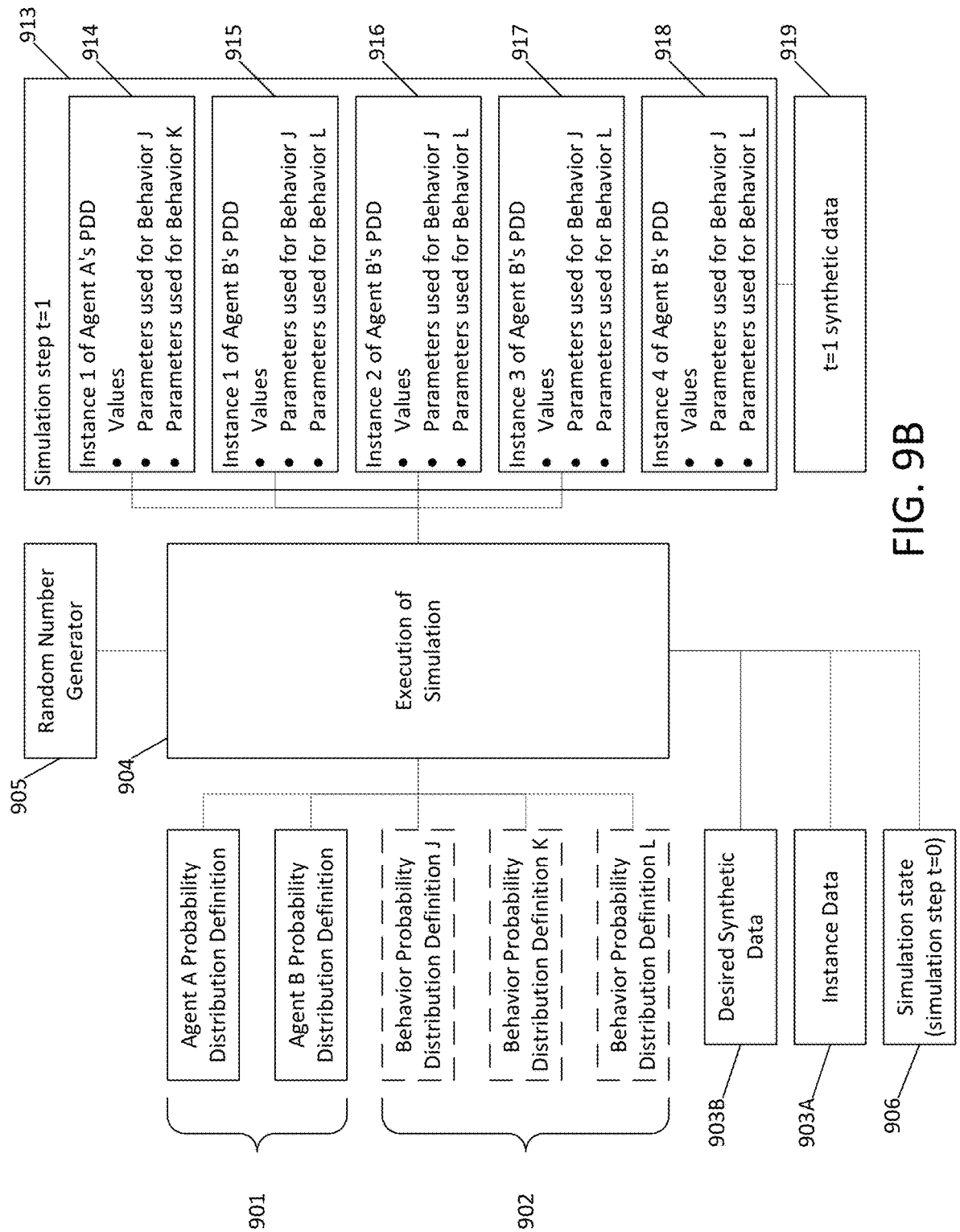

FIG. 9B shows the simulation for the next simulation step t=1. The agent probability distribution definitions 901, the behavior probability distribution definitions 902, the instance data 903A, the desired synthetic data 903B, and the states of the agents of simulation state (simulation step t=0) (represented as stimulation state 906) are used to simulate the next simulation step in the ABM. The simulation step t=1 913 includes agent A1 914 with its values and parameters J and K for t=1, agent B1 915 with its values and parameters J and L for t=1, agent B2 916 with its values and parameters J and L for t=1, agent B3 917 with its values and parameters J and L for t=1, and new agent B4 918 with its values and parameters J and L for t=1. In the simulation for t=1, agent A2 was removed and agent B4 was added. Agent B4 918 is the fourth instance of an agent based on the agent probability distribution definition B.

Synthetic data 919 may be generated based on the simulation step t=1. The synthetic data 919 may be stored and sent at a later time or streamed to the entity requesting the synthetic data.

Figure 9C:
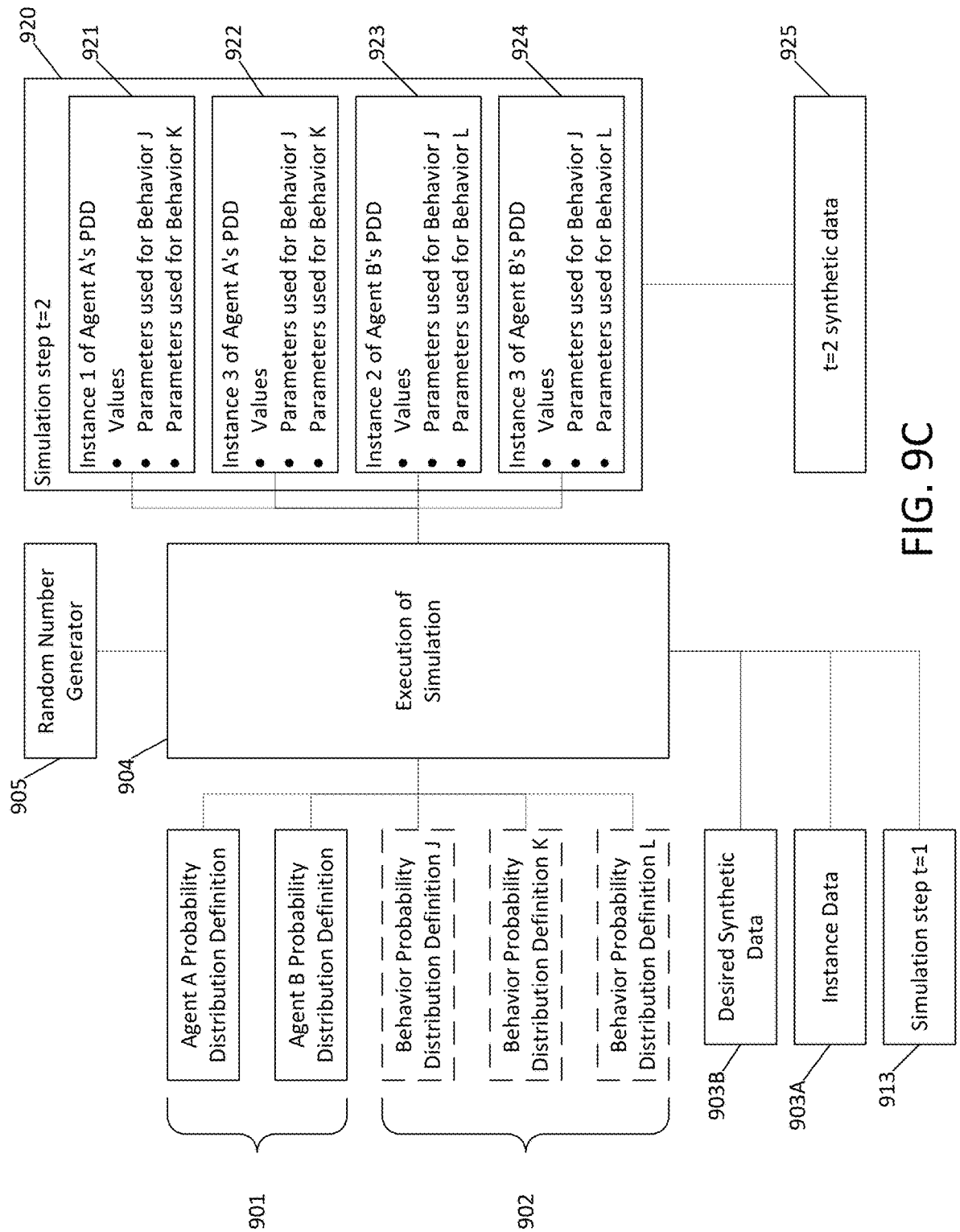

FIG. 9C shows the simulation for the next simulation step t=2. The agent probability distribution definitions 901, the behavior probability distribution definitions 902, the instance data 903A, the desired synthetic data 903B, and the states of the agents of simulation step t=1 (represented as stimulation state 913) are used to simulate the next step in the ABM. The simulation step t=2 920 includes agent A1 921 with its values and parameters J and K for t=2, new agent A3 922 with its values and parameters J and K for t=2, agent B2 923 with its values and parameters J and L for t=2, and agent B3 924 with its values and parameters J and L for t=2. In the simulation for t=2, agent A3 was added and agents B1 and B4 were removed. Agent A3 922 is the third instance of an agent based on the agent probability distribution definition B.

Synthetic data 925 may be generated based on the simulation step t=2. The synthetic data 925 may be stored and sent at a later time or streamed to the entity requesting the synthetic data.

Figure 9D:
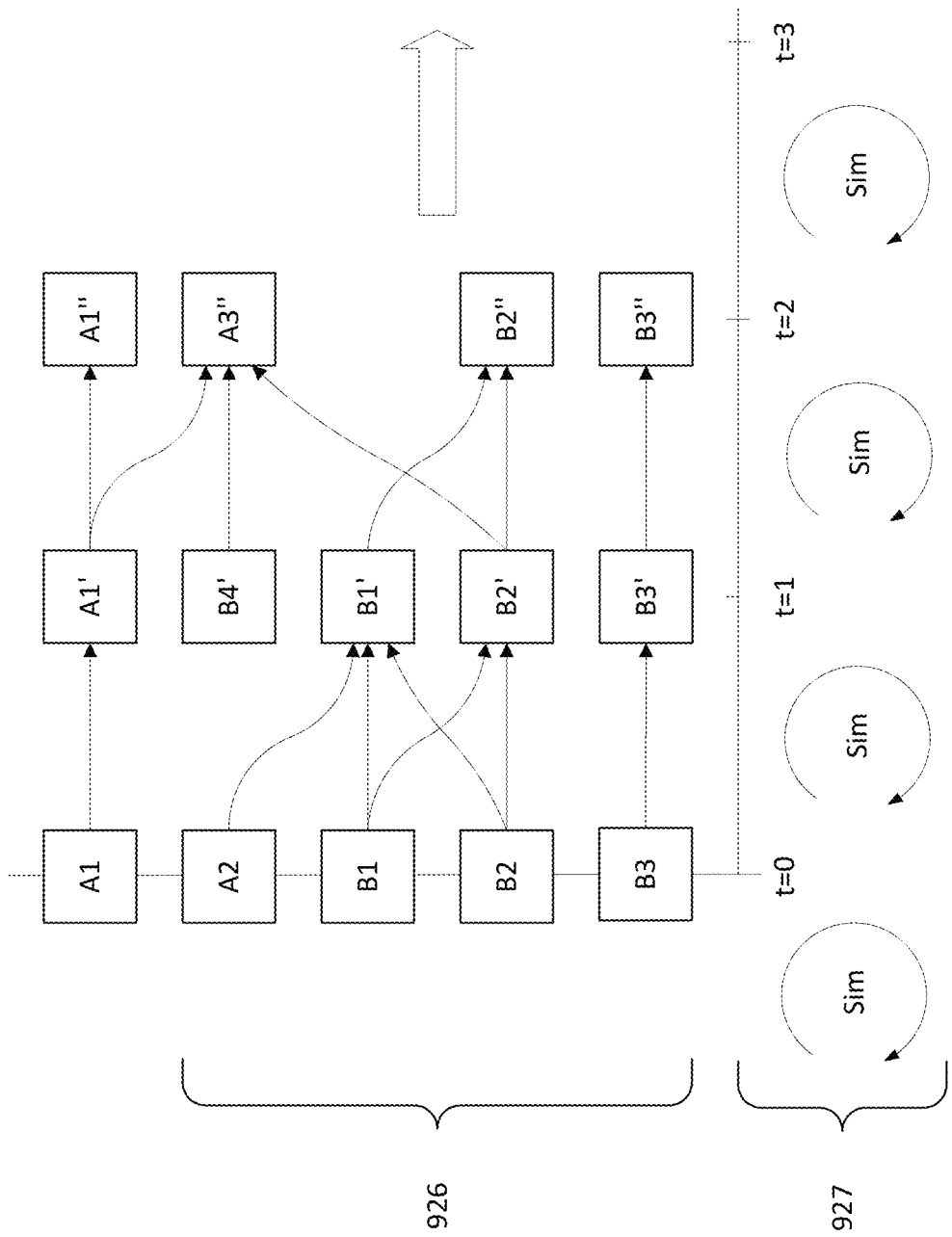

FIG. 9D depicts the agents 926 at simulation steps t=0, t=1, and t=2 with the iterative simulations 927. In FIG. 9D, relationships between various agent instances are shown. For example, at t=1, the state of agent instance A1' (the t=1 state of agent instance A1) is based on the t=0 simulation step of agent instance A1. The simulation step of agent instance B1' is based on the simulation step t=0 of agent instances A2, B1, and B2. The simulation step of agent instance B2' is based on the simulation step t=0 agent instances B1 and B2. The simulation step of agent instance B3' is based on the simulation step t=0 of agent instance B3. Next, at t=2, the simulation step of agent instance A1" (the simulation step t=2 of agent instance A1) is based on the simulation step t=1 of instance A1 (namely, instance A1'). The simulation step of agent B2" is based on the simulation step of agent instances B1' and B2'. The simulation step of agent instance B3' is based on the simulation step of agent B3. New agent instance A3" is based on the simulation step of instance A1', B2', and B4'.

Figure 10:
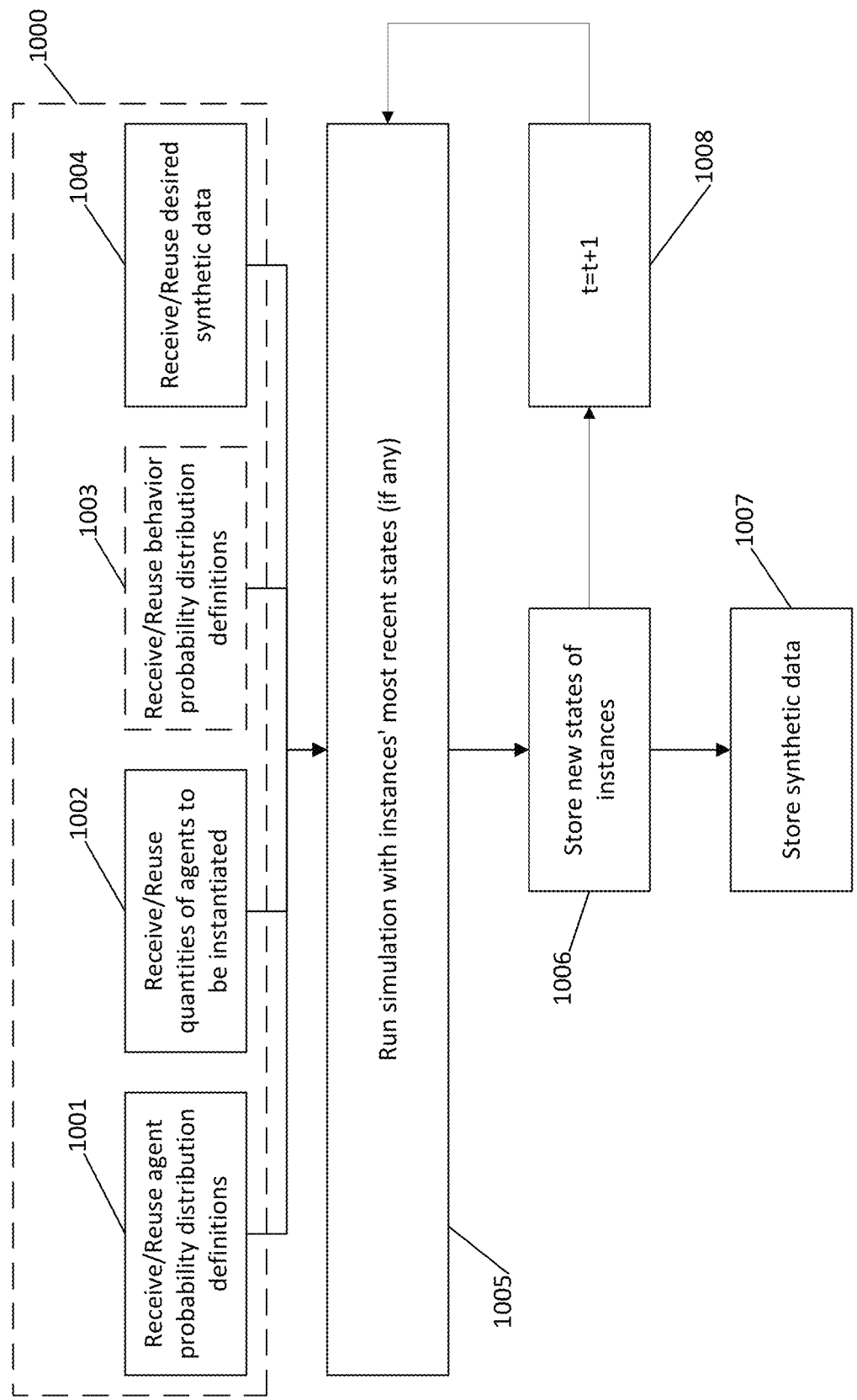
FIG. 10 depicts a flowchart of an execution of an agent-based model simulation.

FIG. 10 depicts a flowchart of an execution of an agent-based model simulation. In step 1000, simulation definition information and other information is retrieved. For example, in step 1001, agent probability distribution definitions are received. In step 1002, the quantities of agents to be instantiated per agent probability distribution definition is received. If specified separately from the agent probability distribution definitions, the behavior probability distribution definitions are received in step 1003. In step 1004, the desired fields for synthetic data are received. In step 1005, the simulation for the simulation state (simulation step t=0) is performed. As no previous simulation step exists, the simulation is performed based on the probability distribution definitions and other data of step 1000. In step 1006, the simulation state of the instantiated agents at simulation step t=0 is stored. If desired, synthetic data may be generated from the state of the instantiated agents at t=0 and stored in step 1007.

Additionally or alternatively, the simulation step may be incremented to the next time step (e.g., t=t+1) in step 1008 and the simulation executed again reusing the information obtained in step 1000 and the existing states of the agents at the simulation state (simulation step t=0). The process may repeat for a set number of iterations, until a given result is obtained (e.g., 30% home ownership), or the simulation reaches a steady state (no significant changes from a previous state—e.g., 99% of the collected states not changing between steps).

Figure 11:
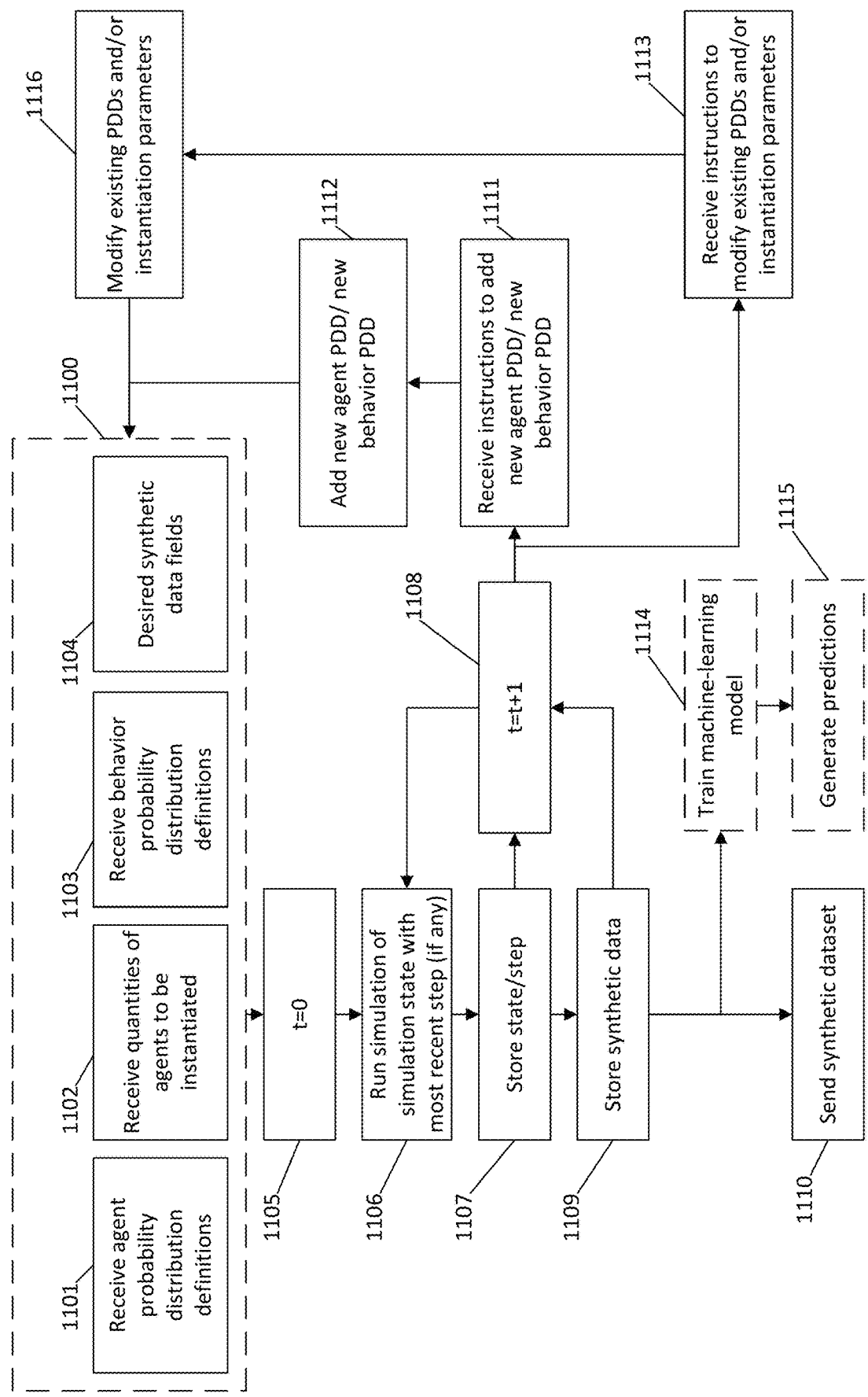
FIG. 11 depicts another example flowchart of an execution of an agent-based model simulation.

FIG. 11 depicts another example flowchart of an execution of an agent-based model simulation. In step 1100, simulation specification and other information is retrieved. For example, in step 1101, agent probability distribution definitions are received. In step 1102, the quantities of agents to be instantiated per agent probability distribution definition are received. If specified separately from the agent probability distribution definitions, the behavior probability distribution definitions are received in step 1103. In step 1104, the desired fields for synthetic data are received. In step 1105, time is set equal to zero (t=0) for the generation of the simulation state. In step 1106, the simulation specification 1100 is sampled to generate the simulation state. As no previous step of the simulation exists, the simulation state is generated based on the probability distribution definitions and other data of the simulation specification 1100. In step 1107, the simulation state of the instantiated agents is stored. If desired, synthetic data may be generated from the simulation state of the instantiated agents (simulation step t=0) and stored in step 1109.

Additionally or alternatively, a time step may be incremented to the next time step (e.g., t=t+1) in step 1108 and the simulation executed again, using the simulation specification information obtained in step 1100 and the simulation state of the instantiated agents from 1107. The process may repeat (next simulation steps) for a set number of iterations, until a given result is obtained (e.g., 30% home ownership), or the simulation reaches a steady state (no significant changes from a previous state—e.g., 99% of the collected states not changing between steps).

In step 1110, the stored synthetic dataset may be sent to a user. The generated predictions may be sent (e.g., to the above user or a different user) in step 1110. Alternatively or additionally, the synthetic dataset may be used to train a machine-learning model in step 1114 and the trained machine-learning model used to generate predictions in step 1115 based on new true-source data.

Alternatively or additionally, in step 1111, the system may receive instructions to add a new agent probability distribution definition and/or a new behavior probability distribution definition. In step 1112, the new agent and/or new behavior probability distribution definition may be added to the simulation specification 1100 for the new generation of a specification state.

Alternatively or additionally, in step 1113, instructions may be received to modify one or more existing agent probability distribution definitions and/or behavior probability distribution definitions and/or instantiation parameters and/or desired synthetic data fields. Based on the information received in step 1113, the corresponding agent probability distribution definitions and/or behavior probability distribution definitions and/or instantiation parameters and/or desired synthetic data fields are modified in step 1116 and the modified simulation specification 1100 used for generation of a new simulation state and subsequent simulation steps.

Figures 12A, 12B:
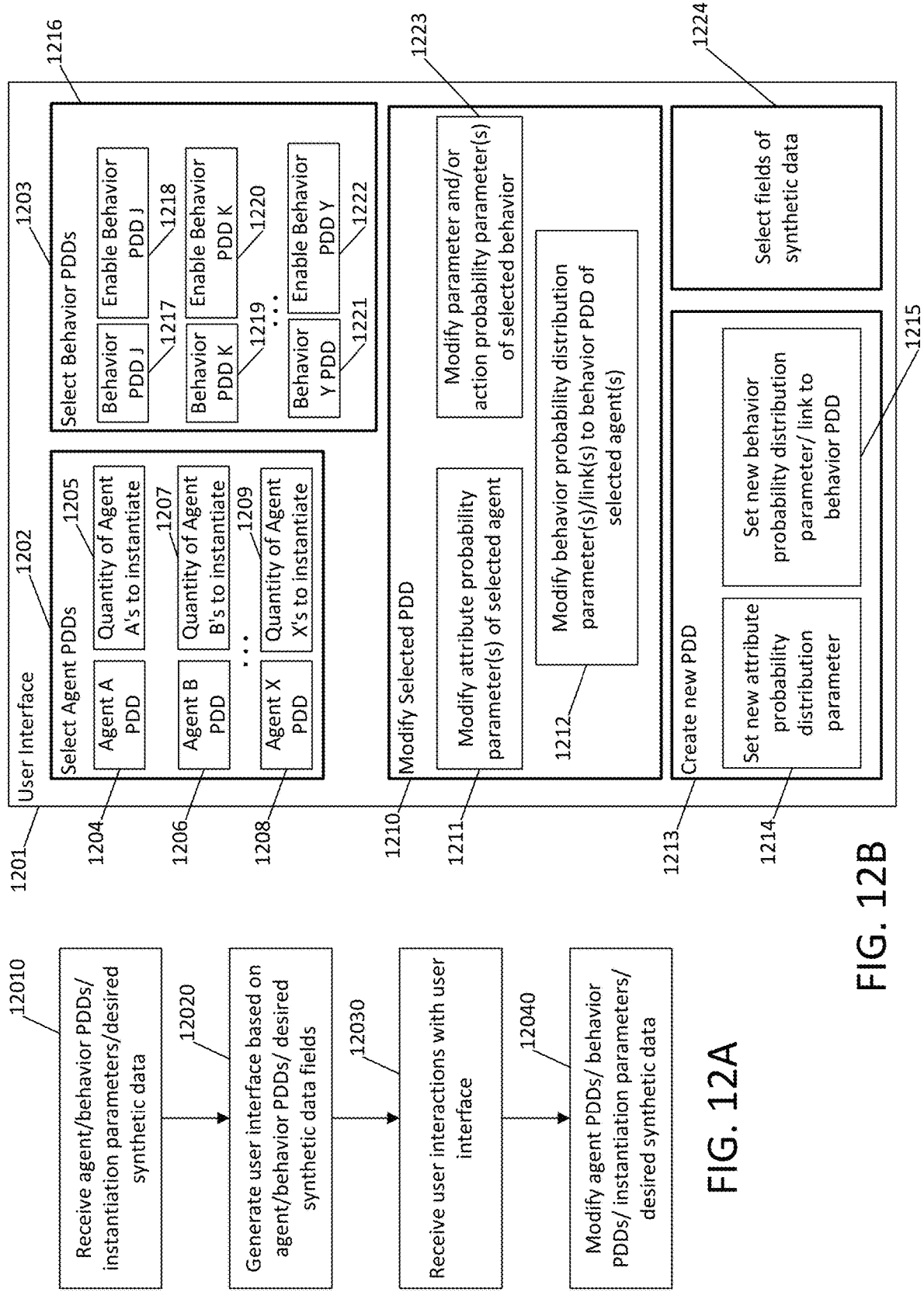
FIG. 12A depicts a flowchart of a process of modifying an agent-based model.
FIG. 12B depicts a user interface for modifying an agent-based model.

FIG. 12A depicts a flowchart of a process of modifying an agent-based model. In step 12010, agent/behavior probability distribution definitions and/or instantiation parameters and/or desired synthetic data fields are received. Based on the received information, a user interface is generated in step 12020. In step 12030, user interactions with the user interface are received. In step 12040, the agent/behavior probability distribution definitions and/or instantiation parameters and/or desired synthetic data fields are modified based on the user interactions of step 12030.

FIG. 12B depicts a user interface for modifying an agent-based model. The user interface 1201 may comprise a quantity of regions including a region 1202 permitting selection of an agent probability distribution definition (e.g., agent A probability distribution definition 1204, agent B probability distribution definition 1206, and agent X probability distribution definition 1208) and the quantity of instantiations for the selected agent probability distribution definition to be set (e.g., quantity of instantiations for agent A's probability distribution definition 1205, quantity of instantiations for agent B's probability distribution definition 1207, and/or quantity of instantiations for agent X's probability distribution definition 1209).

The user interface 1201 may comprise a region 1203 permitting selection of a behavior probability distribution definition and selectively enabling/disabling that behavior (e.g., region 1217 permitting selection of behavior probability distribution definition J and enable/disable region 1218, region 1219 permitting selection of behavior probability distribution definition K and enable/disable region 1220, and region 1221 permitting selection of behavior probability distribution definition Y and enable/disable region 1222).

The user interface 1201 may comprise a region 1210 permitting modification of a selected agent/behavior's probability distribution definition. Region 1210 may comprise a region 1211 for receiving a user's modification of an attribute parameter of the selected agent's probability distribution definition, a region 1212 for receiving the user's modification of a behavior probability distribution definition. Region 1212 may additionally or alternatively separately permit linking or breaking a link between the selected behavior probability distribution definition such that instantiated agents perform the linked behaviors during simulation. Further, where a behavior probability distribution definition comprises one or more parameters that define the behavior probability distribution definition or where each behavior probability distribution definition is comprised of separate actions (that collectively make up the behavior probability distribution definition), the user interface may further comprise a region 1223 that receives user input for modification of the action or the behavior parameter.

The user interface 1201 may further comprise a region 1213 for accepting user input for defining a new agent probability distribution definition. Region 1213 may comprise a region 1214 for receiving user input for setting a new attribute probability distribution parameter and a region 1215 for receiving user input for setting a new behavior probability distribution parameter and/or linking the new behavior probability distribution definition with an agent probability distribution definition. The user interface 1201 may further comprise a region 1224 for accepting user input for modifying the fields to be populated with synthetic data for a generated synthetic dataset.

Applications of the synthetic data generated by the ABM may include the generation of a dataset when there is no true-source data available. Some datasets of potential interest may not exist anywhere, or are not easily accessible. For example, data on customer behavior under different types of recessions does not exist for recession types that have not occurred. In those instances, to generate relevant data, the ABM may permit a user to simulate customers and simulate behaviors relevant to one or more recessions.

Alternatively or additionally, applications of the synthetic data generated by the ABM may include the simulation of rare events to augment an existing dataset. Sometimes data exists, but only in limited quantities. Some applications, training machine learning models for instance, require large amounts of data with enough examples for all possible events. Some events are rare because they are uncommon (rendering useless risk models based solely on actual data) or because they are expensive and they are to be found and prevented (e.g., customer fraud). In that situation, it may be beneficial to simulate different types of fraud (both factual synthetic datasets and counterfactual datasets) and add the fraud-related synthetic datasets to an existing dataset.

Alternatively or additionally, applications of the synthetic data generated by the ABM may include the generation of data with a distribution that changes over time. Most generative statistical and machine learning models assume that the data is identically and independently distributed. However, in reality that is rarely the case. For example, spending habits of an individual may vary seasonally, with technological innovation, with life stage, with advertising, and even with mood. Modeling each of these variations in spending habits in a mathematical model might be intractable. However, using an ABM, the variations in spending habits may be obtained by simulating probability distributions while enabling arbitrary complexity to be included in the definition of agents and/or behaviors, without having to specify how the model is executed.

Alternatively or additionally, applications of the synthetic data generated by the ABM may include the training of reinforcement learning agents in a realistic environment. Reinforcement learning agents that learn from interacting with their environment are particularly suited to learn from simulations. As reinforcement learning agents learn from interacting with their environment, increasing the size and complexity of their environment by including examples that rarely occur in the real world permits learning that would not otherwise be possible. One example may include a reinforcement learning agent that learns new ways to commit fraud in a simulation environment. This may allow a company's fraud team to predict potential new fraud vectors and prepare for them before they actually occur in real life.

Alternatively or additionally, applications of the synthetic data generated by the ABM may be used to define a granular model to explain some aggregate data. Sometimes, a dataset includes summary data, but users may need to understand from where the data originated. ABM simulations may provide the ability to identify the origin of the data by permitting the user to iterate over simple models, and gradually add complexity until the aggregate data matches the distribution of the original dataset. By the step-wise addition of complexity, the user learns how the aggregate data changes based on the user's changes.

As described herein, an ABM may define a simulation specification separately from the execution of the simulation. Further, a simulation definition language that enables the simulation of the ABM may use two monads: a simulation step sequencing monad and a probability distribution monad. The probability distribution monad permits one to compose probability distributions, enabling arbitrary complexity in the definition of agents and behaviors, without having to specify details regarding the execution of the simulation. For example, using two monads, the probability distribution monad may be used to compose distribution definitions, and the simulation monad may be used to compose simulation steps. This use of two monads may provide users the flexibility of a general-purpose language, while limiting them to only define a simulation and leaving the execution to the engine behind the simulation.

Thus, a computer-implemented method may receive a simulation specification comprising an agent having a probability distribution definition, the agent probability distribution definition comprising attribute probability distribution definitions and identifying one or more behaviors to be simulated; receive one or more instantiation parameters; generate, using the simulation specification, a simulation state of an agent-based model, the generate comprising instantiating, via sampling using a random number generator to sample probability distribution definitions of attributes of the agent probability distribution definition, an agent instance comprising first attributes; store the simulation state; simulate, based on the simulation state and the simulation specification, a simulation step comprising performing, via sampling using the random number generator to sample a probability distribution definition of the one or more behaviors associated with the agent instance, an action for the agent instance; store the simulation step; generate, based on the stored simulation step, a synthetic dataset; and output the synthetic dataset.

According to some aspects, the simulation specification may further comprise a second agent having a second agent probability definition comprising second attribute probability distribution definitions and identifying one or more second behaviors to be simulated, the generating the simulation state may further comprise instantiating, via sampling using the random number generator to sample the second attribute probability distribution definitions, a second agent instance comprising second attributes, and the simulating the simulation step may further comprise performing, via sampling using the random number generator to sample a second probability distribution definition of the one or more behaviors associated with the second agent instance, a second action for the second agent instance. The outputting may comprise training, based on the synthetic dataset, a predictive machine-learning model; and generating, using the trained predictive model, one or more predictions based on a true-source dataset. The method may further comprise receiving, before generating the simulation state of the agent-based model, an identification of synthetic data fields, wherein the storing the synthetic data is based on the identification of the synthetic data fields. The generating the synthetic dataset simulating may further comprise iteratively simulating additional simulation steps of the agent. The generating the synthetic dataset may be based on the additional simulation steps. The generated synthetic dataset may comprise synthetic data, of the agent instance, from two or more iterative simulation steps. The outputting may comprise streaming, per simulation step, the synthetic dataset. Additional instructions may be received to modify a quantity of the agent instances to be generated in the simulation state and the method may regenerate, based on the modified quantity of agent instances, the simulation state, and the regenerated simulation state may comprise a count of agent instances corresponding to the received modified quantity. The performing the action for the agent instance may further comprise performing, via sampling using the random number generator to sample the probability distribution definition of the one or more behaviors associated with the agent instance and via sampling using the random number generator to sample a second probability distribution definition of a second behavior associated with a second agent instance, the action for the agent instance.

The method may further comprise iteratively simulating, based on simulation step and the simulation state, additional simulation steps, wherein, in the additional simulation steps, a second agent instance may be instantiated. The agent probability distribution definition may comprise a probability monad, the probability monad may comprise attribute probability monads, and the probability monad may be a complex probability distribution composed of attribute probability distributions of the attribute probability monads. The simulating the agent-based model may comprise a simulation monad, the simulation monad may comprise behavior probability monads, and the simulation monad may be a complex probability distribution composed of behavior probability distributions of the behavior probability monads. The behavior may comprise one or more actions that may comprise action probability distributions. The behavior may be a complex probability distribution composed of the action probability distributions. The one or more of the agent instance's attributes may comprise an attribute value used in performing the action. The agent's attributes may comprise an attribute probability distribution, and the performing the action may comprise sampling, using the random number generator, the attribute probability distribution.

The method may further comprise causing display of a graphical interface of the agent-based model, wherein the graphical interface is configured to display the agent's probability distribution definitions and the one or more behaviors; receiving user interactions with the graphical interface, wherein the user interactions are to modify a specific attribute of the agent or a specific behavior of the agent; and modifying, based on the received user interactions, the agent's probability distribution definition; storing, as part of the simulation specification, the modified agent's probability distribution definition, wherein generating the simulation state further comprises generating, using the simulation specification with the modified agent's probability distribution definition, the simulation state.

An apparatus may comprise one or more processors; and memory storing instructions that, when executed by the one or more processors, cause the apparatus to receive a simulation specification comprising an agent having a probability distribution definition, the agent probability distribution definition comprising attribute probability distribution definitions and identifying one or more behaviors to be simulated; cause display of a graphical interface of the agent-based model, wherein the graphical interface is configured to display the agent's probability distribution definitions and the one or more behaviors; receive user interactions with the graphical interface, wherein the user interactions are to modify a specific attribute of the agent or a specific behavior of the agent; modify, based on the received user interactions, the agent's probability distribution definition; store, as part of the simulation specification, the modified agent's probability distribution definition; receive one or more instantiation parameters; generate, using the simulation specification, a simulation state of an agent-based model, the generating comprising instantiate, via sampling using a random number generator to sample probability distribution definitions of attributes of the agent probability distribution definition, an agent instance comprising first attributes; store the simulation state; simulate, based on the simulation state and the simulation specification, a simulation step comprising perform, via sampling using the random number generator to sample a probability distribution definition of the one or more behaviors associated with the agent instance, an action for the agent instance; store the simulation step; generate, based on the stored simulation step, a synthetic dataset; and output the synthetic dataset. The instructions to output the synthetic dataset may further cause the apparatus to stream the synthetic dataset.

One or more non-transitory media storing instructions that, when executed by one or more processors, may cause the one or more processors to perform steps comprising receiving a simulation specification comprising an agent having a probability distribution definition, the agent probability distribution definition comprising attribute probability distribution definitions and identifying one or more behaviors to be simulated; receiving one or more instantiation parameters; generating, using the simulation specification, a simulation state of an agent-based model, the generating comprising instantiating, via sampling using a random number generator to sample probability distribution definitions of attributes of the agent probability distribution definition, an agent instance comprising first attributes; storing the simulation state; simulating, based on the simulation state and the simulation specification, a simulation step comprising performing, via sampling using the random number generator to sample a probability distribution definition of the one or more behaviors associated with the agent instance, an action for the agent instance; storing the simulation step; generating, based on the stored simulation step, a synthetic dataset; and outputting the synthetic dataset, wherein the agent probability distribution definition comprises a probability monad, wherein the probability monad comprises attribute probability monads, wherein the probability monad is a complex probability distribution composed of attribute probability distributions of the attribute probability monads, wherein simulating the agent-based model comprises a simulation monad, wherein the simulation monad comprises behavior probability monads, and wherein the simulation monad is a complex probability distribution composed of behavior probability distributions of the behavior probability monads.

A computer-implemented method may comprise receiving a simulation specification comprising an agent having a probability distribution definition, the agent probability distribution definition comprising attribute probability distribution definitions and identifying one or more behaviors to be simulated; receiving one or more instantiation parameters; generating, using the simulation specification, a simulation state of an agent-based model, the generating comprising instantiating, via sampling using a random number generator to sample probability distribution definitions of attributes of the agent probability distribution definition, an agent instance comprising first attributes; storing the simulation state; simulating, based on the simulation state and the simulation specification, a simulation step comprising performing, via sampling using the random number generator to sample a probability distribution definition of the one or more behaviors associated with the agent instance, an action for the agent instance; storing the simulation step; generating, based on the stored simulation step, a synthetic dataset; and outputting the synthetic dataset.

The simulation specification further may comprise a second agent having a second agent probability definition comprising second attribute probability distribution definitions and identifying one or more second behaviors to be simulated. The generating the simulation state further may comprise instantiating, via sampling using the random number generator to sample the second attribute probability distribution definitions, a second agent instance comprising second attributes. The simulating the simulation step further may comprise performing, via sampling using the random number generator to sample a second probability distribution definition of the one or more behaviors associated with the second agent instance, a second action for the second agent instance. The outputting may comprise training, based on the synthetic dataset, a predictive machine-learning model; and generating, using the trained predictive model, one or more predictions based on a true-source dataset. The method may further comprise receiving, before generating the simulation state of the agent-based model, an identification of synthetic data fields, wherein storing the synthetic data may be based on the identification of the synthetic data fields. The generating the synthetic dataset simulating further may comprise iteratively simulating additional simulation steps of the agent. The generating the synthetic dataset may be based on the additional simulation steps.

The generated synthetic dataset may comprise synthetic data, of the agent instance, from two or more iterative simulation steps. The outputting may comprise streaming, per simulation step, the synthetic dataset. The method may further comprise receiving instructions to modify a quantity of the agent instances to be generated in the simulation state; and regenerating, based on the modified quantity of agent instances, the simulation state. The regenerated simulation state may comprise a count of agent instances corresponding to the received modified quantity. The performing the action for the agent instance further may comprise performing, via sampling using the random number generator to sample the probability distribution definition of the one or more behaviors associated with the agent instance and via sampling using the random number generator to sample a second probability distribution definition of a second behavior associated with a second agent instance, the action for the agent instance. The method may further comprise iteratively simulating, based on simulation step and the simulation state, additional simulation steps. A second agent instance may be instantiated.

The agent probability distribution definition may comprise a probability monad, the probability monad may comprise attribute probability monads, and the probability monad may be a complex probability distribution composed of attribute probability distributions of the attribute probability monads. The simulation of the agent-based model may comprise a simulation monad, the simulation monad may comprise behavior probability monads, and the simulation monad may be a complex probability distribution composed of behavior probability distributions of the behavior probability monads. The behavior may comprise one or more actions, the one or more actions may comprise action probability distributions, and the behavior may be a complex probability distribution composed of the action probability distributions.

The agent instance's attributes may comprise an attribute value used in performing the action. The agent's attributes may comprise an attribute probability distribution. The performing the action further may comprise sampling, using the random number generator, the attribute probability distribution. The method may further comprise causing display of a graphical interface of the agent-based model, wherein the graphical interface may be configured to display the agent's probability distribution definitions and the one or more behaviors; receiving user interactions with the graphical interface, wherein the user interactions may be to modify a specific attribute of the agent or a specific behavior of the agent; and modifying, based on the received user interactions, the agent's probability distribution definition; storing, as part of the simulation specification, the modified agent's probability distribution definition, wherein generating the simulation state further may comprise generating, using the simulation specification with the modified agent's probability distribution definition, the simulation state.

In accordance with other embodiments, an apparatus may comprise one or more processors; and memory storing instructions that, when executed by the one or more processors, cause the apparatus to receive a simulation specification comprising an agent having a probability distribution definition, the agent probability distribution definition comprising attribute probability distribution definitions and identifying one or more behaviors to be simulated; cause display of a graphical interface of the agent-based model, wherein the graphical interface may be configured to display the agent's probability distribution definitions and the one or more behaviors; receive user interactions with the graphical interface, wherein the user interactions may be to modify a specific attribute of the agent or a specific behavior of the agent; modify, based on the received user interactions, the agent's probability distribution definition; store, as part of the simulation specification, the modified agent's probability distribution definition; receive one or more instantiation parameters; generate, using the simulation specification, a simulation state of an agent-based model, the generating comprising instantiate, via sampling using a random number generator to sample probability distribution definitions of attributes of the agent probability distribution definition, an agent instance comprising first attributes; store the simulation state; simulate, based on the simulation state and the simulation specification, a simulation step comprising perform, via sampling using the random number generator to sample a probability distribution definition of the one or more behaviors associated with the agent instance, an action for the agent instance; store the simulation step; generate, based on the stored simulation step, a synthetic dataset; and output the synthetic dataset. The instructions to output the synthetic dataset may cause the apparatus to stream the synthetic dataset.

In accordance with further embodiments, one or more non-transitory media storing instructions that, when executed by one or more processors, may cause the one or more processors to perform steps comprising receiving a simulation specification comprising an agent having a probability distribution definition, the agent probability distribution definition comprising attribute probability distribution definitions and identifying one or more behaviors to be simulated; receiving one or more instantiation parameters; generating, using the simulation specification, a simulation state of an agent-based model, the generating comprising instantiating, via sampling using a random number generator to sample probability distribution definitions of attributes of the agent probability distribution definition, an agent instance comprising first attributes; storing the simulation state; simulating, based on the simulation state and the simulation specification, a simulation step comprising performing, via sampling using the random number generator to sample a probability distribution definition of the one or more behaviors associated with the agent instance, an action for the agent instance; storing the simulation step; generating, based on the stored simulation step, a synthetic dataset; and outputting the synthetic dataset. The agent probability distribution definition may comprise a probability monad. The probability monad may comprise attribute probability monads. The probability monad may be a complex probability distribution composed of attribute probability distributions of the attribute probability monads. The simulation of the agent-based model may comprise a simulation monad. The simulation monad may comprise behavior probability monads. The simulation monad may be a complex probability distribution composed of behavior probability distributions of the behavior probability monads.

Generation of Secure Synthetic Data Based on True-Source Datasets

In some scenarios, true-source data may exist but making the true-source data available may be prohibited by law and/or by corporate policies. For example, the Health Insurance Portability and Accountability Act of 1996 (HIPAA) establishes, in the United States, a set of national standards for the protection of certain health information. A developer, seeking to train a machine learning model based on HIPAA-covered, medical record datasets, may be prevented from accessing the data required to train the model. Similarly, another developer, seeking to model a database for storing financial-related data may be prevented, by existing banking regulations, from obtaining individuals' financial data.

To properly analyze or model datasets containing sensitive data and/or train machine learning models based on the datasets containing sensitive data, some approaches have attempted to create synthetic datasets based on the actual datasets using anonymized data created by character substitution. However, mere substitution of characters may disturb the statistical parameters and/or correlation parameters of the real data and provide faulty results (having been improperly analyzed, improperly modeled, or improperly trained).

One or more aspects of the disclosure relate to generating synthetic data from true-source data using two machine-learning models. The first machine learning model may categorize fields of the true-source dataset by allowing the application to replace the values in identified sensitive fields with randomized data that still follows the same syntax structure as the original true-source dataset, and output a scrubbed dataset (a scrubbed dataset). The second machine learning model may determine statistical parameters of the fields of the first scrubbed dataset and determine correlations between the fields of the first synthetic dataset. The second machine learning model may next generate a synthetic dataset based on the learned statistical properties, probabilities, distributions, and relationships as the original, true-source dataset.

Benefits of using this approach may include allowing developers to interact with realistic synthetic data that does not risk exposing sensitive customer or company data, thereby protecting customers' privacy (e.g., health-related privacy concerns and banking-related privacy concerns). Also, by using two models, a first to scrub true-source data and a second to create synthetic data from the scrubbed, true-source data, the developers may obtain synthetic data that would otherwise take weeks or months to obtain due to permission issues or the true-source data being wholly unavailable. Further, by allowing developers to use synthetic data constructed from true-source data, an internal investment in tokenizing true-source data (where access to source customer records may be needed by customers during some situations) for use by the developers may be reduced, thereby permitting customers data to be further protected from inadvertent disclosure issues or disclosure through forensic data analysis (e.g., frequency analysis attacks on scrubbed data to find correlations and most likely candidates).

In one or more examples, the two machine learning models may be a cloud-deployed service that generates realistic synthetic data on demand that matches one or more of statistical probabilities, distributions, or dependencies in real data but does not contain any real records or customer information, thereby protecting customer privacy and an institution's sensitive data without requiring significant manual operation. This statistically relevant synthetic data is valuable by providing access to realistic synthetic data where the true-source data is unavailable or inaccessible. A probabilistic graphical model (PGM) may be used for one or more of the models. In addition, the PGMs may be deployed as a cloud-based microservice to query a source dataset, remove sensitive customer information, automatically train a machine-learning model, and generate synthetic data while minimizing required input from users, thereby increasing the security of the service and reducing the risk of data exposure. For example, the synthetic data is de-identified and anonymized such that recreating the true-source data is effectively impossible by reviewing the synthetic data. Additionally or alternatively, another approach may include users to view and tune parameters of the synthetic data generation model (e.g., a PGM or other model).

Figure 13:
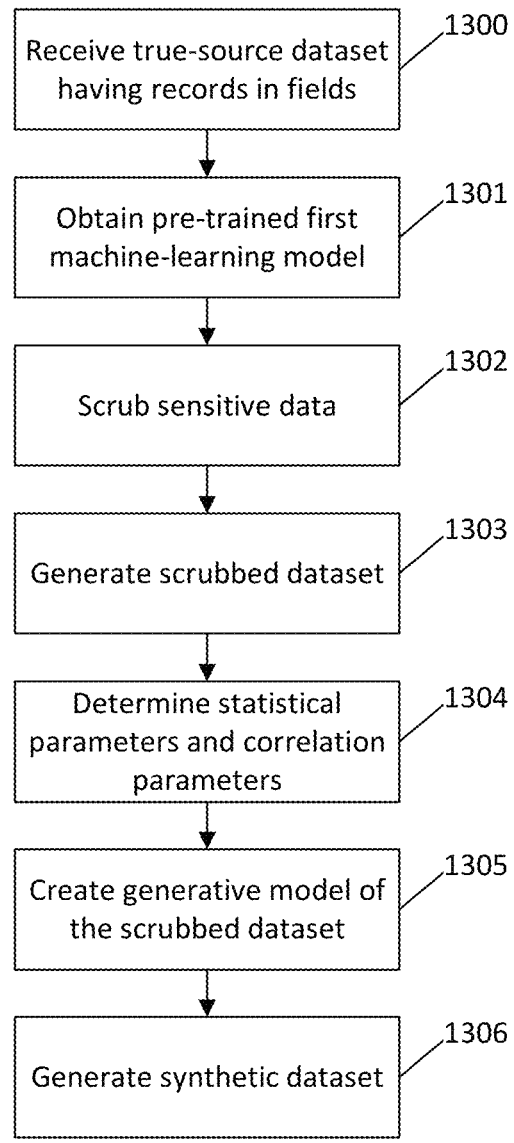
FIG. 13 depicts a flow chart for a method of training a model based on true-source data.

FIG. 13 depicts a flow chart for a method of training a model based on true-source data. In step 1300, a true-source dataset is received. The starting of the process may be based on a request from a user or system desiring a synthetic dataset. The true-source dataset may be uploaded by the user or system or may be obtained from a remote user or system. By permitting a user or system to upload its own datasets, the process of FIG. 13 may provide a dataset cleaning service for that user or system, thereby permitting specific datasets to be filtered and/or selected after being uploaded as part of step 1300 but before the machine-learning model is trained to generate the synthetic data. Alternatively or additionally, by permitting a user or system to merely request a dataset, step 1300 provides another level of protection of disclosure of sensitive data by having step 1300 find and obtain datasets without exposing the true-source datasets to the requesting user. The true-source dataset may comprise a plurality of records, with data of the records arranged in various fields.

A previously-trained machine learning model may be obtained in step 1301. An example of a previous-trained machine learning model for scrubbing datasets may be found in U.S. Ser. No. 16/151,385, filed Oct. 4, 2018, now U.S. Pat. No. 10,460,235, to Truong et al. entitled "Data Model Generation Using Generative Adversarial Networks", whose contents is expressly incorporated herein by reference. For example, a previously-trained machine learning model may, in step 1301, may read and suggest labels for the fields of the retrieved dataset (retrieved in step 1300). The labels may identify fields as relating to various content, of which labels may include one or more of persons' names, email addresses, physical addresses, city, state, ZIP Codes, country codes, credit card numbers, Social Security numbers, drivers' license numbers, other identifying numbers, telephone numbers, internet addresses (e.g., IPV4, IPV6), uniform resource locators (URLs), dates, times, combinations of dates and time, months, integers, FICO scores (i.e., a score based on a model provided by the Fair, Isaac, and Company), random data, and noise.

Some fields of the retrieved dataset may already be identified as containing sensitive information (e.g., a field of data with a field header of "SSN" or "Social Security Number" or "Address"). Additionally or alternatively, fields having pre-assigned labels may nonetheless be separately scanned to determine whether any sensitive information is in the fields and then the fields may be appropriately labeled (if needing a different label). This permits the fields to be appropriately labeled even where the fields included headers suggesting that the contents were something else (e.g., where a "Transaction Date" field included both a date when transaction occurred and an account number of the individual, that field may relabeled as "Account Number", "Transaction Date & Account Number", or "Sensitive" meaning at least some sensitive information may be included in data in the field). Further, a user (with appropriate credentials) may be permitted to override the labeling results (e.g., to designate a field as containing sensitive information where it was previously identified not to contain sensitive information) for finer control of the labeling process. Once the data fields have been labeled, the true-source data may be scrubbed in step 1302, to selectively replace the content of fields based on the labels of the fields. For instance, fields having been labeled with labels identifying sensitive information (e.g., names, addresses, account numbers, etc.) may be replaced with a contextually similar alternative value that follows the same schema as the source field. The replacement technique may be the same for all fields having been labeled with a label identifying the field as containing sensitive information. Alternatively (as described with respect to FIG. 14), the replacement may vary between semantic and syntactic approaches. Additionally or alternatively, questionable fields may be flagged during one or more of steps 1301 or 1302 that request review of fields that are not adequately classifiable as containing sensitive information or containing no sensitive information. Additionally or alternatively, in step 1302, users may be permitted to manually set data types and/or scrubbing policy. In step 1303, a scrubbed dataset may be generated.

In step 1304, statistical parameters and correlation parameters may be determined for the fields in the scrubbed dataset. Using, for instance, the modeling technique described with respect to FIGS. 3-7, a machine learning model evaluates the scrubbed true-source data to learn its patterns and distributions both within a field and by evaluating dependencies across fields (for example, income may be influenced by age). Using the ability to determine correlations between fields of steps 303 and/or 403, dependencies between various fields may be determined. Based on those dependencies, the relationships between the fields may be mapped within the dataset to improve the accuracy of the output. The output of this process is a generative model (step 1305) that generates realistic generated datasets similar to the scrubbed true-source dataset and may be used to generate synthetic data that follows the distributions of that scrubbed data. The generative model may comprise a probabilistic graphical model (PGM), an agent-based model (ABM), or other generative model.

In step 1306, based on the generative model created in step 1305, a synthetic dataset is generated. The synthetic dataset follows the patterns of the true-source data by calling the generative model to generate synthetic data. The quantity of records generated may be arbitrarily large and is not limited on the volume of available true-source data. Because this data was generated to match patterns rather than being based on real transactions or records, it should not contain any real customer information or sensitive business data in it, but will still match the distributions and patterns of the scrubbed, true-source data. This synthetic data may then be passed back to the user or application requesting it for display or usage as required for the given use case. Additionally or alternatively, the data may be checked by the user or another entity and flagged where, for instance, any true-source data is found (e.g., un-tokenized credit card numbers) or any datasets whose expected columns (based on, for example, an enterprise data management tool registration) do not match actual columns observed (referred to as schema drift).

The process may be deployed as an automatic process with no user intervention. Alternatively, the process may be deployed to include user and/or technician's interactions to review field categorizations (or other items for review) and where users are able to manually tune one or more of data categorization, scrubbing, dependencies, or distributions to obtain the desired synthetic data.

Further controls may be placed on the source data from step 1301 to limit the volume of source data obtained from the data source. For example, to reduce the risk of the true-source data from step 1300 being exposed, the true-source dataset and the scrubbed dataset may be deleted after the creation of the generative model of step 1305. Further, to keep the generative model of step 1305 current to constantly changing true-source data, the generative model of step 1305 and any generated synthetic dataset from step 1306 may be deleted after a short time (e.g., from one or two days to two weeks or later as desired) after creation. Additionally or alternatively, a whitelist of fields that should not be scrubbed may also be used. The use of the whitelist in step 1301 to prevent scrubbing of specific fields may permit a finer-grained recognition of which fields are sensitive and those that are not sensitive, to allow the values in those non-sensitive fields to pass through to the scrubbed version of data, increasing the realism of the scrubbed data, the generative model, and finally the generated datasets.

Figure 14:
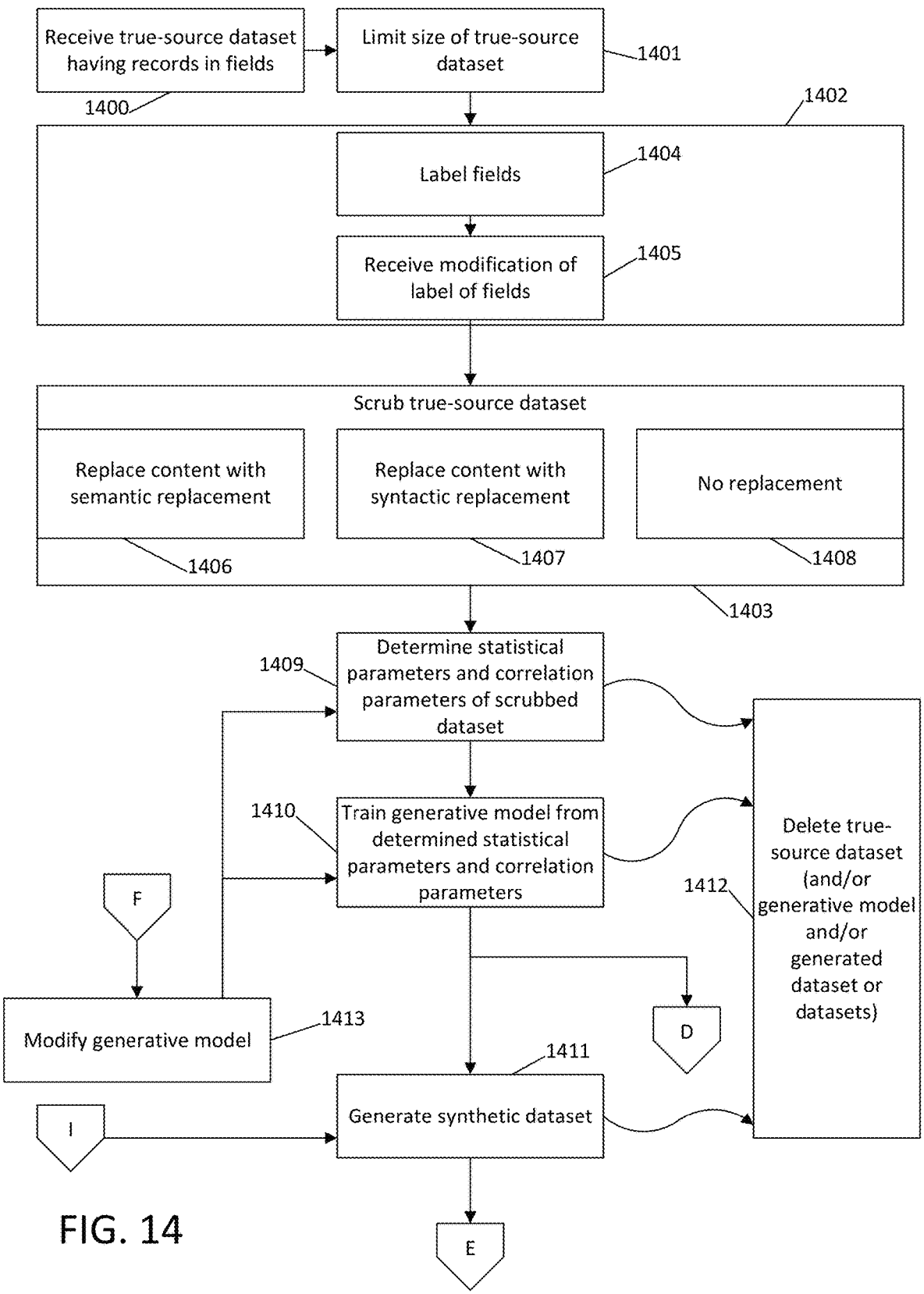
FIGS. 14-16 depict flow charts for a method of training a model based on true-source data of FIG. 13 with additional steps.
Figure 15:
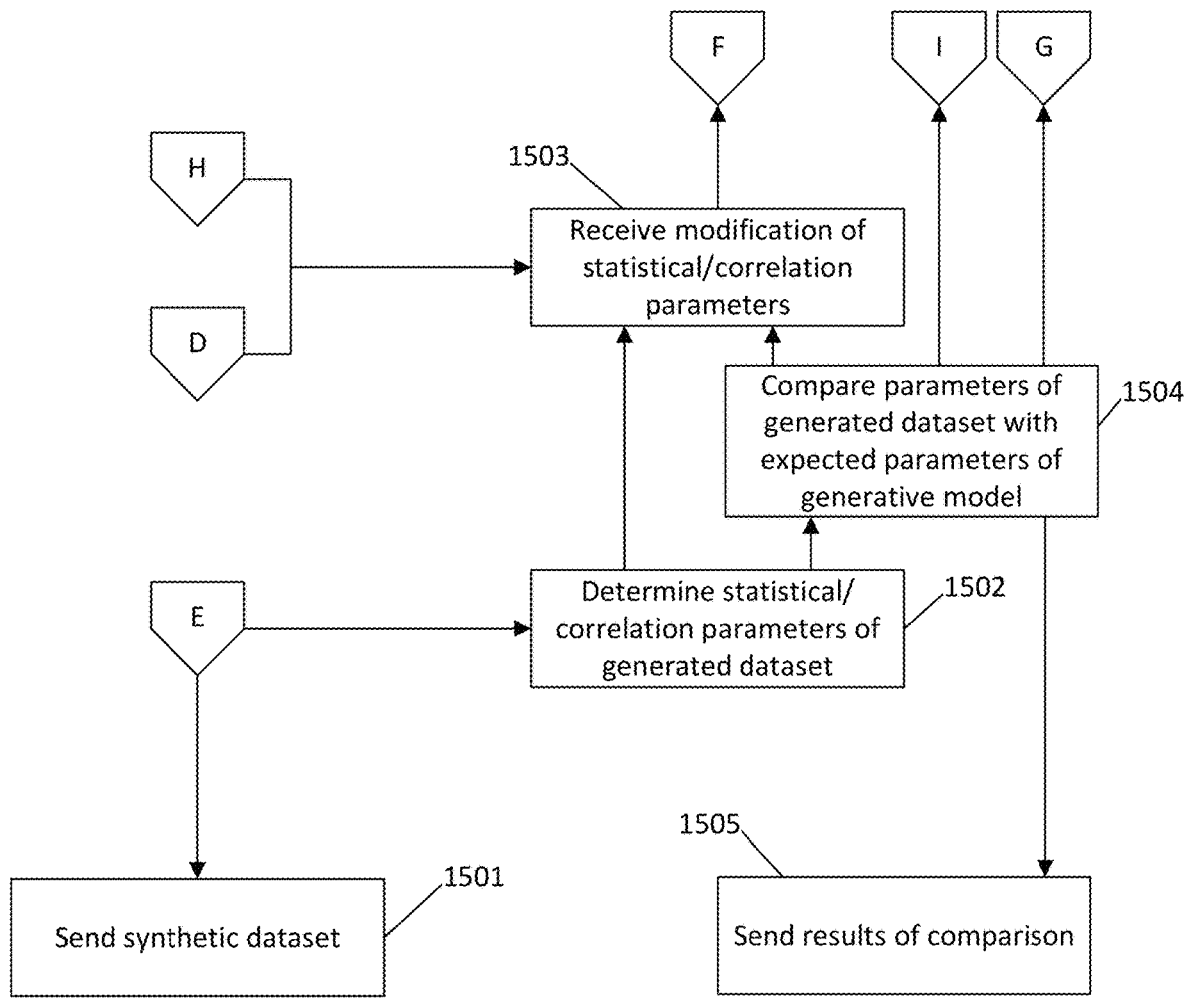
Figure 16:
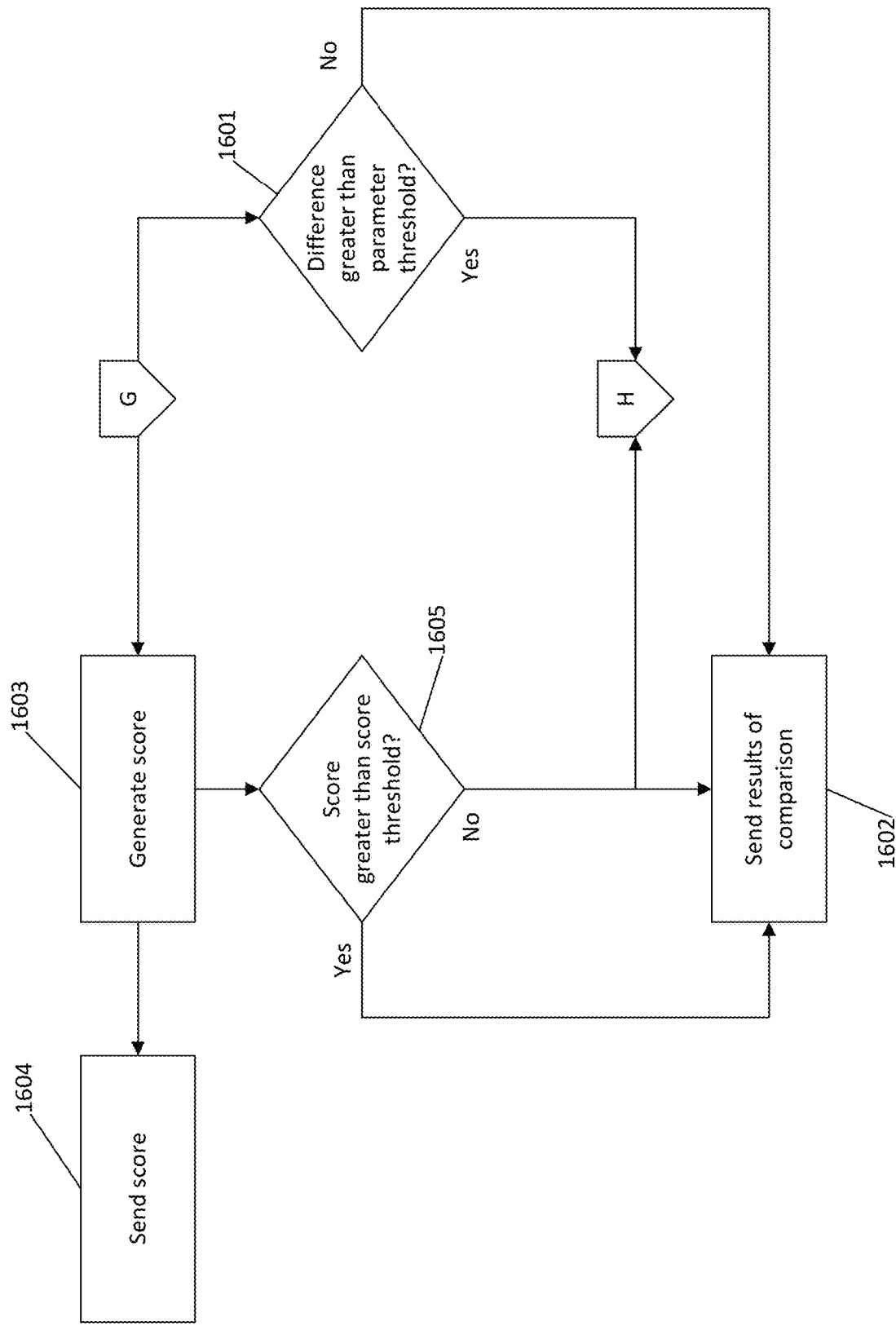

FIGS. 14-16 depict flow charts for a method of training a model based on true-source data of FIG. 13 with additional steps. In step 1400, a true-source dataset is received. The starting of the process may be based on a request from a user or system desiring a synthetic dataset. The true-source dataset may be uploaded by the user or system or may be obtained from a remote user or system. By permitting a user or system to upload its own datasets, the process of FIG. 14 may provide a dataset cleaning service for that user or system, thereby permitting specific datasets to be filtered and/or selected after being uploaded as part of step 1400 but before the training of the machine-learning model. Alternatively or additionally, by permitting a user or system to merely request a dataset, step 1400 provides another level of protection of disclosure of sensitive data by having step 1400 find and obtain datasets without exposing the datasets to the requesting user. The true-source dataset may comprise a plurality of records, with data of the records arranged in various fields.

In step 1401, the size of the true-source data set may be limited. This may be achieved by monitoring the size of the received true-source dataset and, upon reaching a cap, deleting data received above that cap. Additionally or alternatively, the size of received true-source dataset may be determined before being received and datasets above the cap may be refused. Additionally or alternatively, the full size true-source dataset may be sampled to comport with the size limit in step 1401.

In step 1402, the fields of the true-source dataset may be labeled to permit scrubbing of sensitive information in step 1403. For example, step 1402 may comprise reading and labeling the fields of the true-source dataset (step 1404). The labels may identify which fields contain sensitive customer information. For example, one or more of the following classifications may be available for sensitive fields: names, email addresses, physical addresses, credit card numbers, and Social Security Numbers. Some fields of the retrieved dataset may already be identified as containing sensitive information (e.g., a field of data with a field header of "SSN" or "Social Security Number" or "Address"). Additionally or alternatively, the fields may be separately scanned to determine whether any sensitive information is in the fields and then the fields may be appropriately labeled. This permits the fields to be labeled even where the field headers were not previously designated as having sensitive information. The fields may be scanned and labels may be applied by a previously-trained machine learning model. Additionally or alternatively, a user (with appropriate credentials) may be permitted (in step 1405) to override the labeling results (e.g., to designate a field as containing sensitive information where it was previously identified not to contain sensitive information) for finer control of the labeling process. An example of a previous-trained machine learning model for labeling fields may be found in U.S. Ser. No. 16/151,385, filed Oct. 4, 2018, now U.S. Pat. No. 10,460,235, to Truong et al. entitled "Data Model Generation Using Generative Adversarial Networks", whose contents are expressly incorporated herein by reference. Some of the labels may designate fields as having identified sensitive information (e.g., all social security numbers, all zip codes, etc.) or as having expected sensitive fields but suspected of having sensitive information (numbers, known alpha-numeric patterns). For instance, based on the labels of some fields, the data in those fields may be treated differently from data in other fields. For fields 1406 containing sensitive information and being an identified type (e.g., names, addresses, zip codes, social security numbers, states, etc.), the data in those fields may be scrubbed by replacing the content with semantically similar data from one or more tables or from one or more lists of the semantically similar data (e.g., for example, replacing a first name with a random name from a list of first names, where the random name was chosen via a random number generator). For fields 1407 containing what is believed to be sensitive information but not necessarily of an identified type (e.g., account numbers, other number strings, etc.), the scrubbing of those fields may comprise replacing each character with syntactically similar character (e.g., replacing alphabetical characters with a random alphabetical character and replacing a number character with a random number character). Symbol characters may be replaced with a random symbol character or may permitted to remain unchanged. For fields 1408 containing what is believed to be non-sensitive information (e.g., transaction times and dates, account balances, transaction balances, etc.), those labels designate the content of those fields to be permitted to remain unscrubbed. In step 1403, the known sensitive fields 1406 may be scrubbed by replacing the content with a semantic equivalent, the unknown sensitive fields 1407 may be replaced with a syntactic equivalent, and the non-sensitive fields 1408 may be retained with no replacement.

The scrubbing may replace all sensitive values with a realistic alternative value that follows the same schema as the source data. Additionally or alternatively, questionable fields may be flagged during step 1402 that requests review of fields that are not adequately classifiable as containing sensitive information or containing no sensitive information. Additionally or alternatively, in step 1405, users may be permitted to manually set data types and/or scrubbing policy.

With syntactic replacement, replacement values are selected based on a syntax of the data to be replaced. A schema of the field may be analyzed and each character replaced with another character that would fit the schema.

For example, for a field with "ABC123", the schema is three capital letters followed by three numbers. A possible syntactic replacement would be "HDL537". Another possible replacement would be "ZQA958". In another example, for a field with "XXX-XX-1234", the schema is three capital Xs, a dash, two capital Xs, another dash, and a four-digit number. A possible syntactic replacement would be "AAAA-AA-9943". The selected replacement character for a given character may be the same across a dataset (e.g., all Xs replaced with As, all 4s replaced with 8s). Alternatively, the selected replacement character may only be consistent for the content of a row of data in a given field (e.g., in a first row, all Xs are replaced with As and, in a second row, all Xs are replaced with Qs).

With semantic replacement, the replacement value is arbitrarily chosen from a list of non-sensitive values. For example, for a field with the content of "Adam Smith", the type of field refers to a name and the replacement value would be another name. The first name "Adam" may be substituted with one (e.g., Mason) of a list of male names, e.g., Liam, Noah, William, James, Logan, Benjamin, Mason, Adam, Elijah, etc. The last name "Smith" may be substituted with one (e.g., Brown) of a list of last names, e.g., Jones, Smith, Garcia, Lee, Williams, Johnson, Martinez, Hernandez, Wong, Miller, Brown, etc. The resulting semantic replacement would be "Mason Brown". In another example, for a field with the content of "450 West Elm St", the field may be recognized as an address. The "450" may be substituted with a three-digit number (e.g., 805), the street name and type may be substituted with one (e.g., Broadway Ave) of a list of known street names and types, e.g., Saddleback Rd, Riding Ridge Place, Belleview Ct, Broadway Ave, etc.). The resulting semantic substitute would be "805 Broadway Ave". The selection from each list may be based on a random number generator to help anonymize the data.

Once the scrubbing process of step 1403 is complete, statistical parameters and correlation parameters may be determined, in step 1409, for the fields in the scrubbed dataset. In step 1410, based on the determined statistical parameters and correlation parameters, generative machine-learning model may be trained in step 1410 In step 1411, a synthetic dataset may be generated, where the generation is based on the generative model trained in step 1410.

Using, for instance, the modeling technique described with respect to FIGS. 3-7, a generative machine learning model evaluates the scrubbed true-source data to learn its patterns and distributions both within a field and by evaluating dependencies across fields (for example, income may be influenced by age). Using the ability to determine correlations between fields of steps 303 and/or 403, dependencies between various fields may be determined. Based on those dependencies, the relationships between the fields may be mapped within the dataset to improve the accuracy of the output. The output of this process is a generative machine learning model that is tied to the scrubbed true-source dataset and may be used in the subsequent step to generate synthetic data that follows the distributions of that scrubbed true-source data. Based on the determined statistical parameters and the correlation parameters from step 1409, a generative model of the scrubbed dataset is trained in step 1410 and synthetic datasets generated in step 1411.

In step 1411, the quantity of records generated may be arbitrarily large and is not limited on the volume of available scrubbed, true-source data. Because this generated data was generated to match patterns rather than being based on real transactions or records, it will not contain any real customer information or sensitive business data in it, but it will still match the distributions and patterns of the scrubbed true-source data. This synthetic data may then be passed back to the user or application requesting it for display or usage as required for the given use case. Additionally or alternatively, generated data may be checked by the user or another entity and flagged where, for instance, any sensitive source data is found in any field (e.g., un-tokenized credit card numbers in fields identified as non-sensitive) or any datasets whose expected columns (based on enterprise data management tool registration) do not match actual columns observed (referred to as schema drift).

The process may be deployed as an automatic process with no user intervention. Alternatively, the process may be deployed to include user and/or technician's interactions to review field categorizations (or other items for review). Where users are able to manually tune one or more of data categorization, scrubbing, dependencies, or distributions to obtain the desired synthetic data.

Additionally or alternatively, to reduce the risk of the source data from step 1400 being exposed, the source data may be deleted after the creation of the model of step 1410. Additionally or alternatively, the generative model and/or the synthetic data may be deleted after a period of time (e.g., 21 days). Additionally or alternatively, a whitelist of data that should not be scrubbed may also be used. The use of the whitelist in step 1402 to prevent scrubbing of specific fields may permit a finer-grained recognition of which fields are sensitive and to allow the values in those fields to pass through to the synthetic version of data, increasing the realism of the synthetic data. The true-source datasets may comprise a plurality of records, with data of the records arranged in various fields.

As shown in step 1412, the true-source dataset may be deleted. Alternatively, the true-source dataset may be retained for future comparisons. One benefit of deleting the true-source dataset as shown in step 1412 is that the deletion further protects sensitive information of the users whose information may still be contained in or derived from the scrubbed, true-source dataset. The deletion step 1412 may occur after any of the determination of statistical parameters and correlation parameters of the scrubbed dataset (step 1409), after the generation of the generative model (step 1410), or after the generation of the synthetic dataset (step 1411). Further, the generative model from step 1410 and/or any generated datasets from step 1411 may also be deleted.

Additionally or alternatively, after the generation of the generative model in step 1410 and/or after the generation of the synthetic dataset in step 1411, the system may perform one or more steps of FIGS. 15 and 16 as shown by references D and E. After step 1410, the process may proceed via reference D to FIG. 15. In FIG. 15, from reference D, in step 1503, the system receives one or more modifications of statistical and/or correlation parameters and proceeds to reference F. From reference F on FIG. 14, the scrubbed data model of step 1409 and/or the trained generative model of step 1410 is modified, in step 1413 based on the modifications received in step 1503, the generative data model is retrained in step 1410 and another synthetic dataset is generated in step 1411. With respect to reference E after the generation of the synthetic data step 1411, as shown in FIG. 15, the synthetic dataset may be sent (step 15) to one or more computing systems. The synthetic dataset may be used in various ways including, for instance, training another machine learning model, modeling a database, or comparing the synthetic dataset with other datasets to possibly determine whether the other datasets represent actual data or synthetic data.

Alternatively or additionally, from reference E, the system may determine statistical and/or correlation parameters of the generated data in step 1502. After the determination of the statistical or correlation parameters in step 1502, the system may receive modifications (step 1503) of the statistical parameters or correlation parameters of the scrubbed data model and/or the generative model as described above. Alternatively or additionally, after the determination of the statistical and/or correlation parameters of the generated dataset, the parameters of the generated dataset may be compared, in step 1504, with the expected parameters of the scrubbed data model and/or those of the generative model. Based on the comparison of step 1504, modifications may be received in step 1503 of the statistical and/or correlation parameters, the scrubbed data model of 1409 and/or the generative model of 1410 may be modified in step 1413 of FIG. 14. Another generative model may be trained based on the modified scrubbed data model 1409 and another synthetic dataset generated in step 1411 or, if modifying the generative model directly, the another synthetic dataset may be generated in step 1411 once the generative model has been modified. Alternatively or additionally, no modifications of the parameters may be received and another synthetic dataset may be generated in step 1413 (via reference I). Alternatively or additionally, from step 1504, the results of the comparison may be sent in step 1505. Alternatively or additionally, from step 1504, the results of the comparison may be further processed as described respect to FIG. 16, via reference G.

From reference G of FIG. 16, the system may determine whether a difference between one or more parameters of the synthetic dataset and related expected parameters of the generative model are greater than a parameter threshold. If the difference or differences are not greater than a parameter threshold, the results of the comparison may be forwarded to one or more computing systems for further evaluation of the determination of step 1601 or use of the second synthetic dataset. If the difference or differences are greater than a parameter threshold, the results of the comparison, the process may, via reference H, receive modifications of success the call and/or correlation parameters in step 1513, modify the generative model in step 1413, and generate (step 1411) another synthetic dataset based on the modified generative model.

Alternatively or additionally, from reference G of FIG. 16, a score may be generated in step 1603 and the score sent (in step 1604) to one or more computing systems for further evaluation and/or use of the second synthetic dataset. Alternatively or additionally from step 1603, the score may be compared (in step 1605) against a score threshold. If the score is above the score threshold, the results of the comparison may be sent to the one or more computing devices as described above with respect to steps 1602. If the score is below the score threshold, the system may send the results of the comparison in step 1602 and/or receive modification of the statistical/correlation parameters in step 1503 to modify (step 1413) the generative model and generate (step 1411) another synthetic dataset based on the modified generative model. The comparison score 1603 may be used to rank the reliability of the generative model and determine whether any human interaction to change the generative machine-learning model is necessary. If the score is reliable, then the synthetic dataset from step 1411 may be considered for consumption to other downstream systems.

An example use case may comprise a dataset and information about the dataset being provided with the dataset. For instance, when users are trying to find information about a real dataset, the information may be provided along with a sample of the dataset using synthetic data (e.g., the synthetic dataset). The synthetic dataset may have been previously generated or may be generated in response to the user's request for the information. Because the synthetic dataset contains no real customer information in it, users may be permitted to preview the synthetic dataset with less security or privacy restrictions, allowing the users to evaluate the synthetic dataset's utility without needing to request and wait for access to the true-source dataset.

Another use case may comprise the management of test data. For example, users may be able to request realistic data to be populated into their development and quality assurance environments and applications. The system may use the described process to retrieve true-source data and create a synthetic version of that data that may safely be shared in lower permission environments with reduced risk of exposing customer information. Further, the system permits an arbitrarily large volume of test data to be available regardless of the amount of source data available, helping teams that cannot get enough test data.

Creating on-demand synthetic data may permit users to interact with realistic data that does not risk exposing sensitive customer or company data, thereby protecting customers' privacy. Also, using the system to generate synthetic data based on actual data may permit users to obtain access to realistic data without the legal or corporate delays associated with private information and without violating customer privacy or data sharing policies. Further, by permitting users to use synthetic data for tasks normally requiring actual data, companies may benefit by reducing the quantity of users and/or systems that require actual data to perform tasks, thereby permitting companies to add additional protections on the users and/or systems accessing real data and having less concern on others using the synthetic data (as the synthetic data was generated two or more models).

Thus, a computer-implemented method may comprise receiving a true-source dataset comprising a source plurality of records, wherein the source plurality of records may be arranged according to a plurality of fields and each record of the source plurality of records may comprise true-source data for at least one field; categorizing, using a previously-trained model, one or more fields of the plurality of fields; determining, based on the categorizing of the one or more fields of the plurality of fields, a method of scrubbing the source plurality of records; generating, based on the determined method for scrubbing the one or more fields of the plurality of fields of the source plurality of records of the true-source dataset, a scrubbed dataset comprising a scrubbed plurality of records; determining, based on the data of the scrubbed plurality of records of the scrubbed dataset, one or more parameters for the plurality of fields of the scrubbed dataset, wherein the parameters comprise one or more of statistical parameters or correlation parameters; storing the one or more parameters; generating a generative model of the scrubbed dataset, wherein the generative model describes the scrubbed dataset using parameters; generating, based on the generative model, a generated dataset comprising a generated plurality of records; and outputting the generated dataset.

The categorizing may comprise predicting, using the previously-trained model, a label for one or more of the plurality of fields, and the generating of the scrubbed dataset may comprise replacing, based on the label for one or more of the plurality of fields, data in the source plurality of records of the true-source dataset with replacement data. The replacing step further may comprise substituting, based on the label for the one or more of the plurality of fields, semantically similar data for the source plurality of records in the true-source dataset. The substituting may comprise selecting, based on the label, a random value from a list of values associated with the label. The replacing step further may comprise substituting, based on the label for the one or more of the plurality of fields, syntactically similar data for the source plurality of records in the true-source dataset. The substituting may comprise replacing, on a character-by-character basis for a first record, any alphabetical characters with random alphabetical characters; and replacing, on a character-by-character basis for the first record, any numbers characters with random number characters. The categorizing further may comprise receiving user input modifying the label of one or more fields of the true-source dataset. The receiving the true-source dataset may comprise limiting a volume of true-source data in the true-source dataset. The method may further comprise deleting, based on the categorizing the one or more fields of the plurality of fields, the true-source dataset.

The method may further comprise receiving user input modifying one or more parameters; modifying, based on the modified one or more parameters, the generative model; generating, based on the modified generative model, a second generated dataset; and outputting the second generated dataset. The statistical parameters may comprise a distribution parameter of one of the plurality of fields of the scrubbed dataset, and the distribution parameter may comprise one of a normal distribution, a Benford distribution, binomial distribution, power distribution, or a triangular distribution. The statistical parameters may comprise a minimum, maximum, mean, mode, standard deviation, symmetry, skewness, or kurtosis. The correlation parameters may comprise a degree of correlation between two or more fields of the scrubbed dataset. The label may identify the field as containing data of one or more of city, a person, a credit card number, an email address, a phone number, a social security number, or an address.

One of the one or more of the statistical parameters may be a first distribution parameter of one of the plurality of fields of the scrubbed dataset. The method may further comprise determining, based on one of the second plurality of fields of the generated dataset, a second distribution parameter; comparing the second distribution parameter with the first distribution parameter; modifying, based on comparing the second distribution parameter with the first distribution parameter, the generative model to include a modified distribution parameter; generating, based on the modified generative model, a second generated dataset; and outputting the second generated dataset.

The generative model may comprise a probabilistic graphical model comprising two or more nodes and one or more edges, wherein at least one of the two or more nodes may be based on the one or more statistical parameters, and wherein the one or more edges may be based on the one or more correlation parameters. The method further may comprise generating a graphical user interface representing the probabilistic graphical model; receiving user interactions with the graphical user interface, the user interactions modifying a correlation edge of the one or more edges of the probabilistic graphical model; generating, based on the modified probabilistic graphical model, a second generated dataset; and outputting the second generated dataset.

The outputting may further comprise sending the generated dataset to a user's computing device or training a predictive model based on the generated dataset; and generating one or more predictions based on data using the trained predictive model. The instructions that cause the apparatus to output the generated dataset may further cause the apparatus to send the generated dataset to a user's computing device. The instructions that cause the apparatus to output the generated dataset further cause the apparatus to train a predictive model based on the generated dataset; and generate one or more predictions based on data using the trained predictive model. The instructions that cause the outputting further cause the one or more processors to perform sending the generated dataset to a user's computing device. The instructions that cause the outputting further cause the one or more processors to train a predictive model based on the generated dataset; and generate one or more predictions based on data using the trained predictive model. The label may comprise one or more of a person's name, an address, a city, a state, a credit card number, an email address, a telephone number, or a social security number.

In other embodiments, an apparatus may comprise one or more processors; and memory storing instructions that, when executed by the one or more processors, cause the apparatus to receive a true-source dataset comprising a source plurality of records, wherein the source plurality of records may be arranged according to a plurality of fields and each record of the source plurality of records may comprise true-source data for at least one field; categorize, using a previously-trained model, one or more fields of the plurality of fields; determine, based on the categorizing of the one or more fields of the plurality of fields, a method of scrubbing the source plurality of records; generate, based on the determined method for scrubbing the one or more fields of the plurality of fields of the source plurality of records of the true-source dataset, a scrubbed dataset comprising a scrubbed plurality of records; determine, based on the data of the scrubbed plurality of records of the scrubbed dataset, one or more parameters for the plurality of fields of the scrubbed dataset, wherein the parameters comprise one or more of statistical parameters or correlation parameters; storing the one or more parameters; generating a generative model of the scrubbed dataset, wherein the generative model describes the scrubbed dataset using parameters; cause display of a graphical interface of the generative model; receive user interactions with the graphical interface, wherein the user interactions may be to modify a specific parameter; modify, of the generative model, the specific parameter; generate, based on the modified generative model, a generated dataset comprising a generated plurality of records; and output the generated dataset.

In yet further embodiments, one or more non-transitory media storing instructions that, when executed by one or more processors, may cause the one or more processors to perform steps comprising receiving a true-source dataset comprising a source plurality of records, wherein the source plurality of records may be arranged according to a plurality of fields and each record of the source plurality of records may comprise true-source data for at least one field; categorizing, using a previously-trained model, one or more fields of the plurality of fields; determining, based on the categorizing of the one or more fields of the plurality of fields, a method of scrubbing the source plurality of records; generating, based on the determined method for scrubbing the one or more fields of the plurality of fields of the source plurality of records of the true-source dataset, a scrubbed dataset comprising a scrubbed plurality of records; determining, based on the data of the scrubbed plurality of records of the scrubbed dataset, one or more parameters for the plurality of fields of the scrubbed dataset, wherein the parameters comprise one or more of statistical parameters or correlation parameters; storing the one or more parameters; generating a generative model of the scrubbed dataset, wherein the generative model describes the scrubbed dataset using parameters; causing display of a graphical interface of the generative model; receiving user interactions with the graphical interface, wherein the user interactions may be to modify a specific parameter; modifying, of the generative model, the specific parameter; generating, based on the modified generative model, a generated dataset comprising a generated plurality of records; and outputting the generated dataset.

Risk-Reliability Framework for Evaluating Synthetic Data Models

Generating synthetic data may address issues where enough actual data is unavailable. It may also be beneficial to provide a framework for evaluating synthetic data models. There is no standard approach to validating or evaluating synthetic data models. Advantages of the disclosed systems and methods may include the ability to test generative models using hypothesis testing that may be applied to individual fields (relating to statistical parameters of the fields) or, additionally or alternatively, across multiple fields (relating to correlations or covariances between the fields). In one or more examples, a synthetic model validation process may be deployed locally or as a cloud-based service.

Machine learning as a whole typically involves multiple steps with model training and model validation requiring extra attention. Model validation typically involves using measures of predictive accuracy, precision, recall, or a variety of other metrics to justify how well the model performs/predicts. Synthetic model validation is not easily determined as an underlying machine learning model is not actually making a prediction and is instead generating data. Since the model is not involved in any predictive process, it is often unclear on how to measure how well a model is performing and measures like accuracy, f1-score, precision, and recall become obsolete when working with synthetic data.

In one or more examples, a concept from statistics may be applied to help evaluate generative models: hypothesis testing. Hypothesis testing is a process of accepting or rejecting a hypothesis formed on a specific parameter. As described herein, systems and processes permit the formation of hypothesis tests and then apply those hypothesis tests to various datasets created by a given generative model. For example, for a financial dataset of actual loans provided to people, one may expect that the age of people in this dataset to be on average of 30 years old and that most people are within ±5 years of this average. One may conduct a hypothesis test, specifically a normality test, which determines whether the ages in a generated test dataset are normally distributed with a mean of 30 and standard deviation of 5. As described herein, the use of hypothesis tests may be applied to validate synthetic data models by creating hypothesis tests to evaluate the generated synthetic datasets.

Continuing this example, a financial analyst may have a real dataset that has the ages normally distributed with a mean of 30 and standard of 5. After construction of a synthetic data model, the financial analyst may run a normality test on a quantity of synthetic datasets to verify that the synthetic dataset does indeed have a normal distribution that is present in the real dataset. If the user-specified threshold for hypothesis test success (for example, 95% of normality tests pass on 100 synthetic datasets), then the synthetic data model may be considered validated directly to the user's needs.

This process of applying hypothesis testing to synthetic data may include a number of advantages including allowing users to validate synthetic data models to their likes, allowing users to specify how strict they want to be in their validation, and permitting the validation process to be applied to tune and retrain the underlying synthetic model to be tailored towards the user's needs. Hypothesis tests may comprise a 2-sided-T, 1-sided-T, binomial, chi-squared, and/or normality test. The parameters for a hypothesis test may comprise an alpha (also referred to as "a" or the "significance level", representing the probability of rejecting a null hypothesis when true), a quantity of tests to be performed, and quantity of data points per test. Further, based on the selected hypothesis test to perform, the parameters associated with the test may be different.

Using the process and system to validate data models, users who consume synthetic data may be permitted to determine how reliable the generated synthetic data is in order to increase confidence in using the data.

Figure 17:
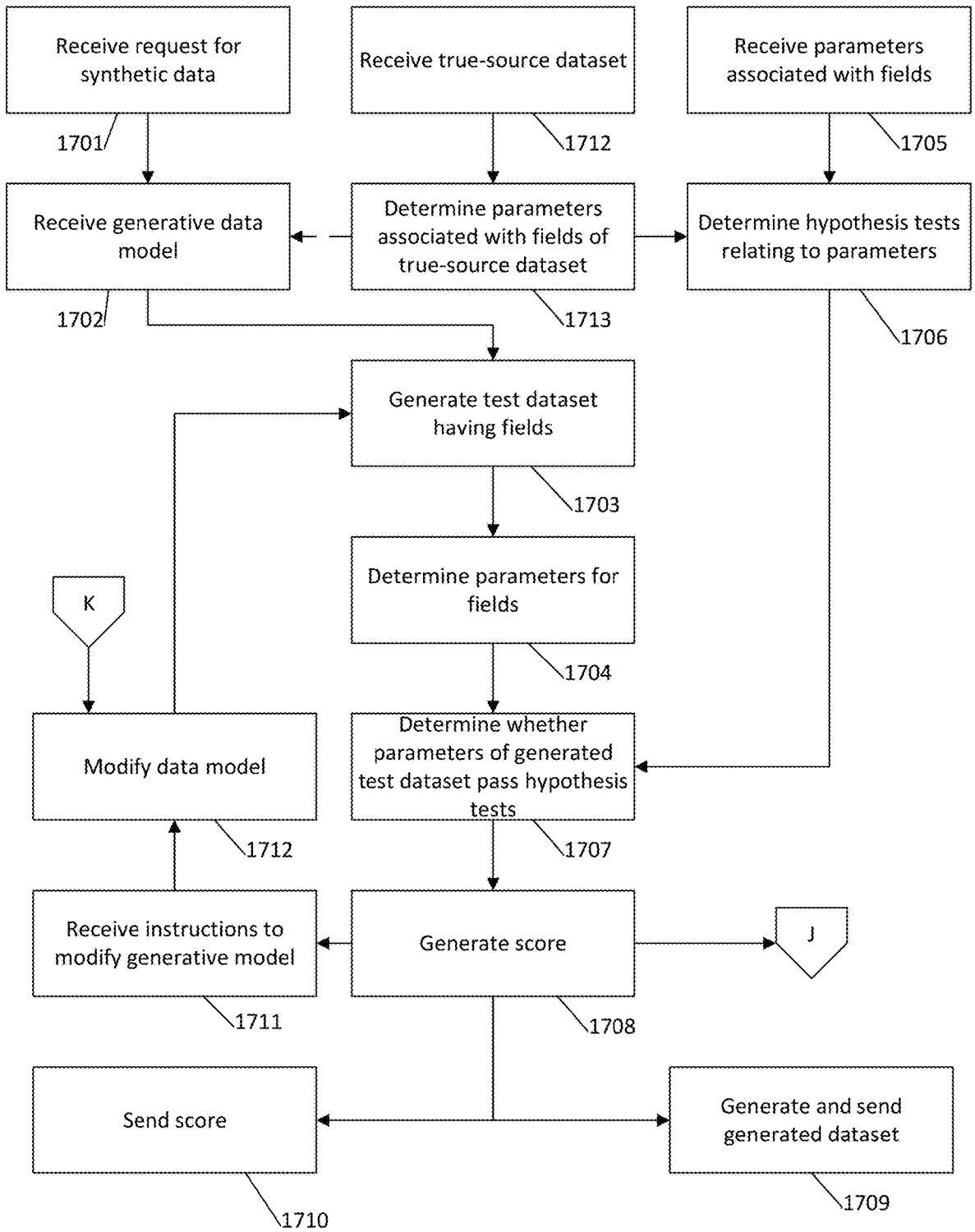
FIGS. 17-18 depict flow charts for a method of validating synthetic data.
Figure 18:
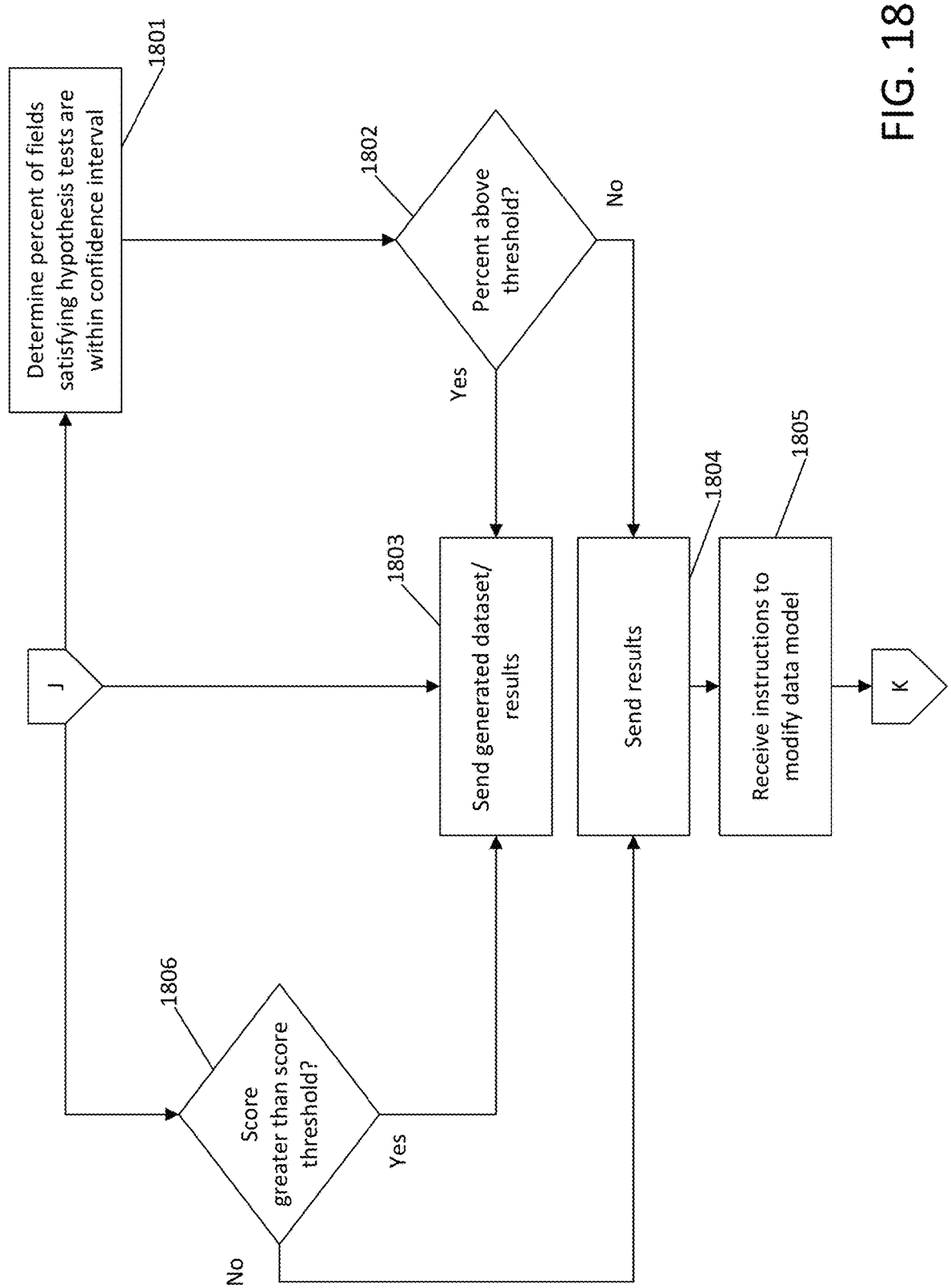

FIGS. 17 and 18 depict flow charts for a method of validating synthetic data. In step 1701, a request is received for the generation of synthetic data. In step 1702, a synthetic data model is received. The received generative model of step 1702 may be a previously trained generative data model. Additionally or alternatively, the generative model may be trained based on a data model created from parameters determined in step 1713 from the true source dataset (e.g., a true-source dataset received in step 1712 as described below).

In step 1703, a generated test dataset is generated with, for example rows of data arranged in one or more fields. In step 1704, parameters may be determined for data in one or more of the fields of the generated test dataset. In step 1705, parameters associated with one or more fields are received. In step 1706, hypothesis tests relating to the parameters are determined. In step 1707, the process determines whether parameters of the generated test dataset pass the hypothesis tests determined in step 1706. In step 1708, a score may be generated based on the determination of step 1707 of whether the parameters passed the hypothesis tests. In step 1709, a generated dataset may be subsequently generated (e.g., of a larger size than the generated test dataset) and sent to one or more computing devices for subsequent use. Alternatively or additionally, the score from step 1708 may be sent (step 1710) to the one or more computing devices or to other competing devices for further evaluation.

Alternatively or additionally from step 1708, a user may possess a level of sophistication to determine how to modify the data model based on the score from step 1708. The system may receive instructions to modify the data model in step 1711, modify the data model in step 1712, and generate another generated test dataset in step 1713 based on the modified data model, modified in step 1712. In other situations, a user may desire additional aid in evaluating the score from step 1708. As shown by reference J bridging FIGS. 17 and 18, a percent of fields satisfying the hypothesis tests may be determined in step 1801. If, in step 1802, the percent is determined to be greater than a given percentage of the threshold, the generated test dataset or another generated dataset (based on the same generative model but, for instance, larger) may be sent (step 1803) to one or more computing devices. If, in step 1802, the percent is determined to be less than the threshold, the system may send (step 1804) results of the comparison with threshold, receive instructions to modify the data model in step 1805, modify the data model in step 1712 (via reference K), and generate (step 1703) a synthetic dataset based on the modified data model of step 1712.

Alternatively or additionally, from reference J, the system may determine, in step 1806, whether the score is greater than a score threshold. If the score is greater than the score threshold, then the generated test dataset or another generated dataset (based on the same generative model but, for instance, larger) may be sent, in step 1803, to the one or more computing devices. If the score is determined to be below the score threshold, the results of the comparison may be sent, in step 1804, to one or more computing devices and the steps performed as described above.

Alternatively or additionally in FIG. 17, the system may receive, in step 1712, a true-source dataset and determine, in step 1713, parameters associated with fields of the true-source dataset. The parameters determined in step 1713 may be used as metadata for data model of the true-source dataset 1712. The metadata may be used to train a generative data model for use in step 1703 and the generative step 1703 that generates the generated test dataset. The parameters determined from step 1713 may also be used in step 1706 to determine hypothesis tests relating to the parameters of the synthetic dataset compared against the hypothesis tests in step 1707 as described above. For example, one may determine a mean of a field in the true-source dataset. From that determined mean, a hypothesis test may be created and applied to the related field of the synthetic dataset to validate the data model that created the synthetic dataset. In other words, a mean may be determined for the related field of the synthetic dataset, the hypothesis test applied to the mean of the synthetic dataset's field, and the passing of the hypothesis test for that field meaning the model used to generate the synthetic data appropriately models the true-source data for that field. Similarly, one or more other statistical hypothesis tests may be created for that field and the field of the generated test dataset tested using those one or more statistical hypothesis tests.

Figure 19:
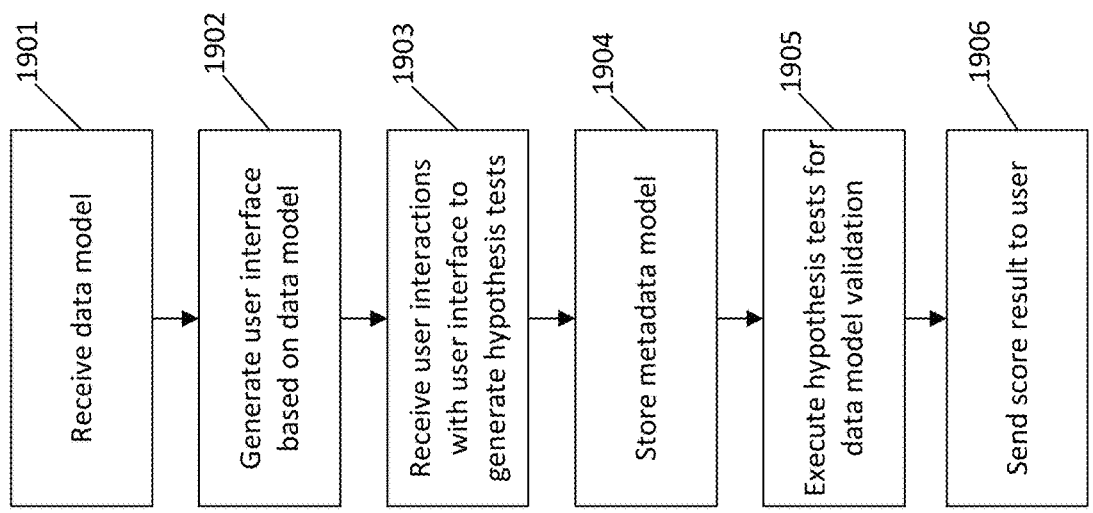
FIG. 19 depicts a flow chart for a method of generating a user interface for adding hypothesis tests to a process of validating a generative model.

FIG. 19 describes the process of generating a user interface based on the data model and receiving a user's interactions with the user interface. In step 1901, a data model is received. In step 1902, user interface based on the data model is generated. In step 1903, the system receives the user's interactions with the user interface and creates hypothesis tests based on those interactions. In step 1904, the metadata model from the user interactions adjusting parameters (statistical and/or correlation parameters) is stored. In step 1905, the hypothesis tests from step 1903 are added to the model validation process described in FIG. 17 and the model validated against the hypothesis tests (e.g., training a generative model based on the metadata model, generating generated test datasets from the generative model, determining parameters of the generated test dataset and comparing the determine parameters with expected parameters of the generated data model). In step 1906, the results of the validation process may be sent to the user.

Figure 20:
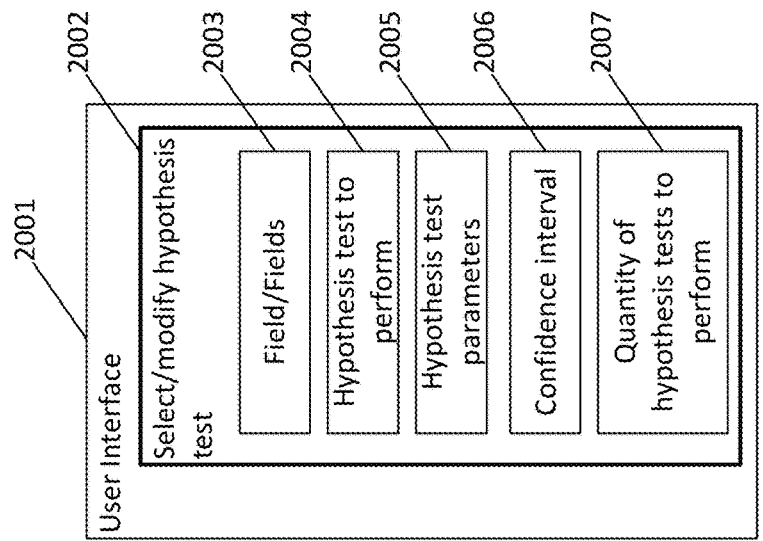
FIG. 20 depicts a user interface for modifying a data model and for specifying hypothesis tests for validating the generative model.

FIG. 20 depicts a user interface for specifying hypothesis tests for the process of FIGS. 17 and 18. A user interface 2001 may comprise a region 2002 through which a user may select and/or modify one or more hypothesis tests. The region 2002 may comprise a region 2003 that allows selection of one or more fields, a region 2004 that allows selection of a hypothesis test to perform, a region 2005 that allows the user to input hypothesis test parameters, a region 2006 that allows the user to input a confidence interval for the hypothesis test, and a region 2007 that allows the user to specify the quantity of hypothesis tests to perform.

Thus, a computer-implemented method may comprise receiving a generative model, wherein the generative model may be configured to generate one or more generated datasets having records arranged in one or more fields; generating, based on the generative model, a generated test dataset; receiving one or more input parameters associated with the one or more fields; determining, based on the one or more input parameters, a hypothesis test for the one or more fields; determining, based on data in the one or more fields of the generated test dataset, a parameter, wherein the parameter may be one or more of a statistical parameter or a correlation parameter; determining, based on the parameter, whether the generated test dataset passed the hypothesis test; and outputting the determination whether the generated test dataset passed the hypothesis test.

The method may further comprise receiving, based on the determination whether the generated test dataset passed the hypothesis test, an instruction; modifying, based on the instruction, the generative model; generating, based on the modified generative model, a second generated test dataset; determining, based on data in the fields of the second generated test dataset, a second parameter of the one or more fields; determining, based on the second parameter, whether the second generated test dataset passed the hypothesis test; and outputting the determination whether the second generated test dataset passed the hypothesis test. The outputting may comprise sending, to a requesting device, the determination that the generated test dataset passed the hypothesis test, wherein the input parameters may be received from the requesting device. The parameter may be a statistical parameter, and the method further may comprise determining, based on data in two or more fields of the generated test dataset, a correlation parameter between two or more fields of the generated test dataset; and determining, based on the correlation parameter, whether the generated test dataset passed the hypothesis test, wherein the hypothesis test may comprise a statistical hypothesis test using the statistical parameter and further may comprise a correlation hypothesis test using a correlation parameter. The correlation parameter may comprise one of covariance, interclass correlation, intraclass correlation, or rank. The method may further comprise receiving a true-source dataset comprising records, wherein each record contains true-source data arranged in the one or more fields; and determining, based on the third data in one or more fields of the true-source dataset, one or more third statistical parameters of the one or more fields of the true-source dataset. The receiving one or more input parameters associated with the one or more fields may comprise receiving the one or more third statistical parameters. The statistical parameter may comprise one or more of a minimum, a maximum, a mean, a mode, a standard deviation, symmetry, skewness, kurtosis, or distribution.

The method may further comprise receiving a true-source dataset comprising records, wherein each record contains true-source data arranged in the one or more fields; and determining, based on the third data in two or more fields of the true-source dataset, a correlation parameter between two or more fields of the true-source dataset. The receiving one or more input parameters associated with the one or more fields may comprise receiving the correlation parameter. The method may further comprise generating, based on the determination that the generated test dataset passed the hypothesis test, an output dataset; and sending, to a requesting device, the generated output dataset. The method may further comprise generating an additional test dataset; determining, based on data in the one or more fields of the additional generated test dataset, a second parameter, wherein the second parameter may be one or more of a statistical parameter or a correlation parameter; determining, based on the second parameter, whether the additional generated test dataset passed the hypothesis test; and sending the determination to a requesting device.

The request for the generated dataset may be received via an application programming interface. The input parameters comprise a distribution parameter for a field, a mean parameter for the field, and a standard deviation for the field. The determining whether generated test dataset passed the hypothesis test may comprise obtaining a confidence interval percent; and determining whether a percent of fields of the generated test dataset satisfying the hypothesis test may be within the confidence interval percent. The method may further comprise receiving a true-source dataset comprising records, wherein each record contains true-source data; and determining, based on the true-source data, an independence parameter between two or more fields of the true-source dataset, wherein receiving one or more input parameters associated with the one or more fields may comprise receiving the independence parameter.

In additional embodiments, an apparatus may comprise one or more processors; and memory storing instructions that, when executed by the one or more processors, cause the apparatus to receive a true-source dataset having true-source data arranged in fields; generate, based on fields of the true-source dataset, a data model; generate, based on the data model, a user interface; receive user interactions with the user interface, the user interactions defining relationships between the fields of the data model; generate, based on the relationships, a generative model, wherein the generative model may be configured to generate generated datasets having records arranged in the fields; generate, based on the generative model, a generated test dataset; receive an identification of a selected hypothesis test of a plurality of hypothesis tests; receive one or more input parameters associated with the one or more fields; determine, based on the one or more input parameters, a hypothesis test for the one or more fields; determine, based on data in the one or more fields of the generated test dataset, a parameter, wherein the parameter may be one or more of a statistical parameter or a correlation parameter; determine, based on the parameter, whether the generated test dataset passed the hypothesis test; and output the determination whether the generated test dataset passed the hypothesis test.

The instructions may further control the apparatus to generate, based on the determination whether the additional generated test datasets passed the hypothesis test, a first score; and send, to a user's device, the first score, wherein the user interactions may be from the user's device. The parameter may be a statistical parameter and the instructions further control the apparatus to determine, based on the generated data in two or more fields of the one or more generated test datasets, a correlation parameter between two or more fields of the one or more generated test datasets; and determine, based on the correlation parameter, whether each of the one or more generated test datasets passed the hypothesis test, wherein the hypothesis test may comprise a statistical hypothesis test using the first statistical parameter and may comprise a correlation hypothesis test using the correlation parameter. The instructions to determine whether each of the one or more first generated test datasets passed the hypothesis test may cause the apparatus to obtain a confidence interval percent, and determine whether a percent of fields of each of the one or more generated test datasets satisfying the hypothesis test may be within the confidence interval percent. The instructions may further cause the apparatus to receive an identification of a quantity of generated datasets to be generated; generating the quantity of generated datasets; and sending the quantity of generated datasets. The correlation parameter may comprise one of covariance, interclass correlation, intraclass correlation, or rank.

In further embodiments, one or more non-transitory media storing instructions that, when executed by one or more processors, may cause the one or more processors to perform steps comprising receiving a data model of a true-source dataset with true-source data arranged in fields; generating, based on the data model, a user interface; receiving user interactions with the user interface, the user interactions defining relationships between the fields of the data model; generating, based on the relationships, a generative model, wherein the generative model may be configured to generate generated datasets having records arranged in the fields; generating, based on the generative model, a generated test dataset; receiving one or more input parameters associated with the one or more fields; determining, based on the one or more input parameters, a hypothesis test for the one or more fields; determining, based on data in the one or more fields of the generated test dataset, a parameter, wherein the parameter may be one or more of a statistical parameter or a correlation parameter; determining, based on the parameter, whether the generated test dataset passed the hypothesis test; and outputting the determination whether the generated test dataset passed the hypothesis test.

Extensible Agents in Agent-Based Generative Models

In addition to the description of agent-based generative models, separating agent definitions from individual simulation specifications may provide additional capabilities beyond simulations in which the agents are defined in the simulation specification. This separation may permit greater control of the agents (including their probability distribution definitions and probability of behaviors) while enabling efficient creation of complex simulations. The framework with the separate agent definitions permits agent definitions to be extensible across different simulations that otherwise would not be based on common agent definitions. In short, separating agent definitions from individual simulation specifications permit the creation of extensible, complex agent definitions that include attributes probability distributions and/or behavior probability distributions that may not be used for any given simulation (at least initially). By permitting agent definitions to grow in complexity independent of any given simulation, agent definitions become more comprehensive in their attribute probability distributions and behavior probability distributions. The complex agent definitions may then be used across different simulations by selecting the existing agent definitions for a given simulation specification (in lieu of creating all agents in that simulation specification). This ability to reference existing agent definitions may help streamline the creation of complex simulations by allowing simulations to reuse complex agent definitions rather than requiring agent definitions to be newly defined for each simulation.

In addition, instead of representing environmental factors as part of the simulation variables, at least some environmental factors may be represented as agent definitions. This may permit easier creation of varied simulations for a given scenario. For example, one may desire to model an economic environment where certain parameters for that economic environment are specified as a probability distribution (e.g., inflation rate, savings rate, unemployment rate, gross domestic product, employment, income and wealth, health care, international trade, etc.). A conventional economic ABM simulation specification would have specified specific economic parameters as values as part of the simulation specification. Multiple simulations of that simulation specification (that defined the economy as part of the simulation specification) would have resulted in synthetic data based on instantiated agents in that specified economy. To obtain new simulations relating to a slightly different economy, the developer would need to modify the existing simulation specification's specific economic factors for each new set of simulations. In contrast, by specifying the economy as an agent definition with probability distributions as the attributes, the instantiation of the economy may be based on a sampling, during instantiation of the economy agent definition, of those probability distributions, thus varying each simulation execution to have different economic values of attributes/behaviors.

Separating agents' probability definitions from a simulation specification permits development of complex agents. For instance, the attributes and behaviors of the agents defined separately encourage richer modeling of agents than would normally be achieved by developing agents specifically for a given simulation (or even where the definitions of the agents and the simulation are integrated into a single specification). Decoupling the agent definitions from the simulation specifications may provide the ability to separately define agents as including disparate characteristics that would normally not be modeled in agent definitions for a specific simulation. For example, agent definitions may be defined as having financial attributes and behaviors (one or more credit cards, paying each off in part or in full, the average balance carried on each, spending habits including size of purchases and how often purchase are made, etc.), mortgage and/or foreclosure-related attributes and behaviors (one or more checking/savings/credit card accounts, one or more mortgages on their home, possible second homes, employment status and income, job security, etc.), and transportation-related attributes and behaviors (how often one commutes to an office or goes shopping, miles driven, train or bus used for part of the travel, likelihood of a vehicular breakdown in their lane of travel, time leaving for travel, direction of travel, etc.). The richer agent definitions may be used for individual simulations by specifying, in a simulation specification, which existing agent definitions to use and the desired attributes and/or behaviors, thus bringing new simulation specifications on-line more efficiently. In contrast, creating agent definitions solely in a simulation specification may require significant time spent defining each new agent definition, thus consuming significantly more time specifying the details of each agent definition and/or tuning the agent definitions' probability distributions to make the new agents internally consistent (e.g., minimizing or eliminating contradictory attributes and/or behaviors resulting in non-sensical situations—like obtaining new loans daily with no income or wealth) and/or externally consistent (e.g., being able to model existing known data).

Further, by providing rich, extensible agent definitions, simulation specifications may be enhanced by being able to better simulate events (when executed) that may be caused by transient events not normally modeled when creating a new simulation specification. For example, by including transportation-related attributes and behaviors for agent instances in a simulation specification relating to foreclosures, the foreclosure simulation may be better able to identify situations where an agent's instance is in a car accident and cannot work. Because they cannot work, their credit card debt increases and their home is eventually foreclosed upon by a lending institution. Knowing the cause of foreclosures may help provide better insights to explain foreclosure data from the simulation. Without the complex agent instances' transportation-related information, it may be difficult or impossible to explain the significant and/or origins of data in generated datasets using only simulation specifications specifying agent instances with only limited attributes and behaviors.

Figure 23:
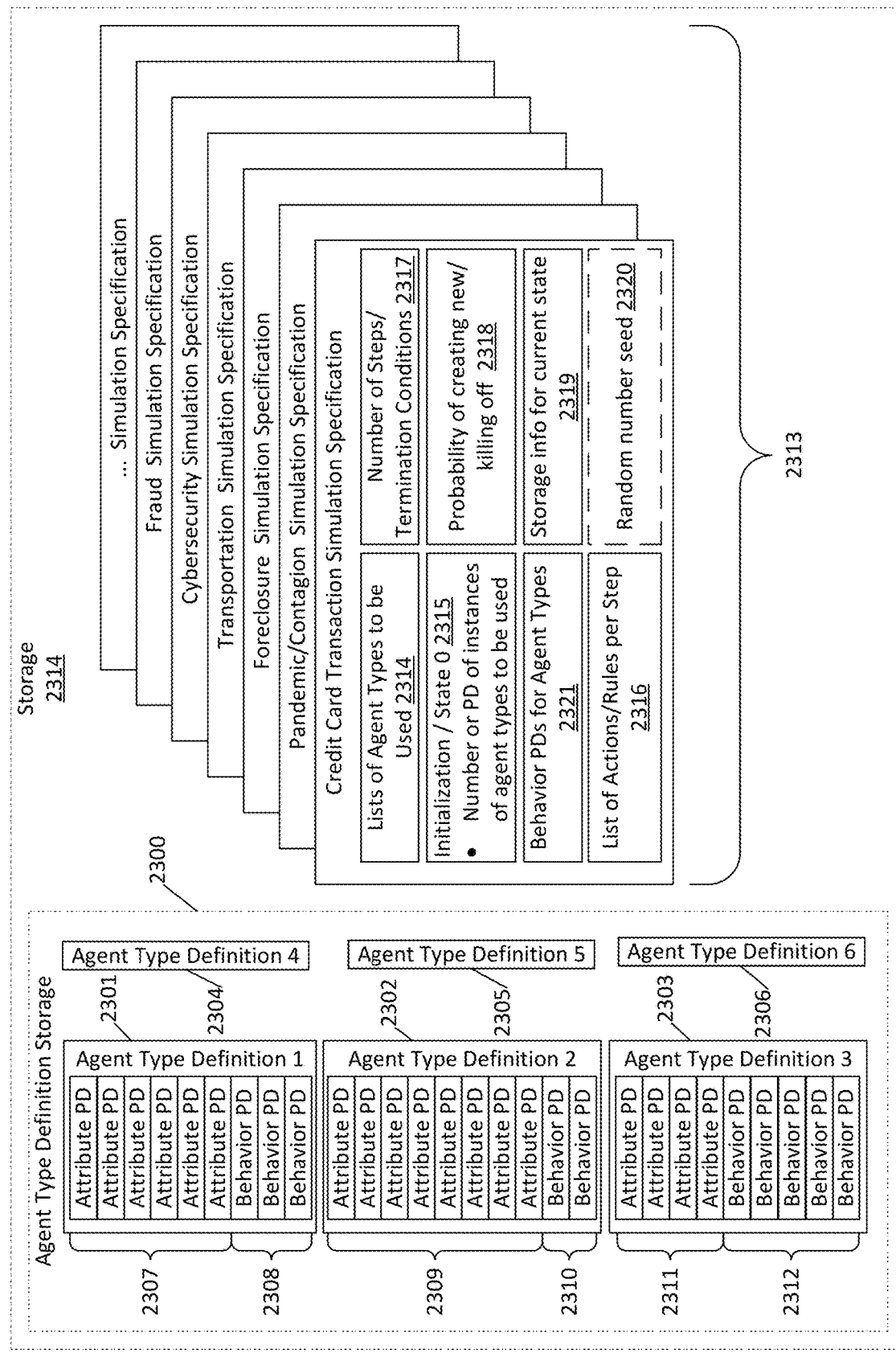
FIG. 23 depicts an agent storage and a simulation specification storage.

FIG. 23 depicts an agent definition storage and multiple simulation specifications using one or more agent definitions. An agent definition storage 2300 may comprise a memory with one or more databases storing multiple agent definitions with their associated attribute probability distributions and behavior probability distributions. The agent definitions stored in agent storage 2300 are defined separately from simulation specifications 2313 in which the agent definitions may be used. In short, the agent definitions are not simulation-specific. One or more aspects of these agent definitions is the ability for the agent definitions to be used in different simulation specifications and resulting simulations where some attributes and/or behaviors are used and not others. One advantage of decoupling the agent definitions from any given simulation specification is that the agent definitions may be reused across simulation specifications that would normally require the creation of simulation-specific agents.

Agent storage 2300 may comprise a plurality of agent types 2301, 2302, 2303, 2304 2305, and 2306, with each agent type including attribute probability distributions and/or behavior probability distributions. Additionally or alternatively, the attribute probability distributions and behavior probability distributions may be specified separate from each other and referenced by a given agent type definition. For example, agent type definition 1 2301 includes six attribute probability distributions 2307 and three behavior probability distributions 2308. Agent type definition 2 2302 includes eight attribute probability distributions 2309 and two behavior probability distributions 2310. Agent type definition 3 2303 includes four attribute probability distributions 2311 and five behavior probability distributions 2312. Agent type definition 4 2304, agent type definition 5 2305, and agent type definition 6 2306 are also shown in agent storage 2300 to represent other agents with attribute probability distributions and behavior probability distributions (not shown). It is appreciated that yet other agents may be included in agent storage 2300 or in stored elsewhere. Further, in some examples, agent probability distributions and/or behavior probability distributions may be defined in simulation specifications.

FIG. 23 also shows multiple simulation specifications 2313 using one or more agent type definitions from the agent storage 2300. The simulation specifications 2313 may be stored with agent type definition storage 2300 in a storage 2314. Additionally or alternatively, the simulation specifications may be stored separately from a collective storage 2314. As described here, each agent type definition may be instantiated 10, 100, 1000, or more times in a simulation based on the simulation specification. It is appreciated that the number of agent types and the number of instantiations of each agent type for a given simulation varies and may be adjusted as desired. Simulation specifications may include, for instance as shown in FIG. 23, a credit card transaction simulation specification, a pandemic/contagion simulation specification, a foreclosure specification, a transportation simulation specification, a cybersecurity simulation specification, a fraud simulation specification, and other simulation specifications. Each simulation specification may comprise information that defines the simulation specification. The information may comprise, for instance, a list 2314 of agent types to be used in the simulation, an initialization state or state 0 2315 that identifies a number of instances of the various agent types to be initially present in an execution of the simulation, a list 2316 of actions/rules per step, a number of steps to be performed (and/or termination conditions) 2317, probabilities 2318 of creating new/killing off various agents in a next step, and storage information 2319 of a current simulation state. Further, a random number seed value 2320 may be used to provide fine tuning of a simulation specification (e.g., enabling a developer to adjust various parts of the simulation specification while using the same random number seed). The other simulation specifications may include one or more of the agent type definitions and specify other probability definitions not used in the credit card simulation specification. For example, in the pandemic contagion simulation specification, an initial infection rate R may be specified and a likelihood of taking public transportation may be specified. In the transportation simulation specification, the likelihood of taking public transportation may also be specified. Various probability distributions of attributes and/or behaviors of the agent type definitions may be specified as part of the individual simulation specifications. Behavior probability distributions 2321, related to agent types, may be identified in the simulation specifications 2313. Additionally or alternatively, the definitions of one or more agent types may be obtained from another source (e.g., another agent storage) or created and/or modified in the specification of the simulation.

Figure 24:
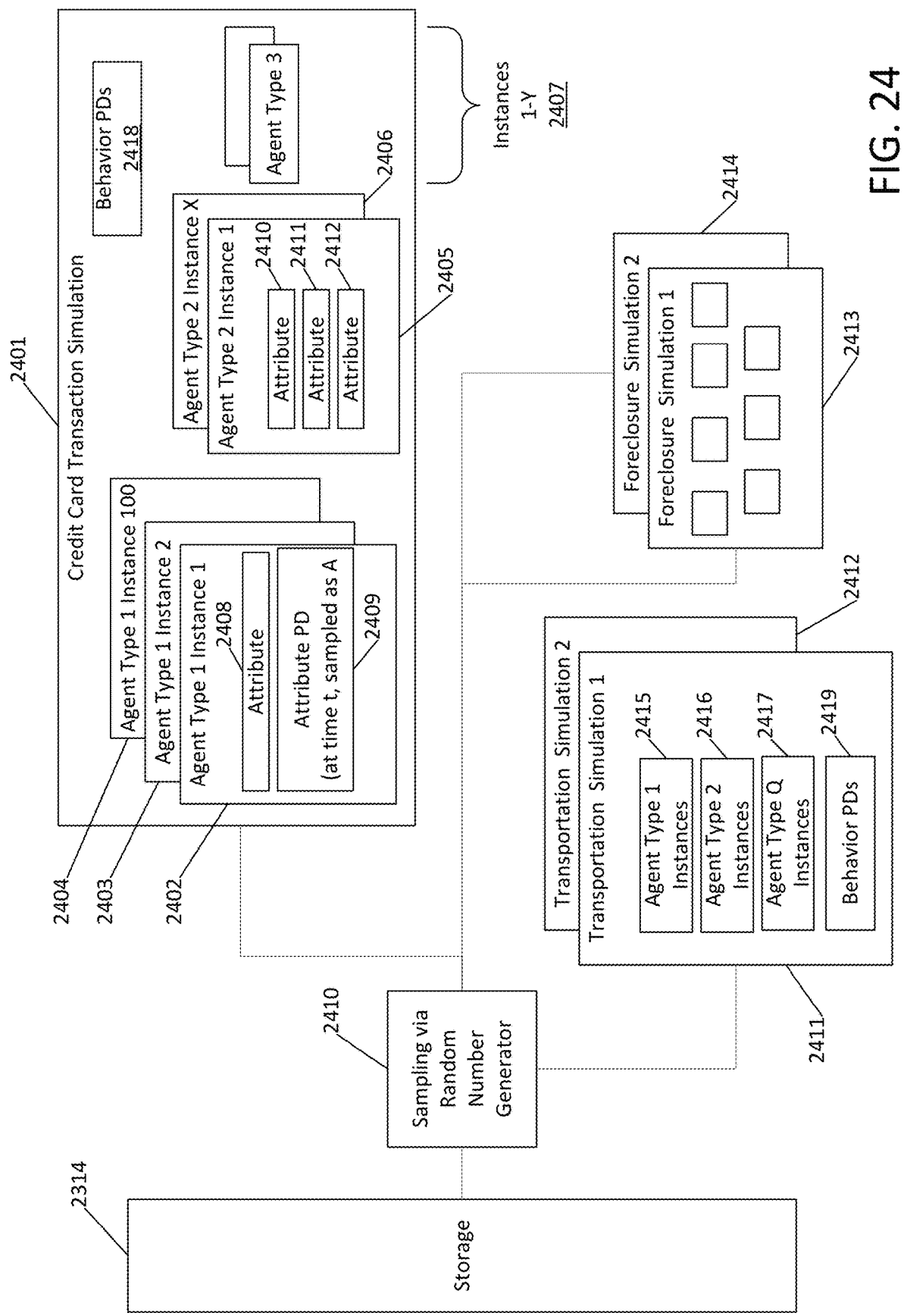
FIG. 24 depicts various simulations.

FIG. 24 depicts various simulations based on the stored simulation specifications. FIG. 24 shows storage 2314 of FIG. 23. Using the simulation specifications from storage 2314, the simulation specifications are sampled to execute the simulations. For example, FIG. 24 comprises a credit card transaction simulation 2401 that is based on the credit card transaction simulation specification of FIG. 23. Using the credit card transaction simulation specification of FIG. 23, a random number generator 2410 samples the various probability distributions of the credit card transaction simulation specification to begin the credit card transaction simulation 2401. The credit card transaction simulation 2401 comprises one or more agent instances that are based on specific agent definitions. For example, the credit card transaction simulation 2401 includes agent type 1 instance 1 2402 with attribute 2408 as a value (having been sampled from an attribute probability distribution definition by the random number generator 2410) and attribute PD 2409 that is sampled in each new step of execution of the credit card transaction simulation 2401 (e.g., at each new time t, the behavior probability distributions are sampled and the result used in that step of the simulation as a value A). In some embodiments, attribute probability distributions are only sampled whenever a new agent is being instantiated and, during each step in the execution of a simulation, the attributes may be changed by the behaviors (where the behaviors are sampled from behavior probability distributions). The credit card transaction simulation 2401 may also comprise other instances 2 . . . 100 of the agent type 1 definition (as agent type 1 instance 2 2403 . . . agent type 1 instance 100 2404). The credit card transaction simulation 2401 may include instances of other agents type definitions as well (e.g., agent type 2 instance 1 2405 with attributes 2410, 2411, 2412, agent type 2 instance 2 2406 with one or more attributes, and instances 1-Y 2407 of agent type 3 with attributes). Other simulations may also use one or more of the agent definitions of FIG. 23 and as used by the credit card transaction simulation 2401. For example, a transportation simulation 1 2411 may use instances of agent type 1 2415, agent type 2 2416, and agent type Q 2417. The sampled attributes of the instances of agent types 1, 2, and Q are not shown for simplicity but understood to be created through sampling of the probability distributions of the attribute probability definitions of each of the agent definitions. A transportation simulation 2 2412 may also be executed using another sampling of the agent definitions as specified in the transportation simulation specification of the simulation specifications 2313 of FIG. 23. Further, FIG. 24 shows two additional simulations (foreclosure simulation 1 2413 and foreclosure simulation 2 2414) executed based on the foreclosure simulation specification of the simulation specifications 2313 of FIG. 23. The credit card transaction simulation specification 2401 may further include behavior probability distributions 2418 relating to actions performed by the instances of the agent types 2402-2407. It is appreciated that the behavior probability distributions may be particular to specific agent types and/or apply to some agent types and not others. The transportation simulation specifications 2411 and 2412 may include behavior probability distributions 2419 that may be the same across both transportation simulation specifications 2411 and 2412 or may have some behavior probability distributions 2419 in common and not others.

Figure 25:
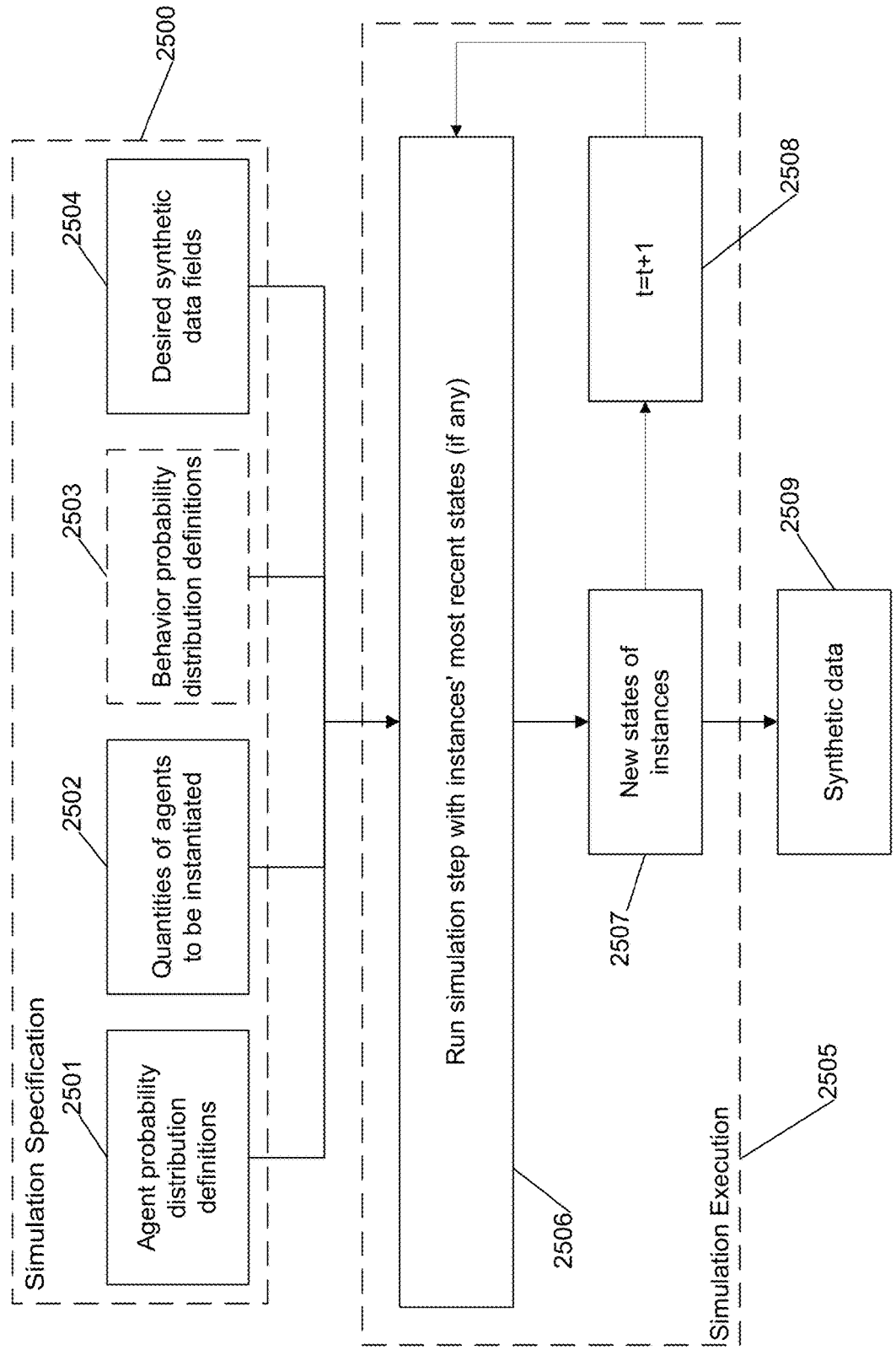
FIG. 25 depicts a flowchart of an execution of an agent-based model simulation.

FIG. 25 depicts a flowchart of an execution of an agent-based model simulation. In step 2500, a simulation specification is retrieved. The simulation specification 2500 may comprise agent probability distribution definitions 2501, quantities of agents to be instantiated per agent type definition 2502, behavior probability distribution definitions 2503 (additionally or alternatively received separately from the agent type definitions 2502), desired synthetic data 2504, and other simulation specification items as needed. Step 2505 shows the execution of the simulation specification received in step 2500. In step 2505, a step of the simulation is performed using a most recent execution state of the simulation (if any). In step 2507, the next simulation state is generated in the simulation 2505. In step 2508, the simulation advances to the next step (e.g., t=t+1) and simulates the next actions of the agents based on the existing state. The simulation may continue until termination criteria or set number of steps have been simulated (e.g., specified in the simulation specification termination criteria/number of steps 2317 of FIG. 23). For instance, the process may repeat for a set number of iterations, until a given result is obtained (e.g., 30% home ownership), or the simulation reaches a steady state (no significant changes from a previous state—e.g., 99% of the collected states not changing between steps). Synthetic data 2509 may be generated at the termination of simulation 2505 or generated at one or more states during the execution of the simulation 2505.

Figure 26:
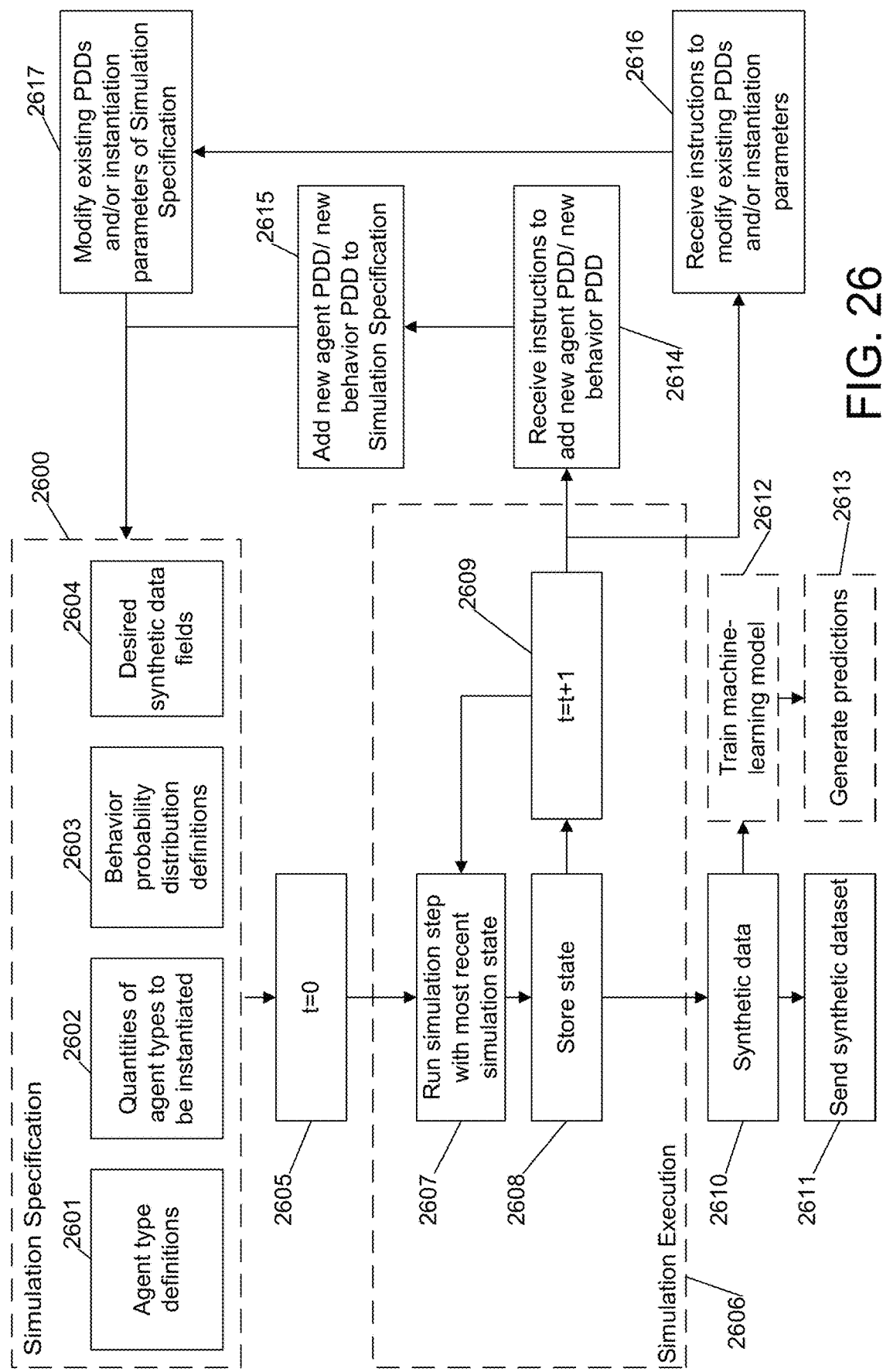
FIG. 26 depicts another example flowchart of an execution of an agent-based model simulation.

FIG. 26 depicts another example flowchart of an execution of an agent-based model simulation. In step 2600, a simulation specification is received. The simulation specification may comprise agent type definitions 2601, quantities of agent types to be instantiated 2602, behavior probability distribution definitions 2603, and desired synthetic data fields 2604. In step 2605, an initial state is set as t=0. In step 2606, the simulation specification 2600 is executed. In step 2607, the probability distributions specified in the simulation specification 2600 are sampled via a random number generator. As no previous step of the simulation exists, the simulation state is generated based on the probability distribution definitions and other data of the simulation specification 2600. In step 2608, the simulation state of the instantiated agent types is stored. If desired, synthetic data may be generated from the simulation state of the instantiated agent types (simulation step t=0) and output as synthetic data 2610.

Additionally or alternatively, a time step may be incremented to the next time step (e.g., t=t+1) in step 2609 and the simulation step executed again, using the simulation specification information obtained in step 2600 and the simulation state of the instantiated agent types from 2608. The process may repeat (next simulation steps) for a set number of iterations, until a given result is obtained (e.g., 30% home ownership), or the simulation reaches a steady state (no significant changes from a previous state—e.g., 99% of the collected states not changing between steps).

In step 2611, the synthetic dataset 2610 may be sent to a user. Alternatively or additionally, the synthetic dataset 2610 may be used to train a machine-learning model in step 2612 and the trained machine-learning model used to generate predictions in step 2613 based on new true-source data.

Alternatively or additionally, in step 2614, the system may receive instructions to add a new agent probability distribution definition and/or a new behavior probability distribution definition. In step 2615, the new agent probability distribution and/or new behavior probability distribution definition may be added to the simulation specification 2600 for a new simulation based on the updated simulation specification 2600.

Alternatively or additionally, in step 2616, instructions may be received to modify one or more existing agent probability distribution definitions and/or behavior probability distribution definitions and/or instantiation parameters and/or desired synthetic data fields. Based on the information received in step 2616, the corresponding agent probability distribution definitions and/or behavior probability distribution definitions and/or instantiation parameters and/or desired synthetic data fields are modified in step 2617 and the modified simulation specification 2600 used for execution of a new simulation.

FIG. 27A depicts a flowchart of a process of modifying an agent-based model. In step 27000, an identification of a simulation to be performed is received. In step 27010, agent/behavior probability distribution definitions and/or instantiation parameters and/or desired synthetic data fields are received. Steps 27000 and 27010 may be performed serially and/or in parallel. Based on the received information, a user interface is generated in step 27020. In step 27030, user interactions with the user interface are received. In step 27040, the agent/behavior probability distribution definitions and/or instantiation parameters and/or desired synthetic data fields are modified based on the user interactions of step 27030.

FIG. 27B depicts a user interface for modifying an agent-based model. The user interface 2701 may comprise a quantity of regions including a region 2702 permitting selection of an agent probability distribution definition (e.g., agent A probability distribution definition 2704, agent B probability distribution definition 2706, and agent X probability distribution definition 2708) and the quantity of instantiations for the selected agent probability distribution definition to be set (e.g., quantity of instantiations for agent A's probability distribution definition 2705, quantity of instantiations for agent B's probability distribution definition 2707, and/or quantity of instantiations for agent X's probability distribution definition 2709).

The user interface 2701 may comprise a region 2703 permitting selection of a behavior probability distribution definition and selectively enabling/disabling that behavior (e.g., region 2717 permitting selection of behavior probability distribution definition J and enable/disable region 2718, region 2719 permitting selection of behavior probability distribution definition K and enable/disable region 2720, and region 2721 permitting selection of behavior probability distribution definition Y and enable/disable region 2722).

The user interface 2701 may comprise a region 2710 permitting modification of a selected agent/behavior's probability distribution definition. Region 2710 may comprise a region 2711 for receiving a user's modification of an attribute parameter of the selected agent's probability distribution definition, a region 2712 for receiving the user's modification of a behavior probability distribution definition. Region 2712 may additionally or alternatively separately permit linking or breaking a link between the selected behavior probability distribution definition such that instantiated agents perform the linked behaviors during simulation. Further, where a behavior probability distribution definition comprises one or more parameters that define the behavior probability distribution definition or where each behavior probability distribution definition is comprised of separate actions (that collectively make up the behavior probability distribution definition), the user interface may further comprise a region 2723 that receives user input for modification of the action or the behavior parameter.

The user interface 2701 may further comprise a region 2713 for accepting user input for defining a new agent probability distribution definition. Region 2713 may comprise a region 2714 for receiving user input for setting a new attribute probability distribution parameter and a region 2715 for receiving user input for setting a new behavior probability distribution parameter and/or linking the new behavior probability distribution definition with an agent probability distribution definition. The user interface 2701 may further comprise a region 2724 for accepting user input for modifying the fields to be populated with synthetic data for a generated synthetic dataset. The user interface 2701 may further comprise a region 2725 for accepting user input for selecting and/or modifying a simulation to be executed.

Thus, a computer-implemented method may comprise storing, in a storage, one or more agent type definitions, wherein each agent type definition may comprise a plurality of attribute probability distribution definitions, receiving, for a first simulation, a first simulation specification, wherein the first simulation specification may comprise a first list of agent type definitions, attribute probability distributions associated with the first list of agent type definitions, and behavior probability distributions associated with the first list of agent type definitions; generating the first simulation via sampling, using a random number generator, the first simulation specification's probability distributions of the first list of agent type definitions; executing steps of the first simulation via sampling, using the random number generator, the first simulation specification's probability distributions of the first list of agent type definitions and the behavior probability distributions associated with the first list of agent type definitions; outputting, based on the first simulation, a first synthetic dataset; receiving, for a second simulation, a second simulation specification, wherein the second simulation specification may comprise a second list of agent type definitions, attribute probability distributions associated with the second list of agent type definitions, and behavior probability distributions associated with the second list of agent type definitions; generating the second simulation via sampling, using the random number generator, the second simulation specification's probability distributions of the second list of agent type definitions; executing steps of the second simulation via sampling, using the random number generator, the second simulation specification's probability distributions of the second list of agent type definitions and the behavior probability distributions associated with the second list of agent type definitions; and outputting, based on the second simulation, a second synthetic dataset. The first list of agent type definitions and the second list of agent type definitions may include at least one common agent type definition.

In one or more examples, a difference between the first simulation specification and the second simulation specification may comprise, for the at least one common agent type definition, a different combination of attribute probability distributions. Additionally or alternatively, a difference between the first simulation specification and the second simulation specification may comprise, for the at least one common agent type definition, a different combination of the behavior probability distributions to be simulated. Fields of the first synthetic data set may be different from fields of the second synthetic data set. The plurality of attribute probability distribution definitions may comprise at least one attribute probability distribution definition that, after generation of the first simulation or generation of the second simulation, is a value. Additionally or alternatively, the plurality of attribute probability distribution definitions may comprise at least one behavior probability distribution definition that is sampled at each step to modify an attribute value. The first simulation specification may comprise a first set of synthetic data fields to be output, the second simulation specification may comprise a second set of synthetic data fields to be output, and the first set of synthetic data fields may be different from the second set of synthetic data fields. The first simulation may further comprise iteratively sampling probability distributions, associated with the first list of agent type definitions, of the attributes and behaviors. The first synthetic data set may be streamed. The first synthetic dataset may comprise synthetic data based on execution of multiple steps.

One or more aspects may further include receiving instructions to modify, for the first simulation specification, a quantity of instances of agent type definitions to be instantiated; modifying, based on the instructions, the first simulation specification; generating a third simulation via sampling, using the random number generator, the modified first simulation specification's probability distributions of the first list of agent type definitions; executing steps of the third simulation via sampling, using the random number generator, the modified first simulation specification's probability distributions of the first list of agent type definitions and the behavior probability distributions associated with the first list of agent type definitions; and outputting, based on the modified first simulation, a third synthetic dataset. The agent type definitions may comprise probability monads, the probability monads may comprise attribute probability monads, and the probability monads may be a complex probability distribution composed of attribute probability distributions of the attribute probability monads.

In some aspects, generating the first simulation may comprise generating a simulation monad, wherein the simulation monad may comprise behavior probability monads, and the simulation monad may be a complex probability distribution composed of behavior probability distributions of the behavior probability monads. In some aspects, the behavior probability distributions, associated with at least one of the first list of agent type definitions and the second list of agent type definitions, describe one or more actions, the one or more actions may comprise action probability distributions, and the action probability distributions may be a complex probability distribution composed of the behavior probability distributions.

An apparatus in accordance with one or more aspects may include one or more processors and memory storing instructions that, when executed by the one or more processors, cause the apparatus to receive, for a first simulation, a first simulation specification, wherein the first simulation specification may comprise a first list of agent type definitions, attribute probability distributions associated with the first list of agent type definitions, and behavior probability distributions associated with the first list of agent type definitions; generate the first simulation via sampling, using a random number generator, the first simulation specification's probability distributions of the first list of agent type definitions; execute steps of the first simulation via sampling, using the random number generator, the first simulation specification's probability distributions of the first list of agent type definitions and the behavior probability distributions associated with the first list of agent type definitions; output, based on the first simulation, a first synthetic dataset; receive, for a second simulation, a second simulation specification, wherein the second simulation specification may comprise a second list of agent type definitions, attribute probability distributions associated with the second list of agent type definitions, and behavior probability distributions associated with the second list of agent type definitions; generate the second simulation via sampling, using the random number generator, the second simulation specification's probability distributions of the second list of agent type definitions; execute steps of the second simulation via sampling, using the random number generator, the second simulation specification's probability distributions of the second list of agent type definitions and the behavior probability distributions associated with the second list of agent type definitions; and output, based on the second simulation, a second synthetic dataset. The first list of agent type definitions and the second list of agent type definitions may include at least one common agent type definition.

In some aspects, a difference between the first simulation specification and the second simulation specification may comprise, for the at least one common agent type definition, a different combination of attribute probability distributions. In other aspects, a difference between the first simulation specification and the second simulation specification may comprise, for the at least one common agent type definition, a different combination of the behavior probability distributions to be simulated. Fields of the first synthetic data set may be different from fields of the second synthetic data set. The plurality of attribute probability distribution definitions may comprise at least one attribute probability distribution definition that, after generation of the first simulation or generation of the second simulation, may comprise a value.

In one or more aspects, one or more non-transitory media may store instructions that, when executed by one or more processors, cause the one or more processors to perform steps comprising storing one or more agent type definitions, wherein each agent type definition may comprise a plurality of attribute probability distribution definitions; receiving, for a first simulation, a first simulation specification, wherein the first simulation specification may comprise a first list of agent type definitions, attribute probability distributions associated with the first list of agent type definitions, and behavior probability distributions associated with the first list of agent type definitions; causing display of a graphical interface of the first simulation specification, wherein the graphical interface may be configured to display one or more agent type definitions, of the first list the agent's probability distribution definitions and the behaviors; receiving user interactions with the graphical interface, wherein the user interactions may be to modify a specific attribute probability distribution of the one or more agent type definitions; modifying, based on the received user interactions, the one or more agent type definitions' probability distribution definition in the first simulation specification; and generating the first simulation via sampling, using a random number generator, the modified first simulation specification's probability distributions of the first list of agent type definitions; executing steps of the first simulation via sampling, using the random number generator, the modified first simulation specification's probability distributions of the first list of agent type definitions and the behavior probability distributions associated with the first list of agent type definitions; outputting, based on the modified first simulation, a first synthetic dataset; receiving, for a second simulation, a second simulation specification, wherein the second simulation specification may comprise a second list of agent type definitions, attribute probability distributions associated with the second list of agent type definitions, and behavior probability distributions associated with the second list of agent type definitions; generating the second simulation via sampling, using the random number generator, the second simulation specification's probability distributions of the second list of agent type definitions; executing steps of the second simulation via sampling, using the random number generator, the second simulation specification's probability distributions of the second list of agent type definitions and the behavior probability distributions associated with the second list of agent type definitions; and outputting, based on the second simulation, a second synthetic dataset. In one or more examples, the first list of agent type definitions and the second list of agent type definitions may include at least one common agent type definition.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A computer-implemented method comprising:
storing, in a storage, one or more agent complex probability distribution definitions, wherein each agent complex probability distribution definition comprises a plurality of agent attribute probability distribution definitions and agent behavior probability distribution definitions;
receiving, for a first simulation, a first simulation specification, wherein the first simulation specification comprises a first list of agent complex probability distribution definitions;
generating, using a random number generator, first agent attribute probability distributions for each of the first list of agent complex probability distribution definitions;
generating, based on the first agent attribute probably distributions, the first simulation;
generating, based on the first simulation and using the random number generator, first agent behaviors for first steps of the first simulation;
outputting, based on the first steps of the first simulation, a first synthetic dataset;
receiving, for a second simulation, a second simulation specification, wherein the second simulation specification comprises a second list of agent complex probability distribution definitions;
generating, using the random number generator, second agent attribute probability distributions for each of the second list of agent complex probability distribution definitions;
generating, based on the second agent attribute probably distributions, the second simulation;
generating, based on the second simulation and using the random number generator, second agent behaviors for second steps of the second simulation;
outputting, based on the second steps of the second simulation, a second synthetic dataset; and
training, based on the second synthetic dataset, a machine-learning model,
wherein the first list of agent complex probability distribution definitions and the second list of agent complex probability distribution definitions include at least one common agent complex probability distribution definition.

2. The computer-implemented method of claim 1, wherein a difference between the first simulation specification and the second simulation specification comprises, for the at least one common agent complex probability distribution definition, a different combination of agent attribute probability distributions.

3. The computer-implemented method of claim 1, wherein a difference between the first simulation specification and the second simulation specification comprises, for the at least one common agent complex probability distribution definition, a different combination of agent behavior probability distributions to be simulated.

4. The computer-implemented method of claim 1, wherein fields of the first synthetic dataset are different from fields of the second synthetic dataset.

5. The computer-implemented method of claim 1, wherein the first agent attribute probability distributions comprise at least one agent attribute probability distribution that, after generation of the first simulation, comprises a sampled value.

6. The computer-implemented method of claim 1, wherein generating the first simulation comprises sampling each agent attribute probability distribution to determine a corresponding value.

7. The computer-implemented method of claim 1, wherein the first simulation specification comprises a first set of synthetic data fields to be output,
wherein the second simulation specification comprises a second set of synthetic data fields to be output, and
wherein the first set of synthetic data fields is different from the second set of synthetic data fields.

8. The computer-implemented method of claim 1, wherein the generating the first agent behaviors for the first steps of the first simulation further comprise:
iteratively sampling first agent behavior probability distributions.

9. The computer-implemented method of claim 8, wherein outputting the first synthetic dataset comprises:
streaming, per executed step, the first synthetic dataset.

10. The computer-implemented method of claim 8, wherein the first synthetic dataset comprises synthetic data based on execution of multiple steps.

11. The computer-implemented method of claim 1, further comprising:
receiving instructions to modify, for the first simulation specification, a quantity of instances of agent complex probability distribution definitions to be instantiated;
modifying, based on the instructions, the first simulation specification;
generating, based on the modified first simulation specification and via the random number generator, a third simulation comprising third agent attribute probability distributions;
generating, based on the third simulation and via the random number generator, third agent behaviors for third steps of the third simulation; and
outputting, based on the third simulation, a third synthetic dataset.

12. The computer-implemented method of claim 1,
wherein the agent complex probability distribution definitions comprise probability monads, and
wherein the probability monads are a complex probability distribution composed of agent attribute probability distributions of agent attribute probability monads.

13. The computer-implemented method of claim 1,
wherein generating the first simulation comprises generating a simulation monad, and
wherein the simulation monad is a complex probability distribution composed of agent behavior probability distributions of agent behavior probability monads.

14. The computer-implemented method of claim 1,
wherein first agent behavior probability distribution definitions describe one or more actions,
wherein one or more actions comprise action probability distributions, and
wherein the action probability distributions are a complex probability distribution composed of agent behavior probability distributions.

15. An apparatus comprising:
one or more processors; and
memory storing instructions that, when executed by the one or more processors, cause the apparatus to:
receive, for a first simulation, a first simulation specification, wherein the first simulation specification comprises a first list of agent complex probability distribution definitions, wherein the agent complex probability distribution definitions comprise a plurality of agent attribute probability distribution definitions and agent behavior probability distribution definitions;
generate, using a random number generator, first agent attribute probability distributions for each of the first list of agent complex probability distribution definitions;
generate, based on the first agent attribute probably distributions, the first simulation;
generate, based on the first simulation and using the random number generator, first agent behaviors for first steps of the first simulation;
output, based on the first steps of the first simulation, a first synthetic dataset;
receive, for a second simulation, a second simulation specification, wherein the second simulation specification comprises a second list of agent complex probability distribution definitions;
generate, using the random number generator, second agent attribute probability distributions for each of the second list of agent complex probability distribution definitions;
generate, based on the second agent attribute probably distributions, the second simulation;
generate, based on the second simulation and using the random number generator, second agent behaviors for second steps of the second simulation;
output, based on the second steps of the second simulation, a second synthetic dataset; and
train, based on the second synthetic dataset, a machine-learning model,
wherein the first list of agent complex probability distribution definitions and the second list of agent complex probability distribution definitions include at least one common agent complex probability distribution definition.

16. The apparatus of claim 15,
wherein a difference between the first simulation specification and the second simulation specification comprises, for the at least one common agent complex probability distribution definition, a different combination of agent attribute probability distributions.

17. The apparatus of claim 15,
wherein a difference between the first simulation specification and the second simulation specification comprises, for the at least one common agent complex probability distribution definition, a different combination of agent behavior probability distributions to be simulated.

18. The apparatus of claim 15,
wherein fields of the first synthetic dataset are different from fields of the second synthetic dataset.

19. The apparatus of claim 15,
wherein the first agent attribute probability distributions comprise at least one agent attribute probability distribution that, after generation of the first simulation, comprises a sampled value.

20. One or more non-transitory media storing instructions that, when executed by one or more processors, cause the one or more processors to perform steps comprising:
storing one or more agent complex probability distribution definitions, wherein each agent complex probability distribution definition comprises a plurality of agent attribute probability distribution definitions and agent behavior probability distribution definitions;
receiving, for a first simulation, a first simulation specification, wherein the first simulation specification comprises a first list of agent complex probability distribution definitions;
causing display of a graphical interface of the first simulation specification, wherein the graphical interface is configured to display one or more agent complex probability distribution definitions;
receiving user interactions with the graphical interface, wherein the user interactions are to modify a specific agent attribute probability distribution definition of the one or more agent complex probability distribution definitions;
modifying, based on the received user interactions, the one or more agent complex probability distribution definitions in the first simulation specification;
generating, using a random number generator, first agent attribute probability distributions for each of the first list of agent complex probability distribution definitions including the one or more modified agent complex probability distribution definitions;
generating, based on the first agent attribute probably distributions, the first simulation;

generating, based on the first simulation and using the random number generator, first agent behaviors for first steps of the first simulation;

outputting, based on the first steps of the first simulation, a first synthetic dataset;

receiving, for a second simulation, a second simulation specification, wherein the second simulation specification comprises a second list of agent complex probability distribution definitions;

generating, using the random number generator, second agent attribute probability distributions for each of the second list of agent complex probability distribution definitions;

generating, based on the second agent attribute probably distributions, the second simulation;

generating, based on the second simulation and using the random number generator, second agent behaviors for second steps of the second simulation;

outputting, based on the second steps of the second simulation, a second synthetic dataset; and training, based on the second synthetic dataset, a machine-learning model, wherein the first list of agent complex probability distribution definitions and the second list of agent complex probability distribution definitions include at least one common agent complex probability distribution definition.

* * * * *